(12) United States Patent
Gilmore et al.

(10) Patent No.: US 11,742,208 B2
(45) Date of Patent: Aug. 29, 2023

(54) METHOD OF REDUCING VOIDS AND SEAMS IN TRENCH STRUCTURES BY FORMING SEMI-AMORPHOUS POLYSILICON

(71) Applicant: Texas Instruments Incorporated, Dallas, TX (US)

(72) Inventors: Damien Thomas Gilmore, Allen, TX (US); Jonathan P. Davis, Allen, TX (US); Azghar H Khazi-Syed, Arlington, TX (US); Shariq Arshad, Allen, TX (US); Khanh Quang Le, Garland, TX (US); Kaneez Eshaher Banu, Plano, TX (US); Jonathan Roy Garrett, Garland, TX (US); Sarah Elizabeth Bradshaw, Dallas, TX (US); Eugene Clayton Davis, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 16/829,862

(22) Filed: Mar. 25, 2020

(65) Prior Publication Data
US 2021/0305050 A1    Sep. 30, 2021

(51) Int. Cl.
*H01L 21/28*    (2006.01)
*H01L 29/40*    (2006.01)
*H01L 29/423*    (2006.01)
*H01L 29/49*    (2006.01)

(52) U.S. Cl.
CPC ...... *H01L 21/28035* (2013.01); *H01L 29/401* (2013.01); *H01L 29/4236* (2013.01); *H01L 29/4916* (2013.01)

(58) Field of Classification Search
CPC ............. H01L 21/28035; H01L 29/401; H01L 29/4236; H01L 29/4916; H01L 29/4925
USPC ................... 257/741, 588, 586, 412
See application file for complete search history.

(56) References Cited

U.S. PATENT DOCUMENTS

| 5,315,543 A | * | 5/1994 | Matsuo | H01L 27/10829 |
| | | | | 257/301 |
| 2015/0056803 A1 | * | 2/2015 | Chandrashekar | |
| | | | | H01L 21/76877 |
| | | | | 438/666 |

FOREIGN PATENT DOCUMENTS

CN     108933168 A  * 12/2018  ....... H01L 27/10826

* cited by examiner

*Primary Examiner* — Sheng-Bai Zhu
(74) *Attorney, Agent, or Firm* — Yudong Kim; Frank D. Cimino

(57) ABSTRACT

A microelectronic device with a trench structure is formed by forming a trench in a substrate, forming a seed layer in the trench, the seed layer including an amorphous dielectric material; and forming semi-amorphous polysilicon on the amorphous dielectric material. The semi-amorphous polysilicon has amorphous silicon regions separated by polycrystalline silicon. Subsequent thermal processes used in fabrication of the microelectronic device may convert the semi-amorphous polysilicon in the trench to a polysilicon core. In one aspect, the seed layer may be formed on sidewalls of the trench, contacting the substrate. In another aspect, a polysilicon outer layer may be formed in the trench before forming the seed layer, and the seed layer may be formed on the polysilicon layer.

16 Claims, 42 Drawing Sheets

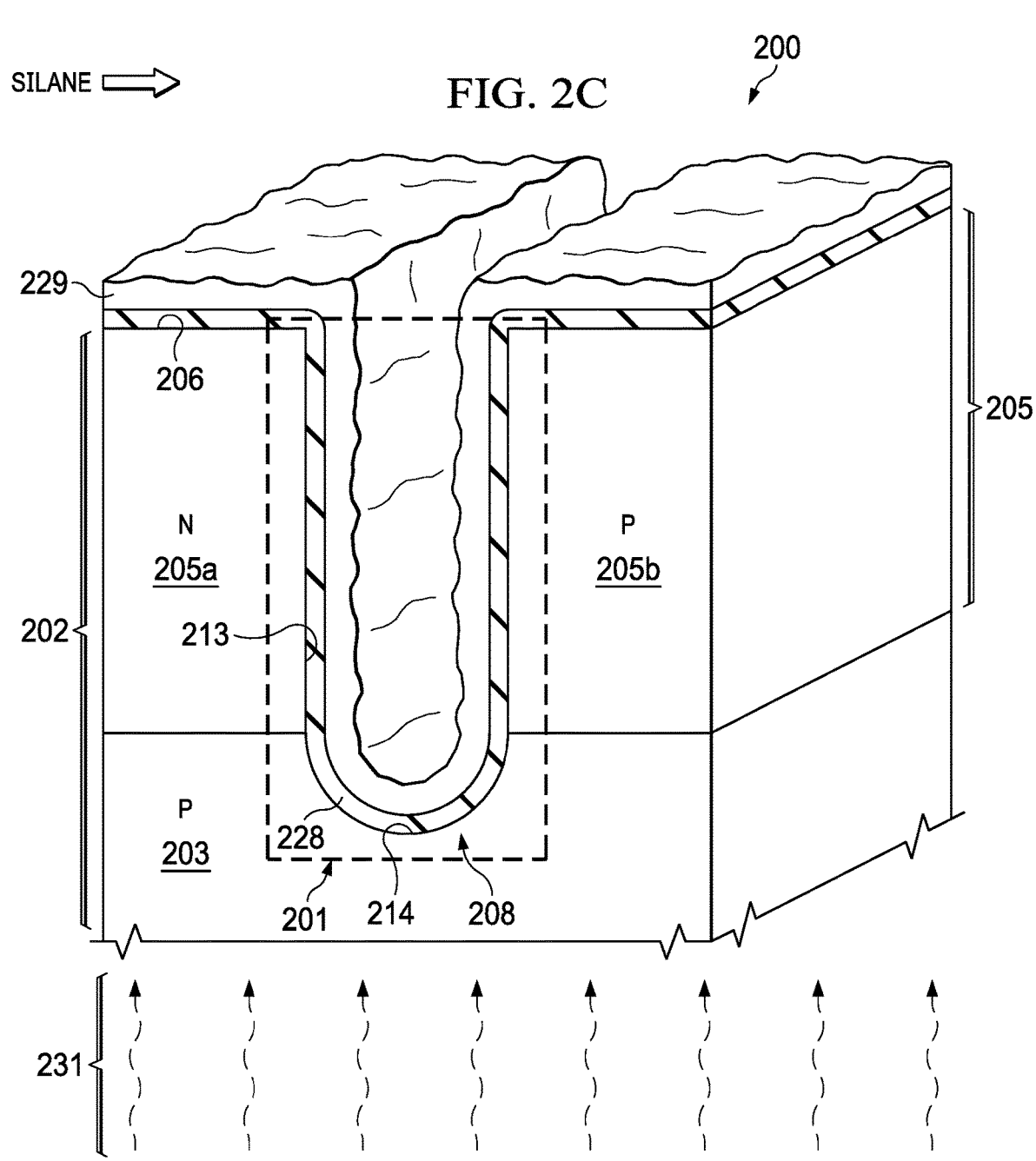

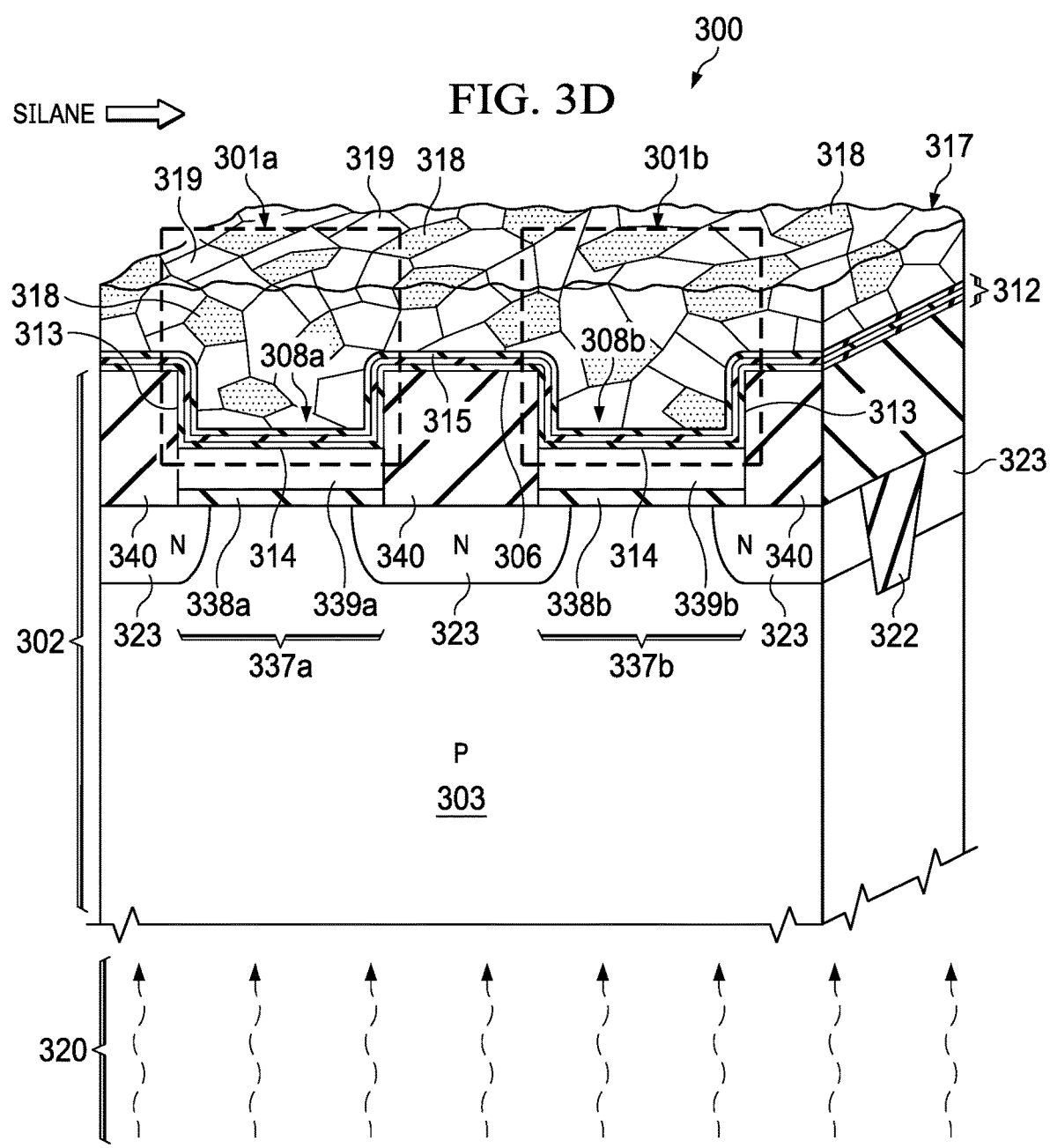

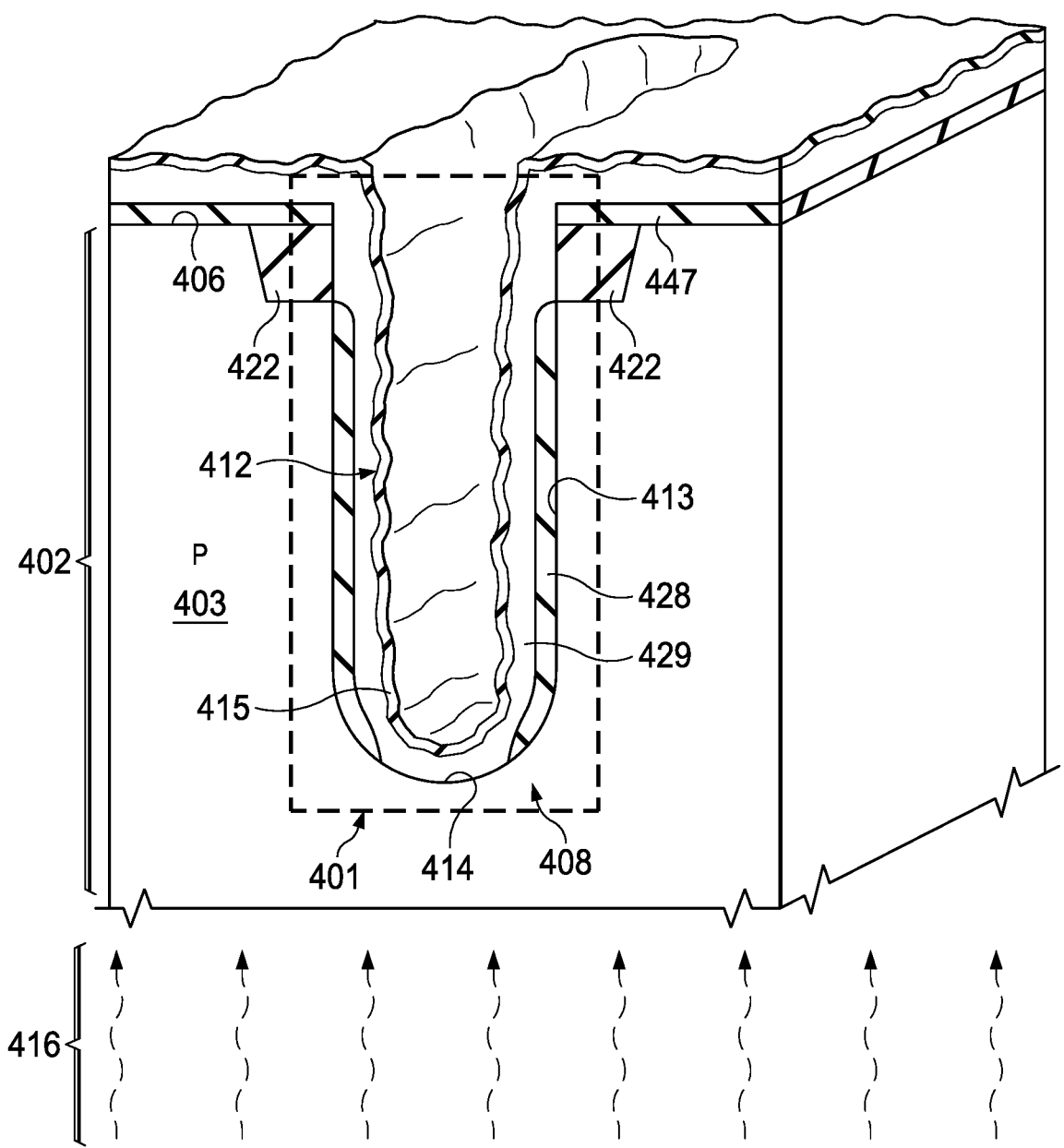

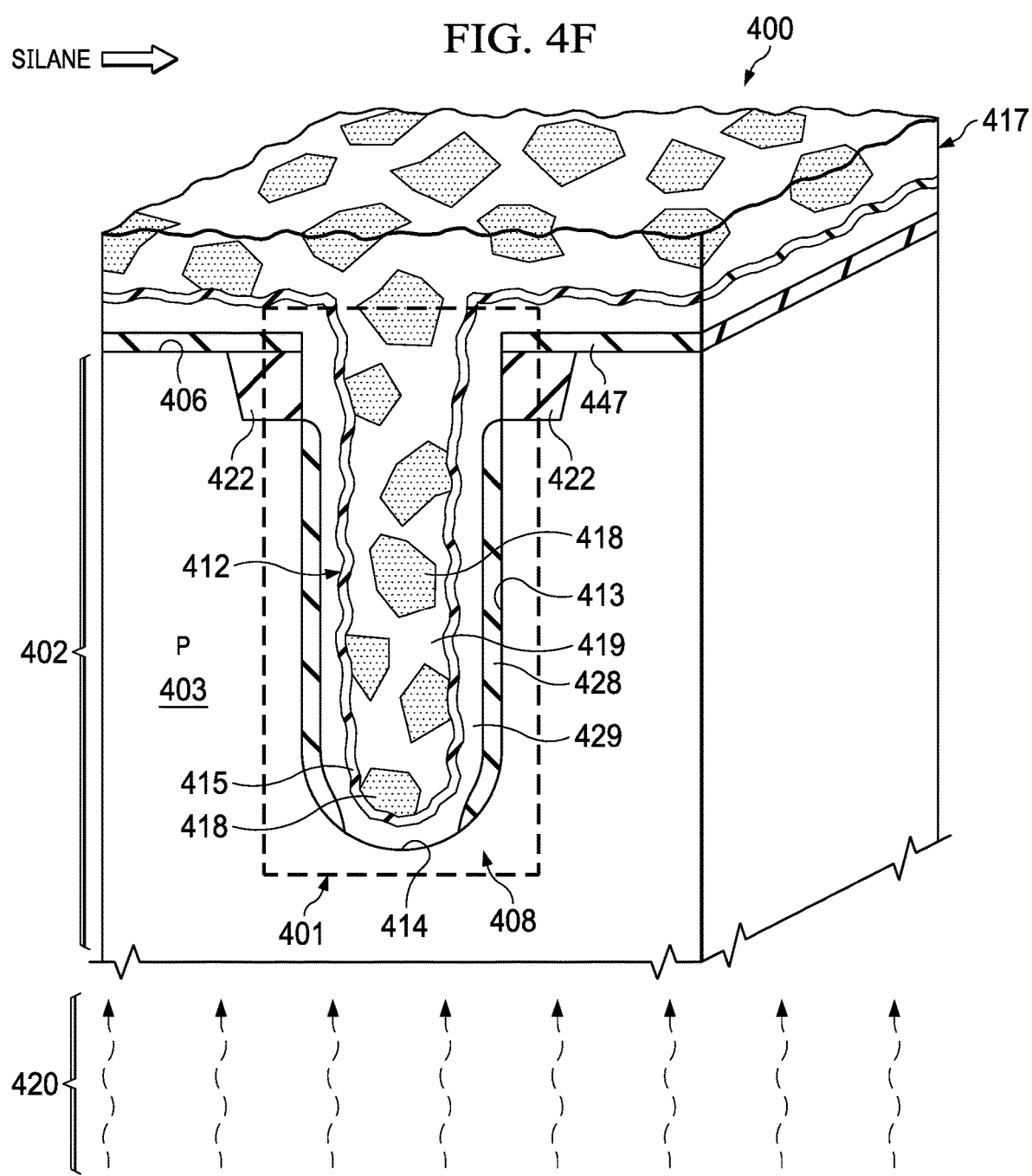

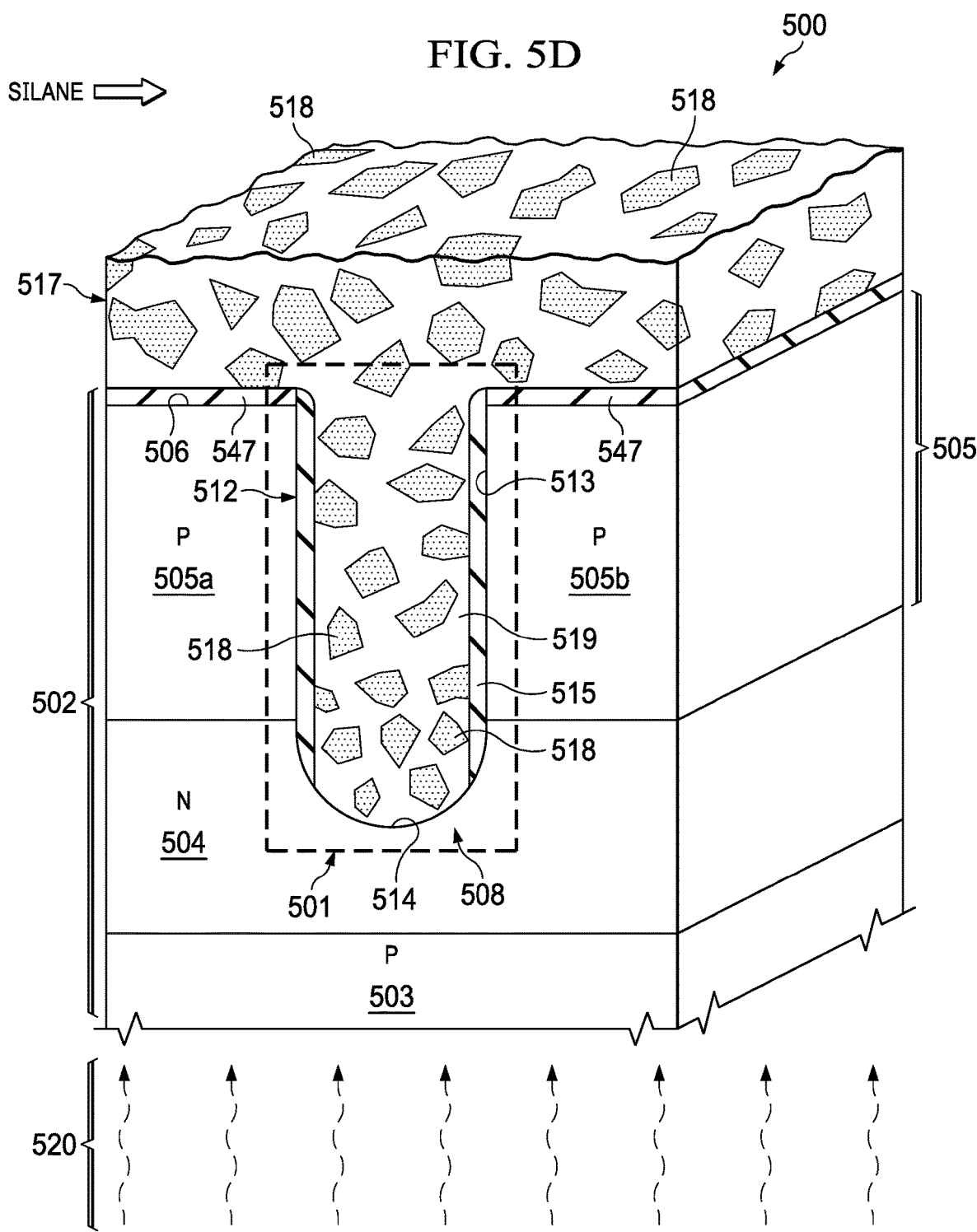

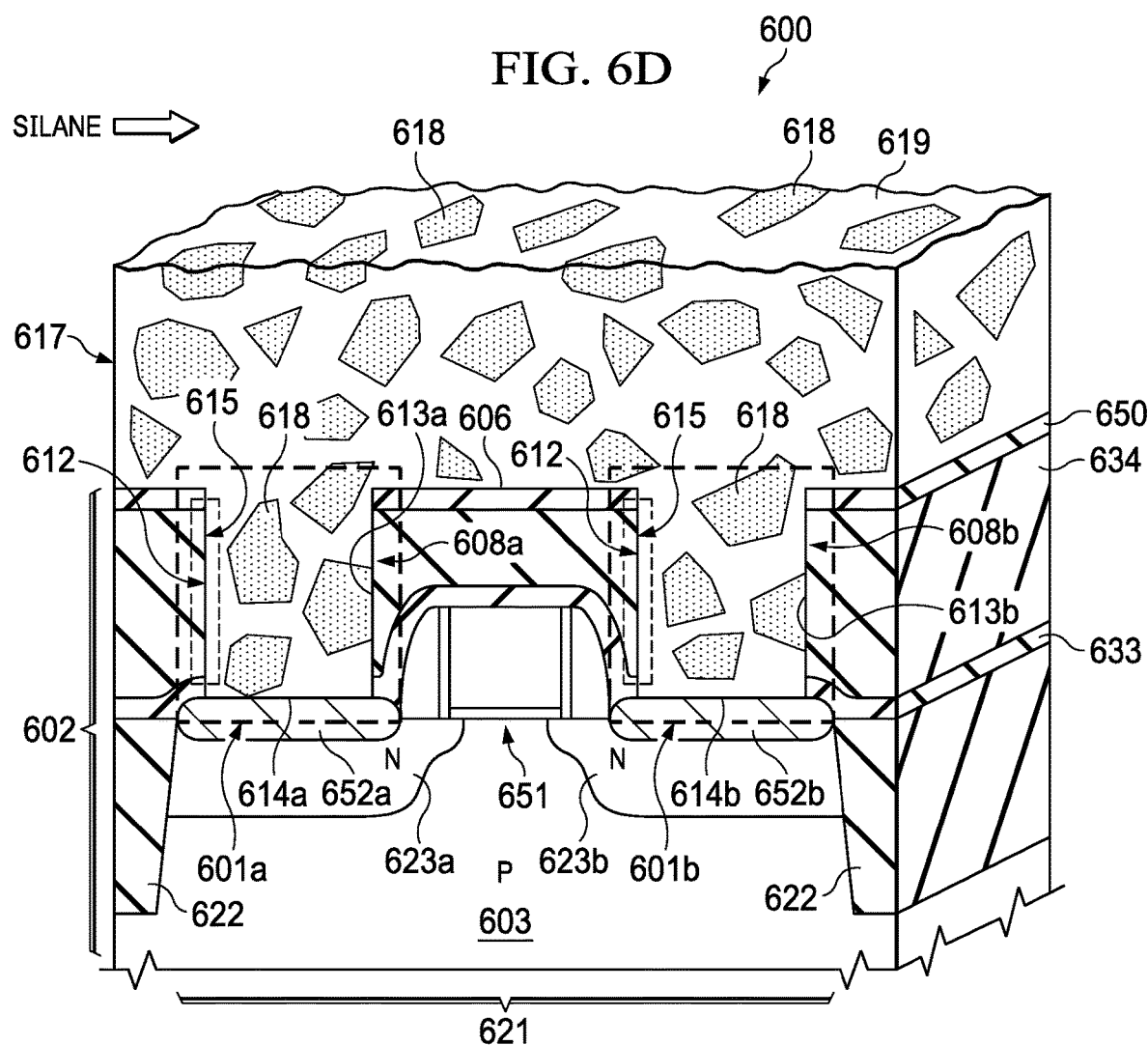

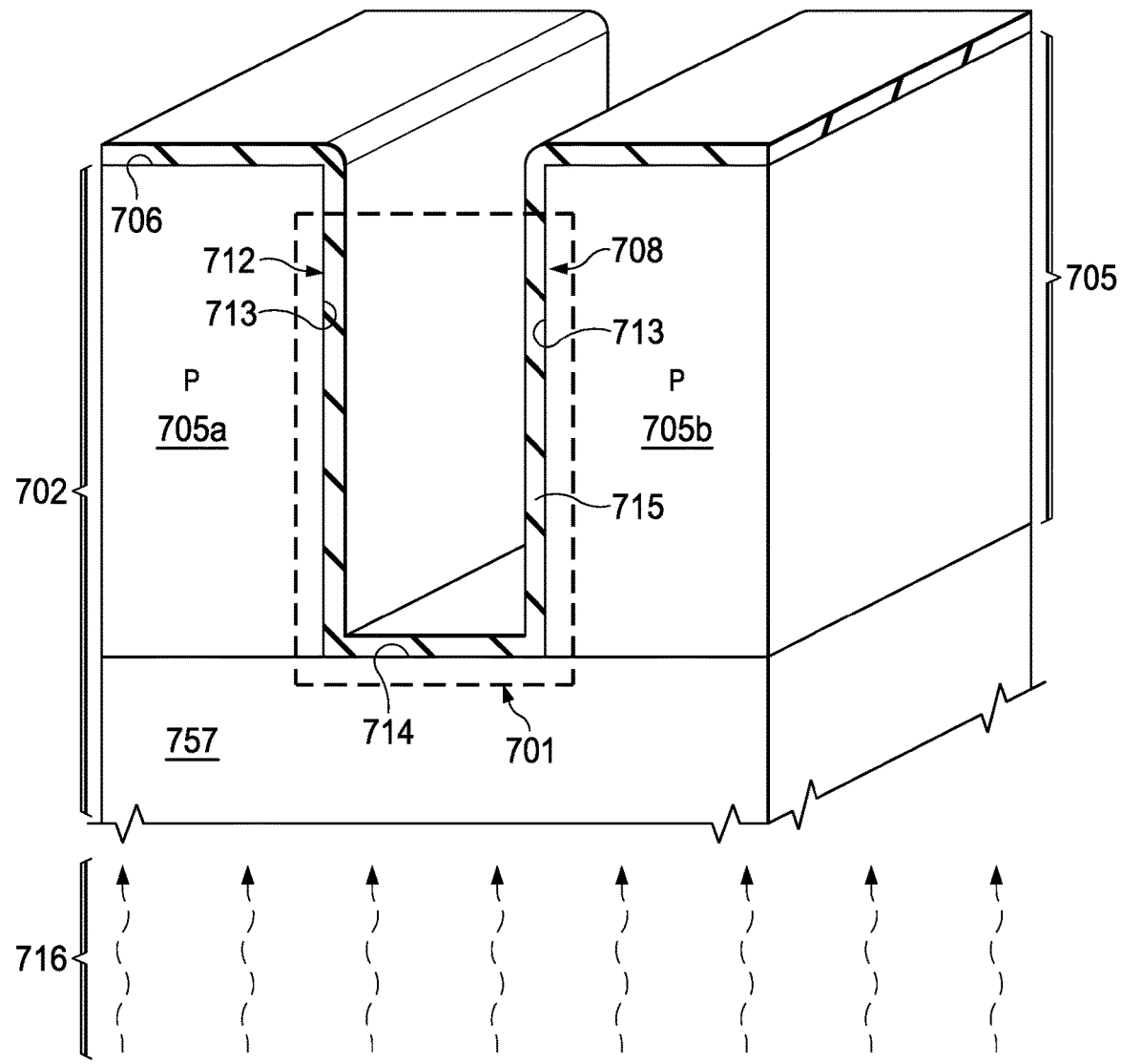

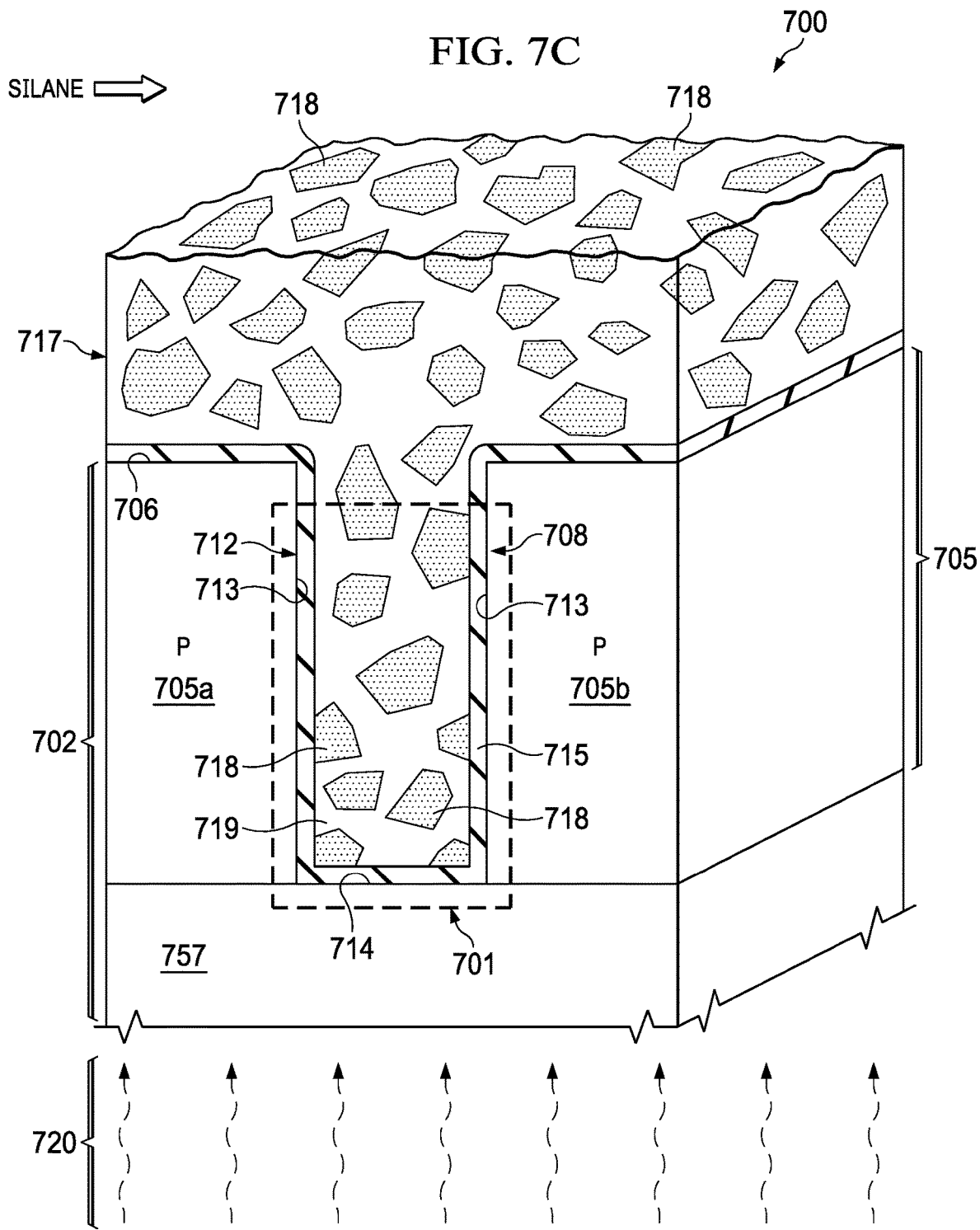

METHOD OF REDUCING VOIDS AND SEAMS IN TRENCH STRUCTURES BY FORMING SEMI-AMORPHOUS POLYSILICON

FIELD

This disclosure relates to the field of microelectronic devices. More particularly, but not exclusively, this disclosure relates to polycrystalline silicon in trench structures in microelectronic devices.

BACKGROUND

Many microelectronic devices have trench structures filled with polycrystalline silicon, commonly referred to as polysilicon. The trench structures may be used for isolation of components, for example. Polysilicon has a thermal expansion coefficient that is similar to silicon, which may be advantageous for a fill material in the trench structures. The industry standard polysilicon deposition process grows large columnar grains that induce seam and void formation in the trench. The seams and voids have the potential to entrap contaminants during subsequent processing, which may degrade yield and reliability of the microelectronic devices. One method for reducing the negative effects of seams and voids is adding an oxide strip and oxide regrowth loop to clean out the voids; this method increases the process complexity, cycle-time and cost. Another method for reducing the negative effects of seams and voids is tapering the trench etch profile to improve the polysilicon fill process; this method is difficult to control for trench structures with high depth-to-width ratios, and adds to process complexity, cycle-time and cost.

SUMMARY

The present disclosure introduces a method of forming a microelectronic device including a trench structure. The method includes forming a trench in a substrate, forming a seed layer in the trench, the seed layer including an amorphous dielectric material; and forming semi-amorphous polysilicon on the amorphous dielectric material. The semi-amorphous polysilicon has amorphous silicon regions separated by polycrystalline silicon. Subsequent thermal processes used in fabrication of the microelectronic device may convert the semi-amorphous polysilicon in the trench to a polysilicon core. The resulting microelectronic device includes the trench structure with the seed layer in the trench, and the polysilicon core that contacts the amorphous dielectric material and fills the trench inside the seed layer. The polysilicon core has silicon grains with an average size that is greater than half a minimum lateral dimension of the trench structure inside the seed layer.

BRIEF DESCRIPTION OF THE VIEWS OF THE DRAWINGS

FIG. 2A through FIG. 2G are cross sections of another microelectronic device including a trench structure, depicted in successive stages of another example method of formation.

FIG. 3A through FIG. 3H are cross sections of a further microelectronic device including a first trench structure and a second trench structure, depicted in successive stages of a further example method of formation.

FIG. 4A through FIG. 4H are cross sections of another microelectronic device including a trench structure, depicted in successive stages of another example method of formation.

FIG. 5A through FIG. 5E are cross sections of another microelectronic device including a trench structure, depicted in successive stages of a further example method of formation.

FIG. 6A through FIG. 6E are cross sections of a further microelectronic device including a first trench structure and a second trench structure, depicted in successive stages of another example method of formation.

FIG. 7A through FIG. 7D are cross sections of a further microelectronic device including a trench structure, depicted in successive stages of a further example method of formation.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device including a trench structure may be formed by forming a trench in a substrate. In a first version of forming the microelectronic device, a seed layer which includes an amorphous dielectric material is formed in the trench, on sidewalls of the trench. Semi-amorphous polysilicon is formed on the amorphous dielectric material, filling the trench inside the seed layer. The semi-amorphous polysilicon has amorphous silicon regions, separated by polycrystalline silicon. In a second version of forming the microelectronic device, a polysilicon outer layer is formed in the trench prior to forming the seed layer, and the seed layer is formed on the polysilicon outer layer. The semi-amorphous polysilicon is formed on the amorphous dielectric material, filling the trench inside the seed layer, as in the first version. Subsequent thermal processes used to complete fabrication of the microelectronic device convert the amorphous silicon regions to polycrystalline silicon, so that the trench structure of the completed microelectronic device has a polysilicon core that contacts the amorphous dielectric material and fills the trench inside the seed layer. The polysilicon core has silicon grains with an average size that is greater than half a minimum lateral dimension of the trench structure inside the seed layer. The trench structure may be advantageously free of seams and voids.

For the purposes of this disclosure, the term "polycrystalline silicon" refers to silicon having multiple grains, with each grain having a crystalline structure in which adjacent silicon atoms are separated by constant spacings. The term "amorphous silicon" refers to silicon that is free of a crystalline structure.

It is noted that terms such as top, bottom, over, and below may be used in this disclosure. These terms should not be construed as limiting the position or orientation of a structure or element, but should be used to provide spatial relationship between structures or elements.

Figure 1A:
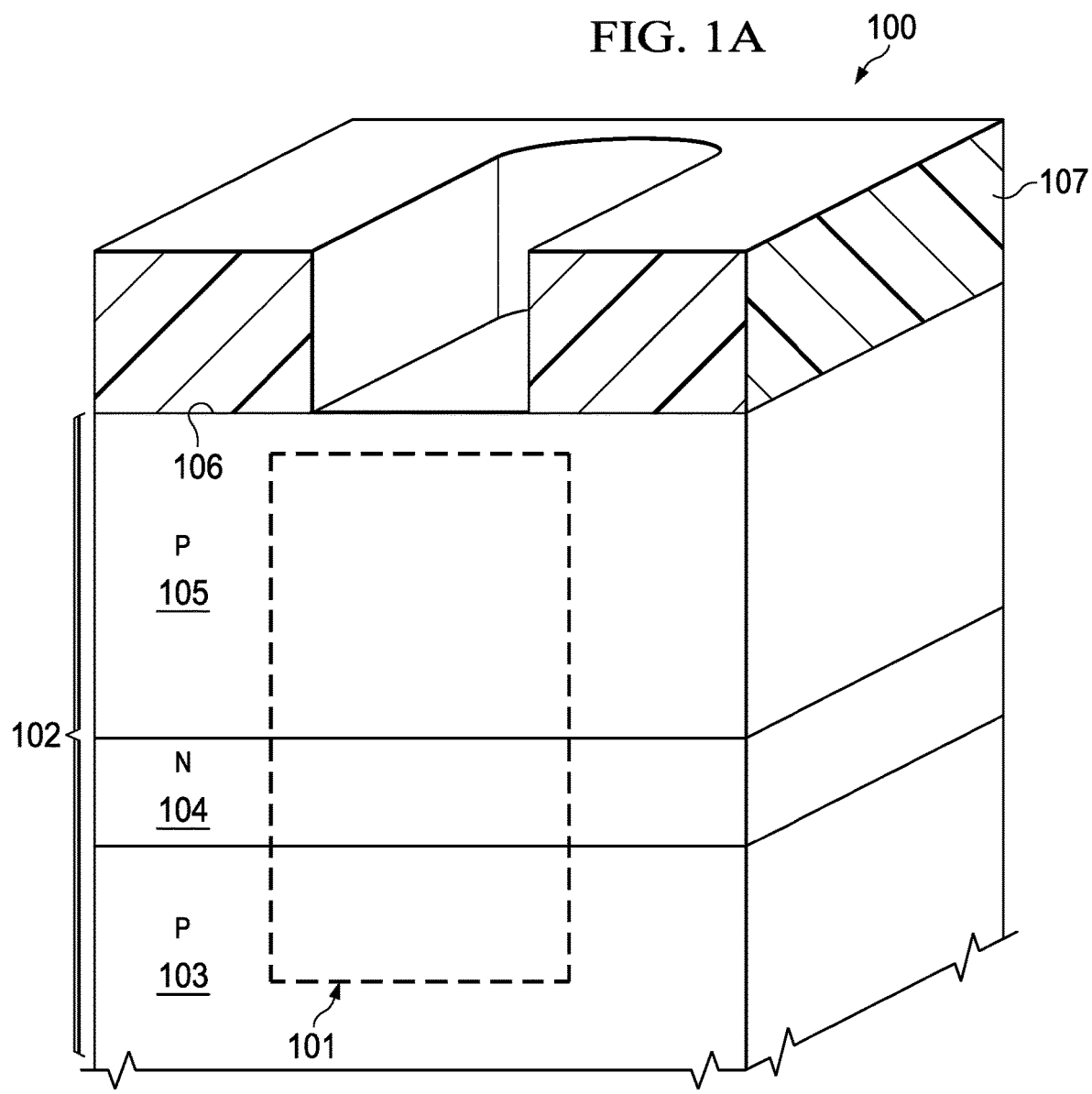
FIG. 1A through FIG. 1E are cross sections of a microelectronic device including a trench structure, depicted in successive stages of an example method of formation.

FIG. 1A through FIG. 1E are cross sections of a microelectronic device 100 including a trench structure 101, depicted in successive stages of an example method of formation. Referring to FIG. 1A, the microelectronic device 100 is formed in and on a substrate 102. The microelectronic device 100 may be manifested as an integrated circuit, a discrete semiconductor device, a microelectrical mechanical system (MEMS) device, an electro-optical device, or a microfluidic device, by way of example. The substrate 102 may be part of a wafer that includes other microelectronic devices. In this example, the substrate 102 may include a lower layer 103 of p-type semiconductor material, such as p-type silicon, a buried layer 104 of n-type semiconductor material, such as n-type silicon, on the lower layer 103, and an epitaxial layer 105 of p-type semiconductor material, such as p-type silicon, on the buried layer 104. The epitaxial layer 105 extends to a top surface 106 of the substrate 102.

A trench mask 107 is formed over the top surface 106. The trench mask 107 exposes the substrate 102 in an area for the trench structure 101. The trench mask 107 may include hard mask materials, such as silicon dioxide, silicon nitride, silicon oxynitride, silicon carbide, or silicon carbonitride. Other materials for the trench mask 107 are within the scope of this example. The trench mask 107 may be formed, by way of example, by forming one or more layers of hard mask materials on the substrate 102 over the top surface 106, forming an etch mask of photoresist over the layers of hard mask materials by a photolithographic process, followed by removing the hard mask materials where exposed by the etch mask.

Figure 1B:
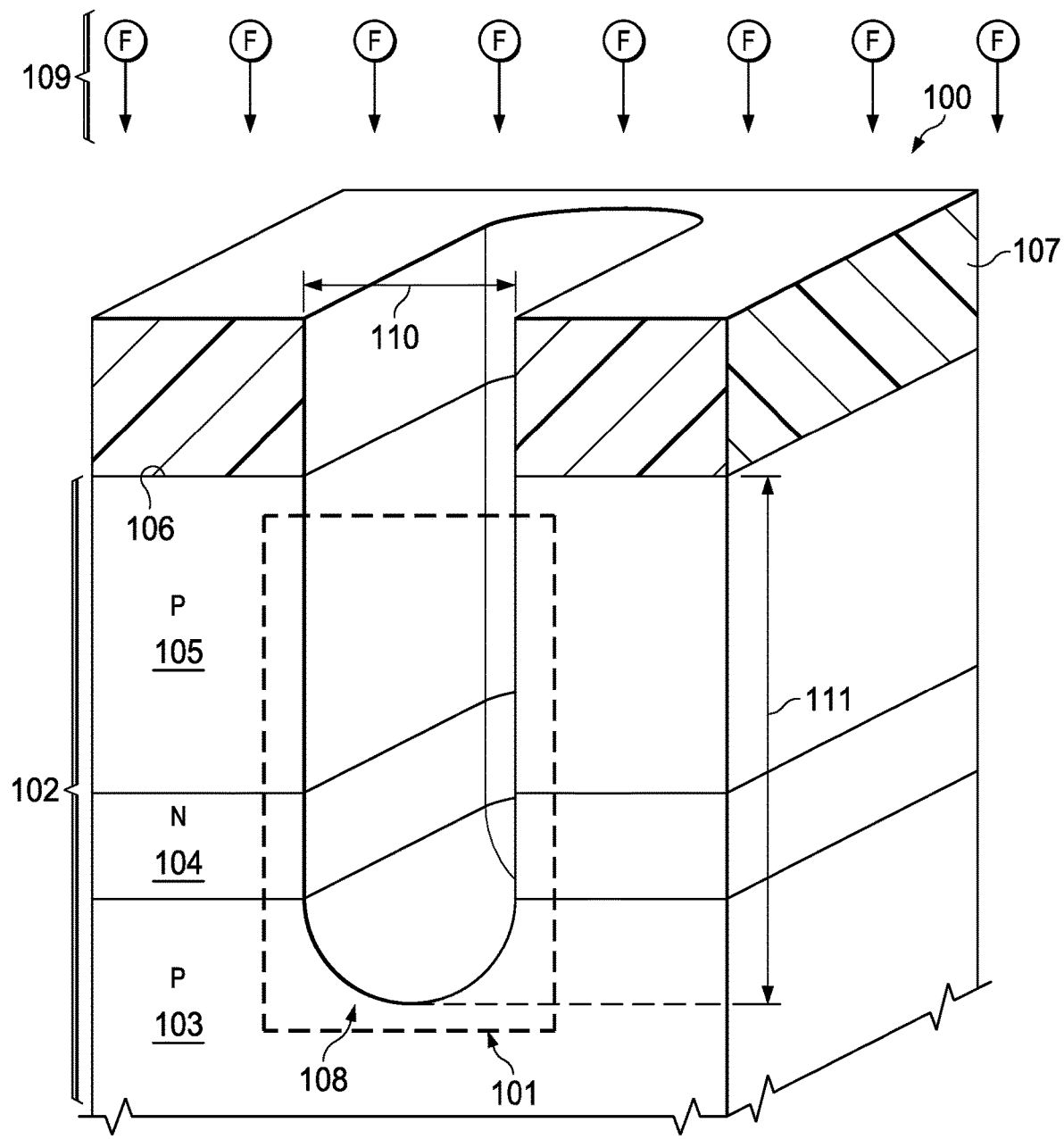

Referring to FIG. 1B, substrate material is removed from the substrate 102 where exposed by the trench mask 107 to form a trench 108 in the substrate 102. In this example, the trench 108 may extend through the buried layer 104 into the lower layer 103. The substrate material may be removed from the substrate 102 by a reactive ion etch (RIE) process using halogen radicals 109 such as fluorine, as indicated in FIG. 1B. The RIE process may be implemented as an iterative etch and passivate process, or may be implemented as a continuous etch with concurrent passivation process.

FIG. 1B depicts the trench 108 as having an open configuration with a terminus, or end. In other versions of this example, the trench 108 may have a closed loop configuration, laterally surrounding a portion of the epitaxial layer 105. The trench 108 has a width 110 which is a minimum lateral dimension of the trench 108 at the top surface 106 of the substrate 102. The trench 108 has a depth 111 which is a maximum vertical dimension of the trench 108 from the top surface 106. The depth 111 may be greater than the width 110. For the purposes of this disclosure, the terms "lateral" and "laterally" refer to directions parallel to the top surface 106, and similarly for other examples herein. The term "vertical" refers to directions perpendicular to the top surface 106, and similarly for other examples herein.

Figure 1C:
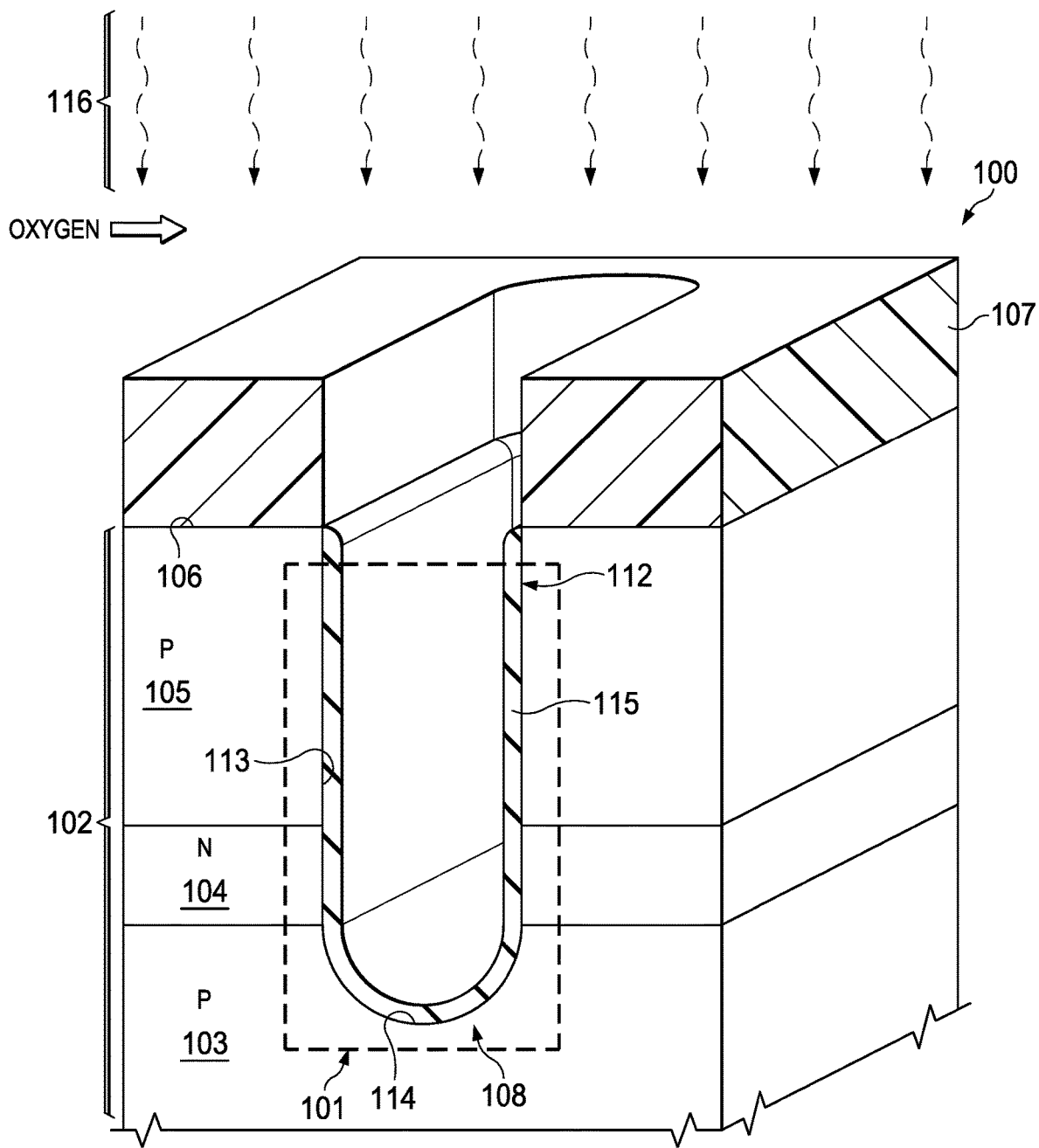

Referring to FIG. 1C, a seed layer 112 is formed in the trench 108. In this example, the seed layer 112 is formed on the sidewalls 113 and the bottom 114 of the trench 108, the bottom 114 being located opposite from the top surface 106. The seed layer 112 includes an amorphous dielectric material 115. In this example, the seed layer 112 may be formed by heating the substrate 102 in a furnace heating process 116 and exposing the substrate 102 to oxygen, denoted as "OXYGEN" in FIG. 1C, to thermally oxidize silicon in the substrate 102 exposed by the trench 108. The amorphous dielectric material 115 of this example may include primarily silicon dioxide. Other methods of forming the seed layer 112, and other materials for the amorphous dielectric material 115 are within the scope of this example. The seed layer 112 may consist essentially of the amorphous dielectric material 115. Alternatively, the seed layer 112 may include one or more adhesion layers or isolation layers between the substrate 102 and the amorphous dielectric material 115.

Figure 1D:
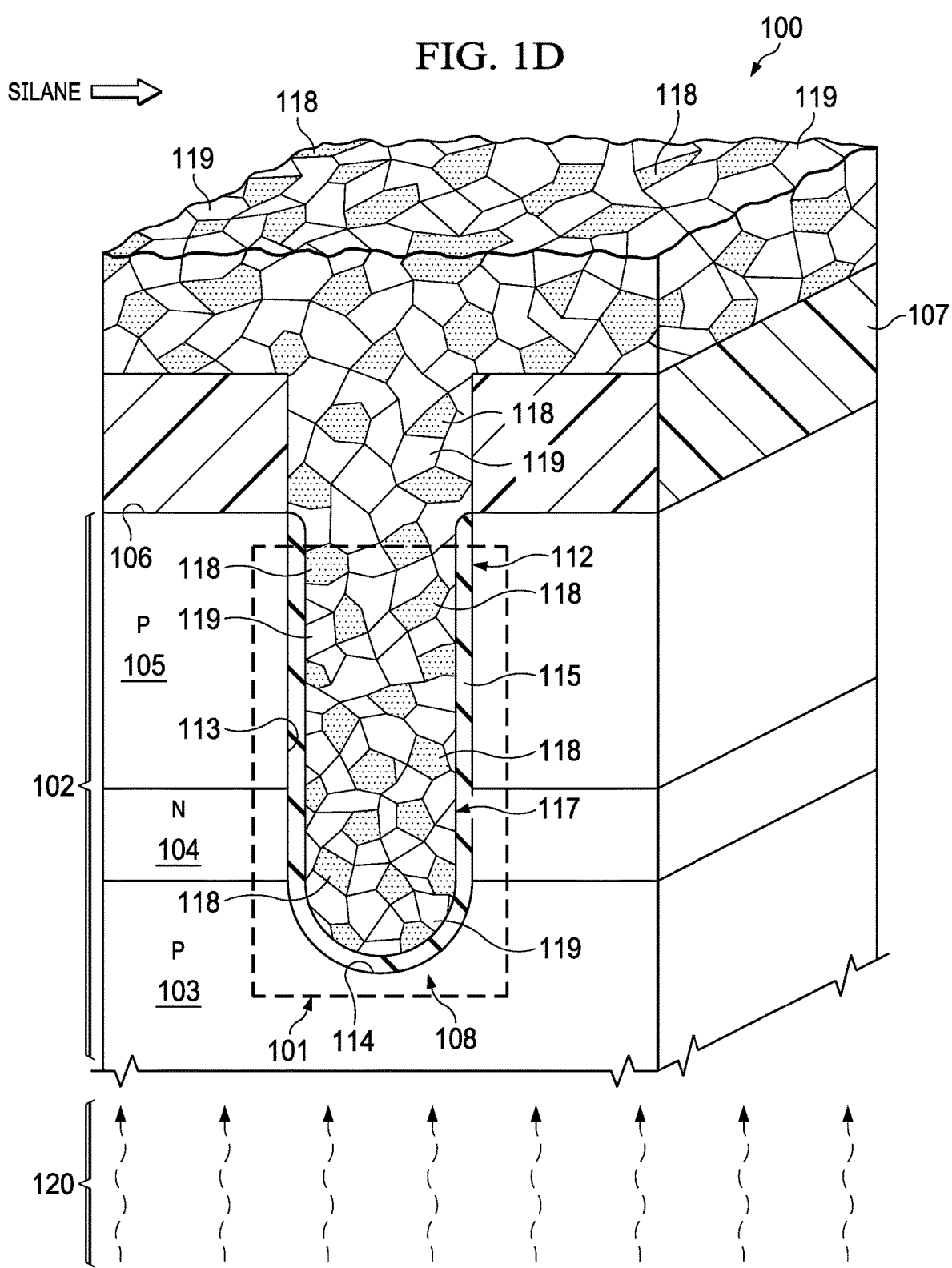

Referring to FIG. 1D, semi-amorphous polysilicon 117 is formed in the trench 108 on the amorphous dielectric material 115. The semi-amorphous polysilicon 117 includes amorphous silicon regions 118 separated by polycrystalline silicon 119. The semi-amorphous polysilicon 117 fills the trench 108 inside the seed layer 112. In this example, the semi-amorphous polysilicon 117 may extend over the top surface 106 of the substrate 102 adjacent to the trench 108, by overlapping onto the trench mask 107.

The semi-amorphous polysilicon 117 may be formed by thermal decomposition of a silicon reagent gas, such as silane ($SiH_4$). In one version of this example, the substrate 102 may be heated to a temperature of 555° C. to 580° C. by a substrate heating process 120 such as a heated wafer chuck. The silicon reagent gas, denoted in FIG. 1D as "SILANE", is flowed over the substrate 102 at a pressure of 100 millitorr to 250 millitorr. The silicon reagent gas thermally decomposes, and silicon from the silicon reagent gas forms the semi-amorphous polysilicon 117.

In alternate versions of this example and other examples disclosed herein, the silicon reagent gas may include a portion of higher silanes, such as disilane ($Si_2H_6$) or trisilane ($Si_3H_8$). Formation of the semi-amorphous polysilicon 117 with a desired weight percent of the amorphous silicon regions 118 using disilane or trisilane may be achieved at a higher deposition rate and at a lower substrate temperature than when using silane alone. Process latitude, with regard to temperature range, pressure, and flow rates, may be tighter when using disilane or trisilane.

Filling the trench 108 inside the seed layer 112 with the semi-amorphous polysilicon 117 may advantageously reduce seam and void formation in the trench structure 101, as the amorphous silicon regions 118 disrupt formation of long columnar grains in the polycrystalline silicon 119; the long columnar grains are characteristic of conventional polysilicon deposition process and lead to voids and seams along a center of the trench 108. Use of the semi-amorphous polysilicon 117 may be especially advantageous when the depth 111 of the trench 108, shown in FIG. 1B, is greater than the width 110 of the trench 108, also shown in FIG. 1B, as conventional polysilicon deposition processes tend to form voids or seams when the depth 111 exceeds the width 110. Increasing the temperature of the substrate 102 decreases an amount of the amorphous silicon regions 118 in the semi-amorphous polysilicon 117. To reduce void and seam formation, the semi-amorphous polysilicon 117 should include at least 20 weight percent of the amorphous silicon regions 118. Attaining at least 20 weight percent of the amorphous silicon regions 118 requires the temperature of the substrate 102 to be no higher than 580° C., when using silane gas at 100 millitorr to 250 millitorr. Deposition rate of the semi-amorphous polysilicon 117 slows down as the amount of the amorphous silicon regions 118 in the semi-amorphous polysilicon 117 is increased. To eliminate void and seam formation while minimizing deposition time, the semi-amorphous polysilicon 117 should include no more than 90 weight percent of the amorphous silicon regions 118. Attaining no more than 90 weight percent of the amorphous silicon regions 118 requires the temperature of the substrate 102 to be at least 555° C., when using silane gas at 100 millitorr to 250 millitorr.

Figure 1E:
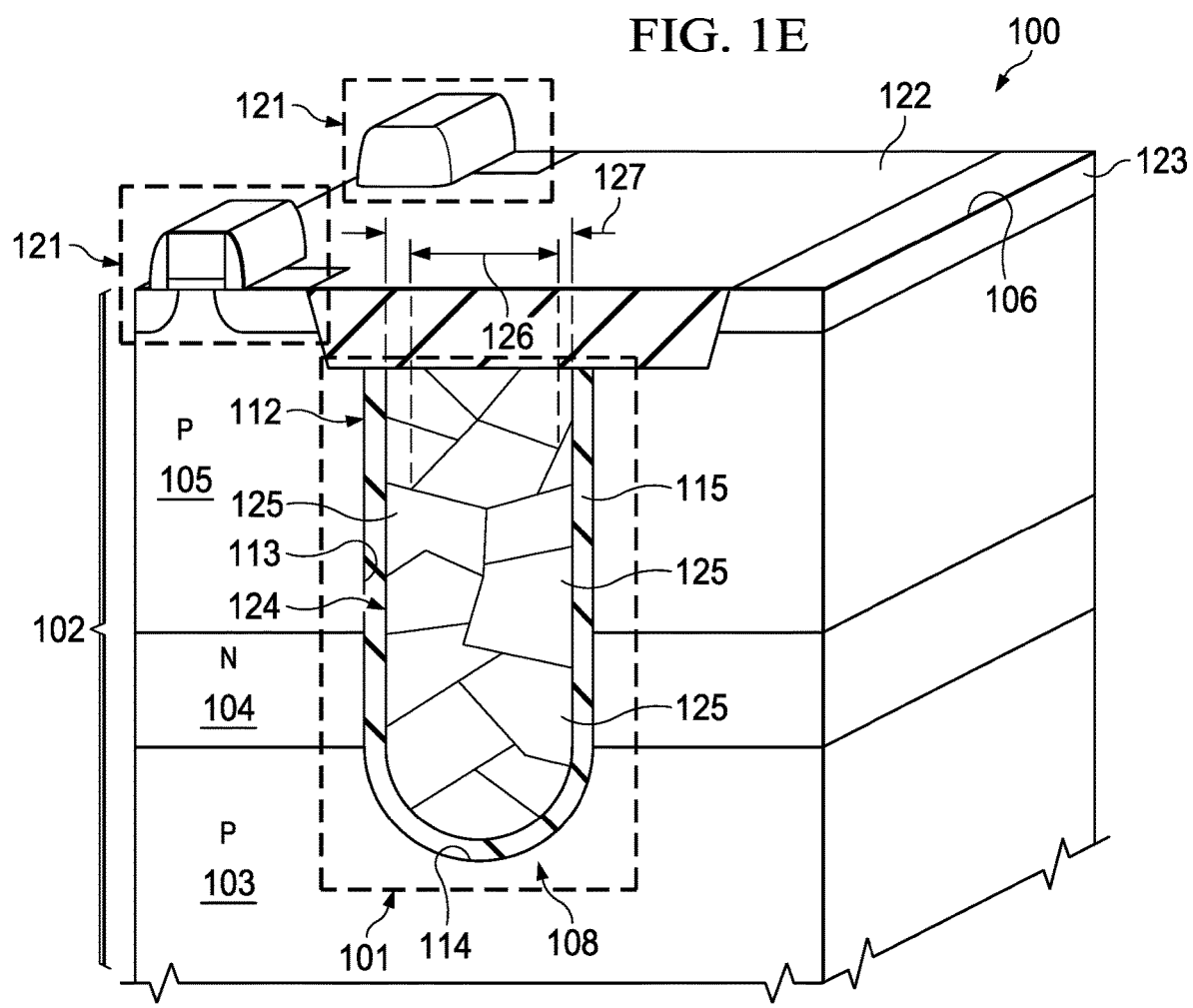

FIG. 1E depicts the microelectronic device 100 after formation of components 121 in the substrate 102. The semi-amorphous polysilicon 117 of FIG. 1D outside of the trench 108 is removed, by a chemical mechanical polish (CMP) process, or etchback process, or a combination of both processes. The trench mask 107 of FIG. 1D is removed, for example, by a wet etch that is selective to the semi-amorphous polysilicon 117 and to the substrate 102.

Field oxide 122 may be formed in the substrate 102 to laterally separate the components 121. The field oxide 122 may be formed by a shallow trench isolation (STI) process, in which a shallow trench is formed in the substrate and filled with dielectric material such as silicon dioxide, then planarized. Alternatively, the field oxide 122 may be formed by a local oxidation of silicon (LOCOS) process, in which a silicon nitride mask is patterned to expose regions for the field oxide 122, and the field oxide 122 is formed by thermal oxidation of silicon in the substrate 102 where exposed by the silicon nitride mask, followed by removal of the silicon nitride mask. The components 121 are depicted in FIG. 1E as metal oxide semiconductor (MOS) transistors, however, other manifestations of the components 121, such as bipolar junction transistors, resistors, MEMS actuators, MEMS sensors, electro-optic emitters, electro-optic detectors, or microfluidic components, are within the scope of this example. Doped regions 123 may be formed in the substrate 102 to facilitate functionality of the components 121. Thermal processes, such as implant damage anneals, thermal drives, and implant activation anneals, used to form the components 121 and doped regions 123 may heat the substrate 102 sufficiently to convert the semi-amorphous polysilicon 117 to a polysilicon core 124 in the trench 108. The polysilicon core 124 is part of the trench structure 101. The polysilicon core 124 has silicon grains 125 with an average size 126 that is greater than half a minimum lateral dimension 127 inside the seed layer 112. The average size 126 of the silicon grains 125 in the polysilicon core 124 may thus be indicative of forming the polysilicon core 124 using the semi-amorphous polysilicon 117. The polysilicon core 124 may be advantageously free of seams and voids.

Figure 2A:
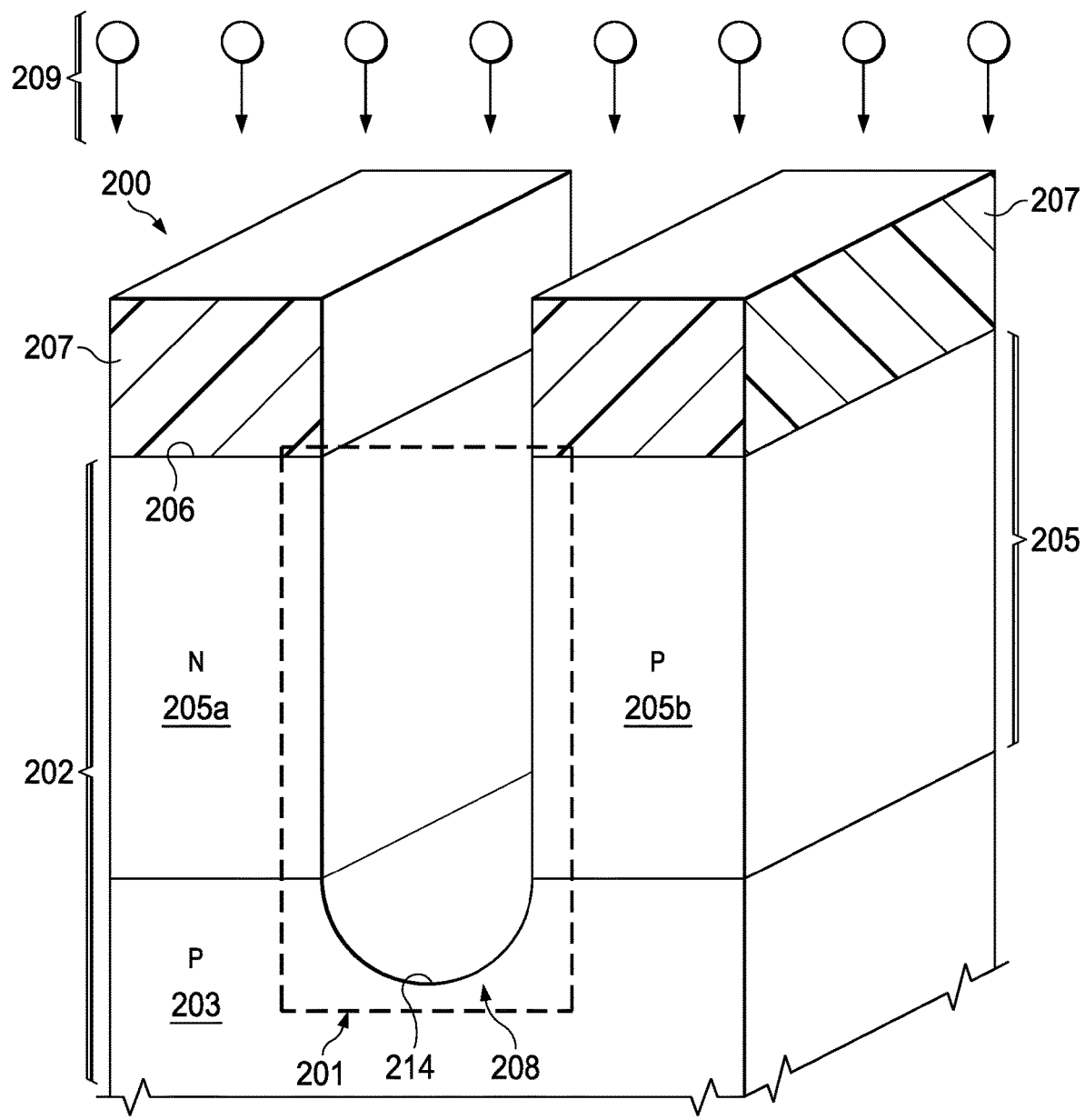

FIG. 2A through FIG. 2G are cross sections of another microelectronic device 200 including a trench structure 201, depicted in successive stages of another example method of formation. Referring to FIG. 2A, the microelectronic device 200 is formed in and on a substrate 202. In this example, the substrate 202 may include a lower layer 203 of p-type semiconductor material, such as p-type silicon, and an upper layer 205 on the lower layer 203. The upper layer 205 may include a first upper layer portion 205a of n-type semiconductor material, such as n-type silicon, and a second upper layer portion 205b of p-type semiconductor material, such as p-type silicon. The upper layer 205 extends to a top surface 206 of the substrate 202. The trench structure 201 laterally separates the first upper layer portion 205a from the second upper layer portion 205b.

A trench mask 207 is formed over the top surface 206, exposing the substrate 202 in an area for the trench structure 201. The trench mask 207 may include hard mask materials, as disclosed in reference to FIG. 1A. Substrate material is removed from the substrate 202 where exposed by the trench mask 207 to form a trench 208 in the substrate 202, extending into the lower layer 203. The substrate material may be removed from the substrate 202 using halogen radicals 209, as disclosed in reference to FIG. 1B, for example. The trench mask 207 may be removed by a plasma etch process using halogen radicals, or by a wet etch process, or by a combination of both processes.

Figure 2B:
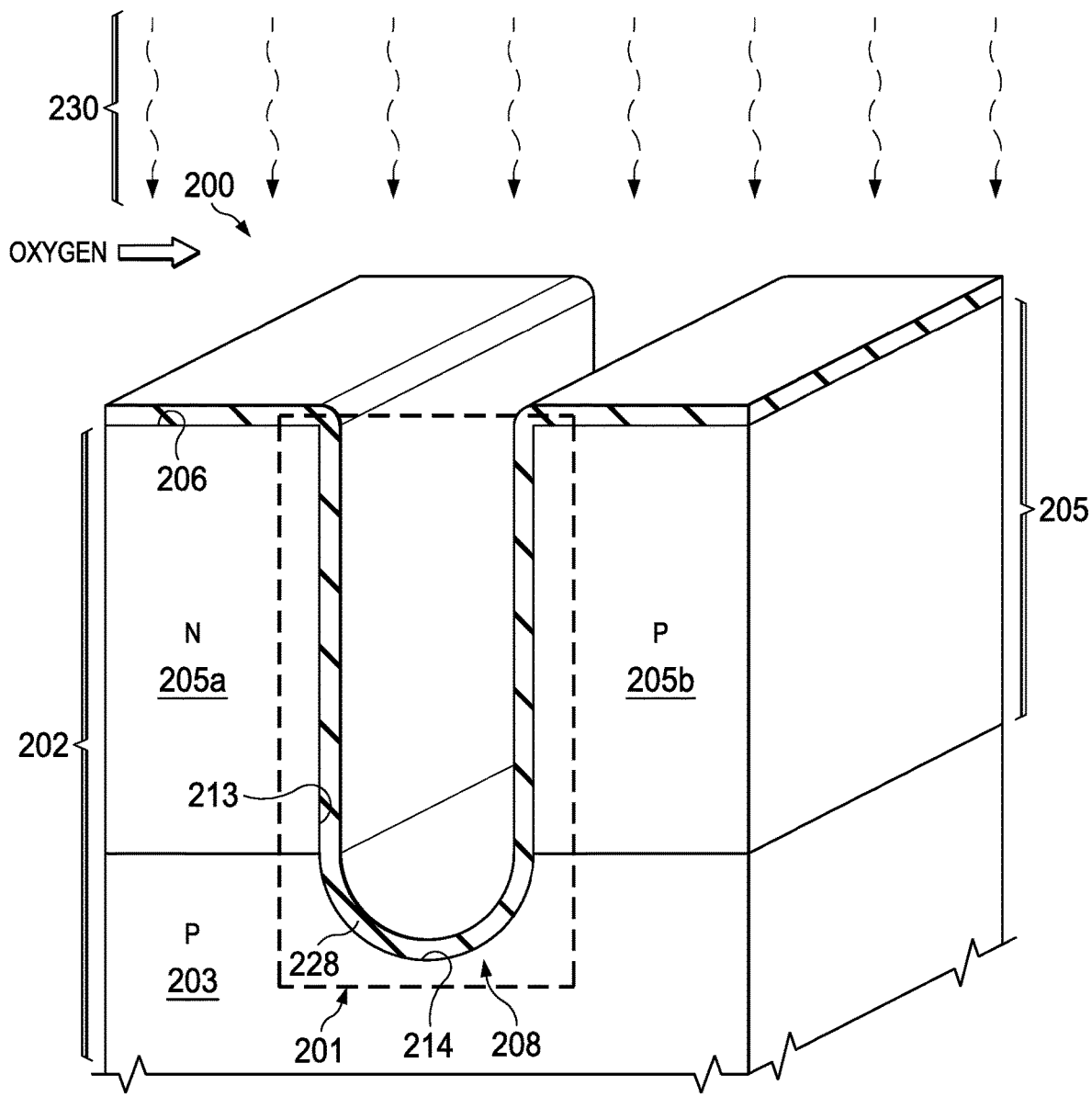

Referring to FIG. 2B, a trench liner 228 is formed in the trench 208, on sidewalls 213 and a bottom 214 of the trench 208, the bottom 214 being located opposite from the top surface 206. In this example, the trench liner 228 may be formed by a thermal oxidation process using a first furnace heating process 230 and exposing the substrate 202 to oxygen, denoted as "OXYGEN" in FIG. 2B, to thermally oxidize silicon in the substrate 202 exposed by the trench 208. The trench liner 228 of this example is electrically non-conductive. The trench liner 228 may extend onto the top surface 206 of the substrate 202. Other methods of forming the trench liner 228 are within the scope of this example.

Referring to FIG. 2C, a polysilicon outer layer 229 is formed in the trench 208 on the trench liner 228. The polysilicon outer layer 229 may be formed by thermal decomposition of silane, denoted as "SILANE" in FIG. 2C, in a chemical vapor deposition process which heats the substrate 202 by a first substrate heating process 231, such as a heated wafer chuck. The first substrate heating process 231 may heat the substrate 202 to a temperature of 610° C. to 630° C., to maximize a deposition rate of the polysilicon outer layer 229. The polysilicon outer layer 229 may be essentially free of amorphous silicon regions. The polysilicon outer layer 229 may extend over the top surface 206 of the substrate 202 on the trench liner 228, as depicted in FIG. 2C. Forming the polysilicon outer layer 229 may advantageously reduce a total time to form the trench structure 201, due to the faster deposition rate of the polysilicon in the polysilicon outer layer 229 compared to semi-amorphous polysilicon.

Figure 2D:
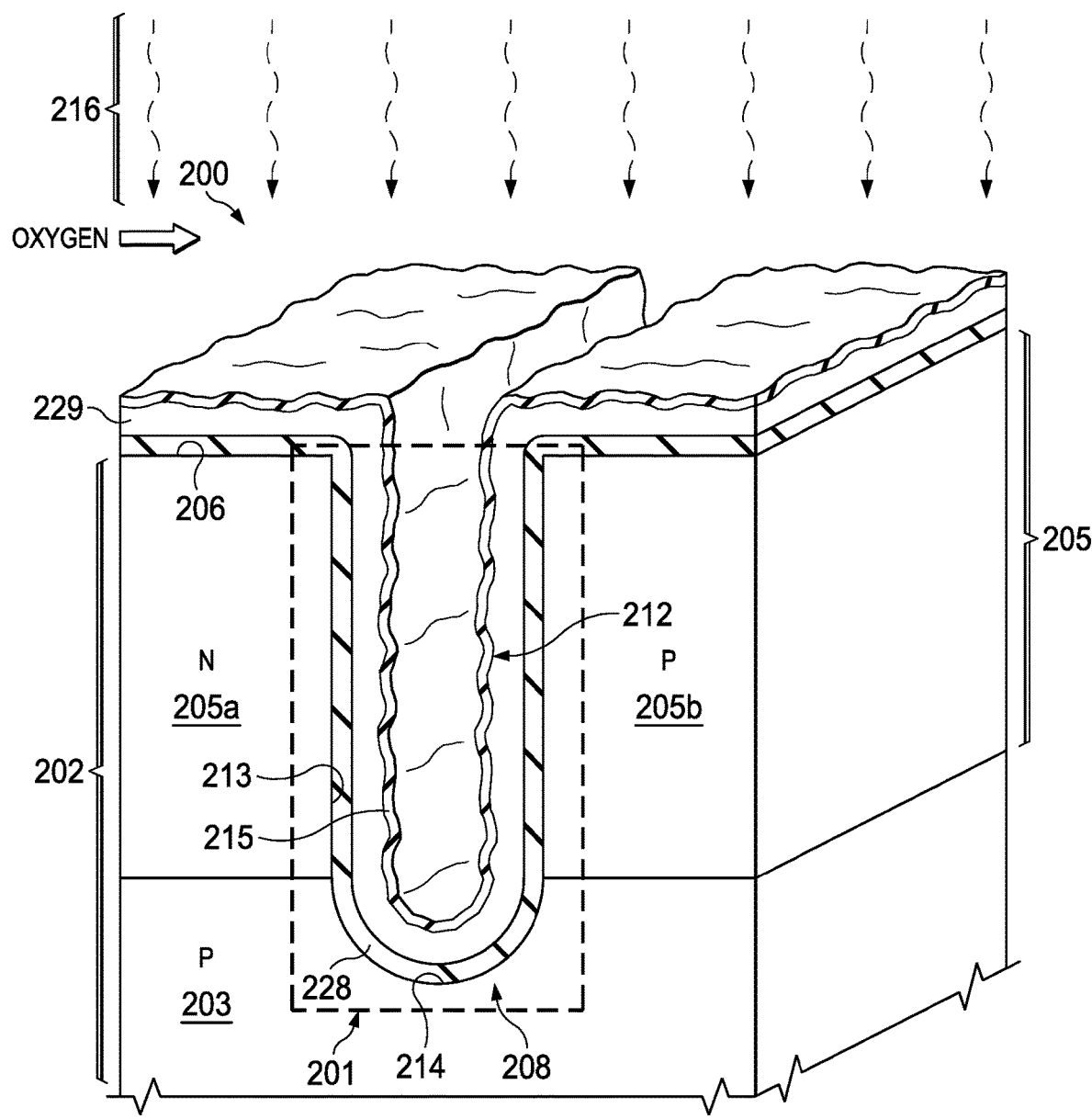

Referring to FIG. 2D, a seed layer 212 is formed in the trench 208, on the polysilicon outer layer 229, in this example. The seed layer 212 extends along the sidewalls 213 and the bottom 214 of the trench 208, separated from the substrate 202 by the polysilicon outer layer 229. The seed layer 212 includes an amorphous dielectric material 215. In this example, the seed layer 212 may be formed by heating the substrate 202 in a second furnace heating process 216 and exposing the substrate 202 to oxygen, denoted as "OXYGEN" in FIG. 2D, to thermally oxidize silicon in the polysilicon outer layer 229. The amorphous dielectric material 215 of this example may include primarily silicon dioxide. Other methods of forming the seed layer 212, such as a chemical vapor deposition process, and other materials for the amorphous dielectric material 215 are within the scope of this example. The seed layer 212 may consist essentially of the amorphous dielectric material 215. In this example, the seed layer 212 may have a thickness of 5 nanometers to 100 nanometers, sufficient to provide an amorphous layer for subsequent formation of semi-amorphous polysilicon.

Figure 2E:
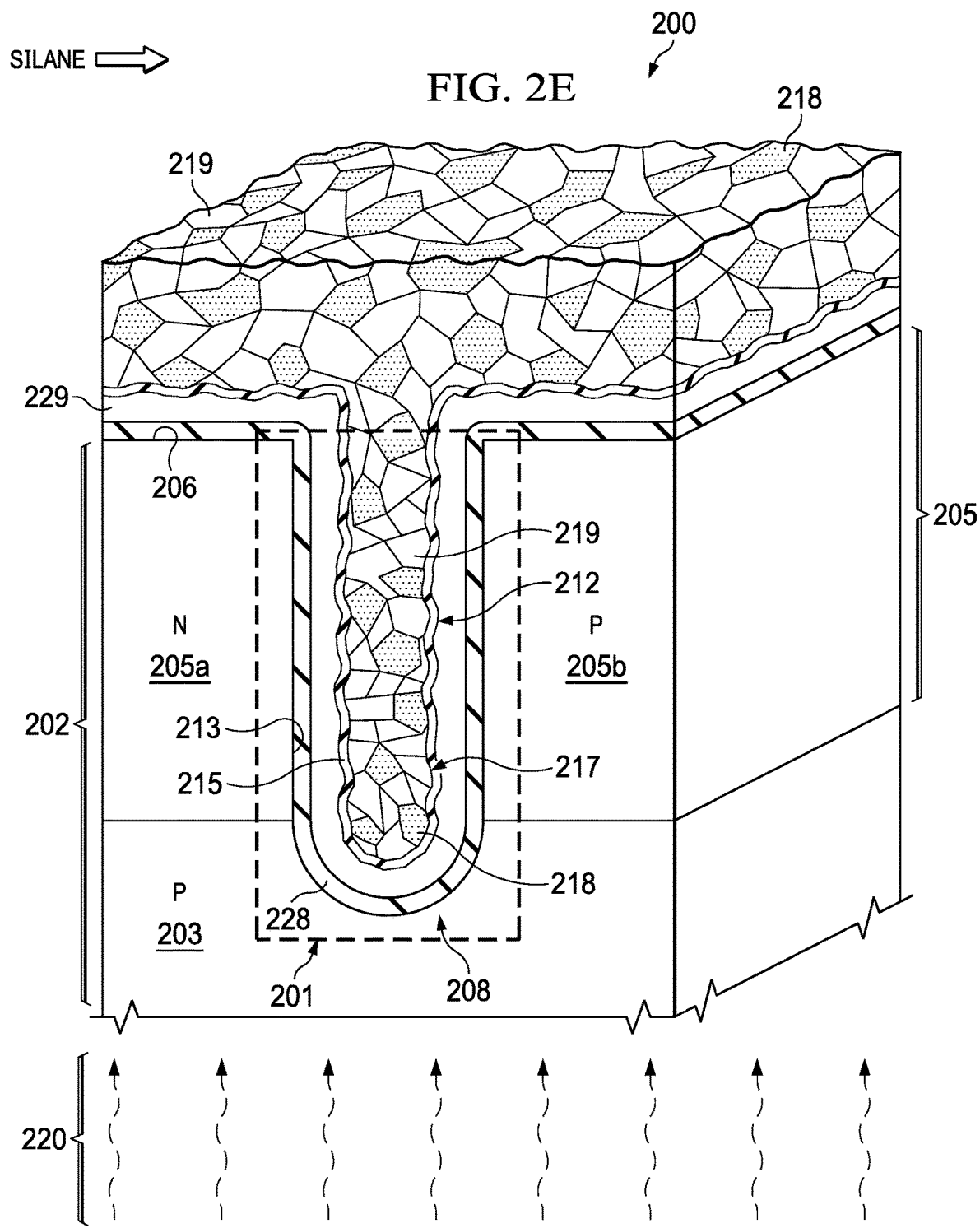

Referring to FIG. 2E, semi-amorphous polysilicon 217 is formed in the trench 208 on the amorphous dielectric material 215, filling the trench 208 inside the seed layer 212. The semi-amorphous polysilicon 217 includes amorphous silicon regions 218 constituting 20 weight percent to 90 weight percent of the semi-amorphous polysilicon 217, separated by polycrystalline silicon 219. The semi-amorphous polysilicon 217 may extend over the top surface 206 of the substrate 202. The semi-amorphous polysilicon 217 may be formed by thermal decomposition of a silicon reagent gas, such as silane. The substrate 202 may be heated to a temperature of 555° C. to 580° C. by a substrate heating process 220 such as a heated wafer chuck. The silicon reagent gas, denoted in FIG. 2E as "SILANE", is flowed over the substrate 202 at a pressure of 100 millitorr to 250 millitorr, and thermally decomposes, to form the semi-amorphous polysilicon 217. Filling the trench 208 inside the seed layer 212 with the semi-amorphous polysilicon 217 may advantageously reduce seam and void formation in the trench structure 201, as described in reference to the example of FIG. 1A through FIG. 1E.

Figure 2F:
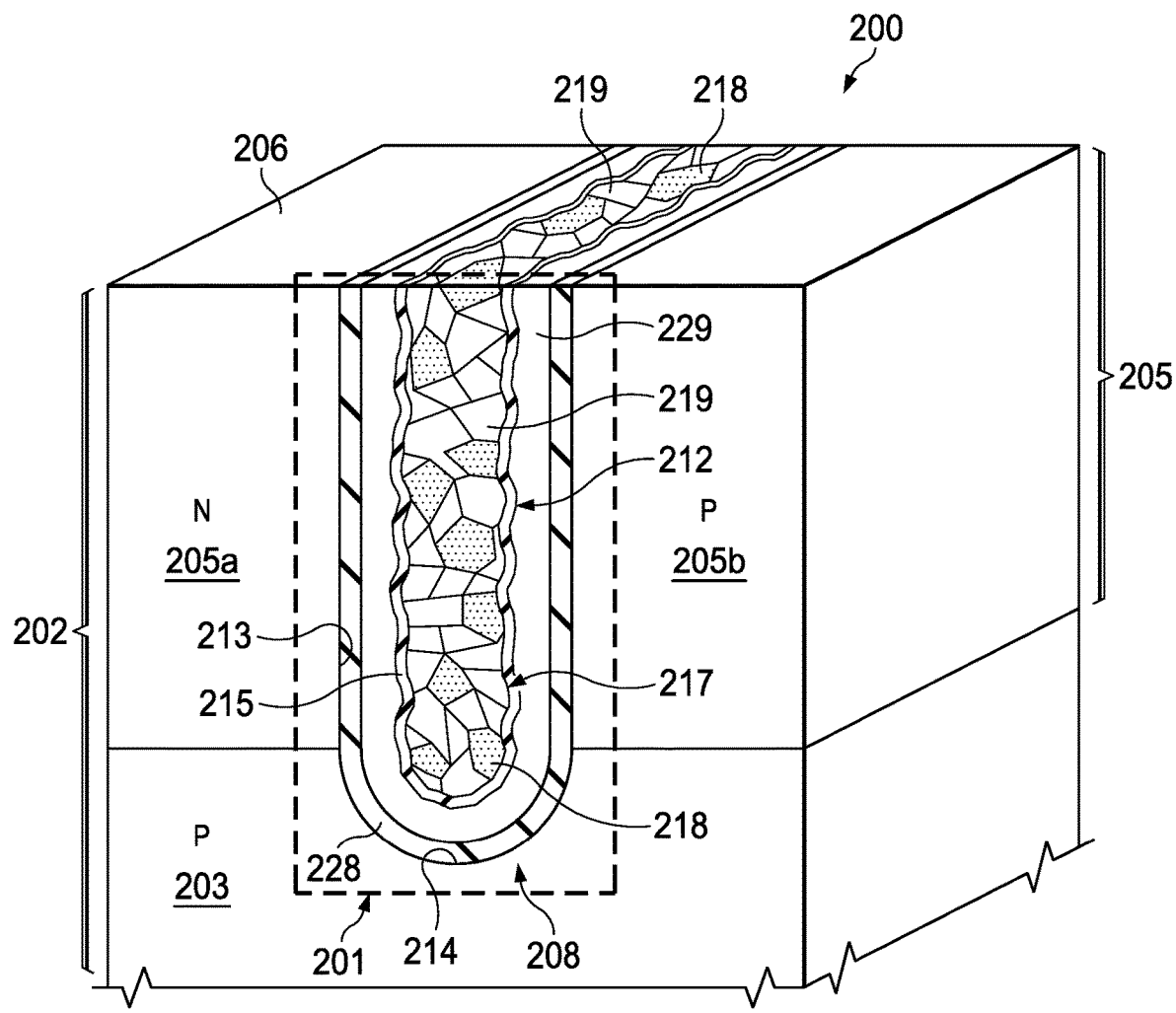

Referring to FIG. 2F, the semi-amorphous polysilicon 217, the seed layer 212, and the polysilicon outer layer 229 are removed from over the top surface 206 of the substrate 202, leaving the semi-amorphous polysilicon 217, the seed layer 212, and the polysilicon outer layer 229 in the trench 208. The semi-amorphous polysilicon 217, the seed layer 212, and the polysilicon outer layer 229 may be removed by a CMP process, or a sequence of a first plasma etch process to remove the semi-amorphous polysilicon 217, a wet etch process to remove the seed layer 212, and a second plasma etch process to remove the polysilicon outer layer 229. The semi-amorphous polysilicon 217, the seed layer 212, and the polysilicon outer layer 229 in the trench 208 may extend to the top surface 206, as depicted in FIG. 2F, or may be recessed below the top surface 206.

Figure 2G:
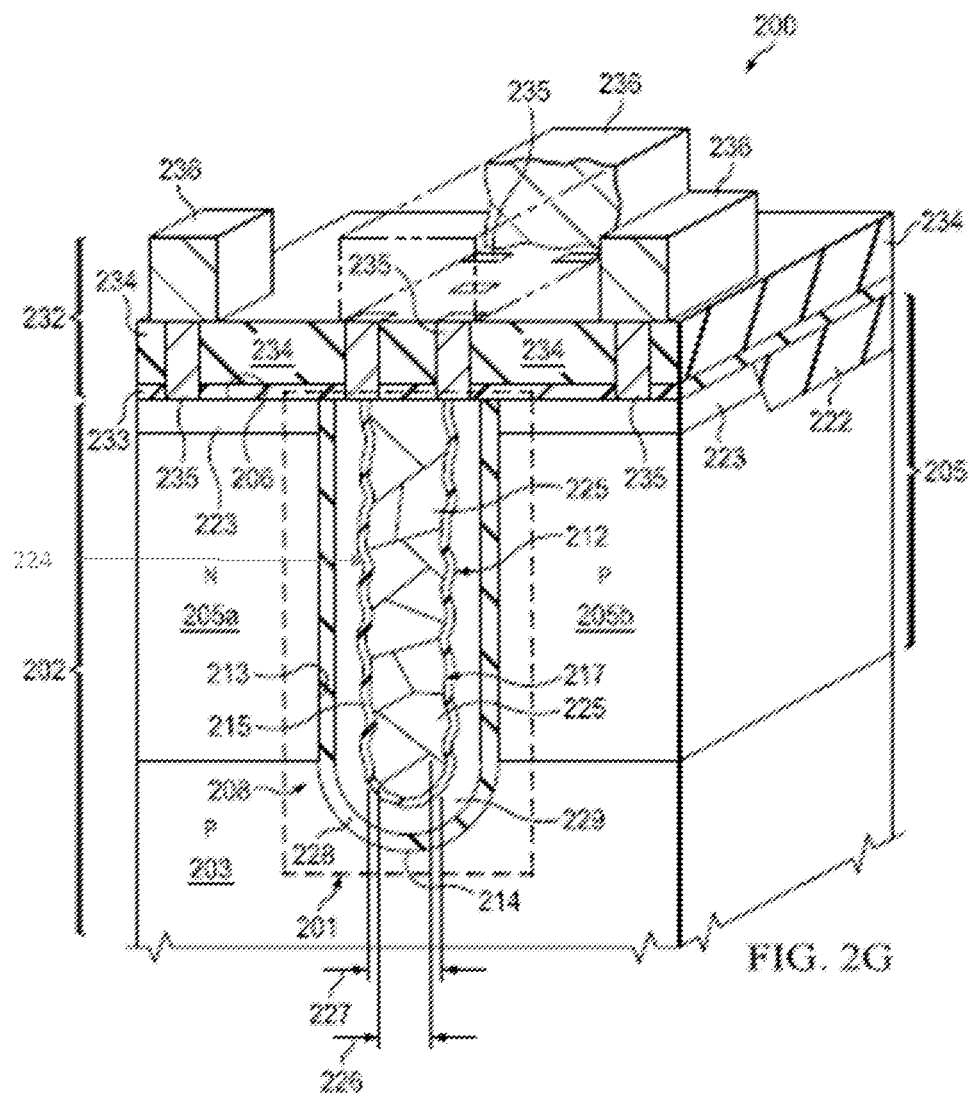

Referring to FIG. 2G, field oxide 222 and doped regions 223 may be formed in the substrate 202, as described in reference to FIG. 1E. Components, not shown in FIG. 2G, may be formed in and on the substrate 202. Thermal processes used to form the field oxide 222, doped regions 223, and components may heat the substrate 202 sufficiently to convert the semi-amorphous polysilicon 217 of FIG. 2F to a polysilicon core 224. The polysilicon core 224 is part of the trench structure 201. The polysilicon core 224 has silicon grains 225 with an average size 226 that is greater than half a minimum lateral dimension 227 inside the seed layer 212. The polysilicon core 224 may be advantageously free of seams and voids.

An interconnect region 232 may be formed over the top surface 206 of the substrate 202. A pre-metal dielectric (PMD) liner 233 of the interconnect region 232 may be formed on the top surface 206, and a PMD layer 234 of the interconnect region 232 may be formed on the PMD liner 233. The PMD liner 233 may include silicon nitride, for example, and may be formed by a low pressure chemical vapor deposition (LPCVD) process using dichlorosilane and ammonia, or by a plasma enhanced chemical vapor deposition (PECVD) process using bis (tertiary butyl amino) silane (BTBAS). The PMD layer 234 may include a silicon dioxide-based dielectric material, and may be formed by a PECVD process using tetraethoxysilane (TEOS), sometime referred to as tetraethyl orthosilicate. Contacts 235 of the interconnect region 232 may be formed through the PMD layer 234 and through the PMD liner 233 to provide electrical connections to the doped regions 223, and to the polysilicon outer layer 229 and the polysilicon core 224 of the trench structure 201. The contacts 235 may include tungsten, and may be formed by etching contact holes through the PMD layer 234 and through the PMD liner 233, followed by forming a titanium-containing liner by a sputter process, and forming a tungsten core on the titanium-containing liner by a metal organic chemical vapor deposition (MOCVD) process using tungsten hexafluoride. Interconnect lines 236 of the interconnect region 232 may be formed on the PMD layer 234 to provide electrical connections to the contacts 235. The interconnect lines 236 may include aluminum, and may be formed by sputtering an aluminum layer onto the PMD layer 234, followed by forming a metal etch mask over the aluminum layer by a photolithographic process, and removing the aluminum layer where exposed by the metal etch mask. Alternatively, the interconnect lines 236 may include copper, and may be formed by a damascene process, in which an intra-metal dielectric (IMD) layer, not shown, is formed on the PMD layer 234, interconnect trenches are etched into the IMD layer, a conductive liner is formed in the trenches, making electrical connections to the contacts 235, copper is deposited on the conductive liner, and excess copper is removed by a copper CMP process. Thus, the polysilicon outer layer 229 and the polysilicon core 224 of the trench structure 201 may be biased to a desired potential, so that charge accumulation in the trench structure 201 may be managed.

Figure 3A:
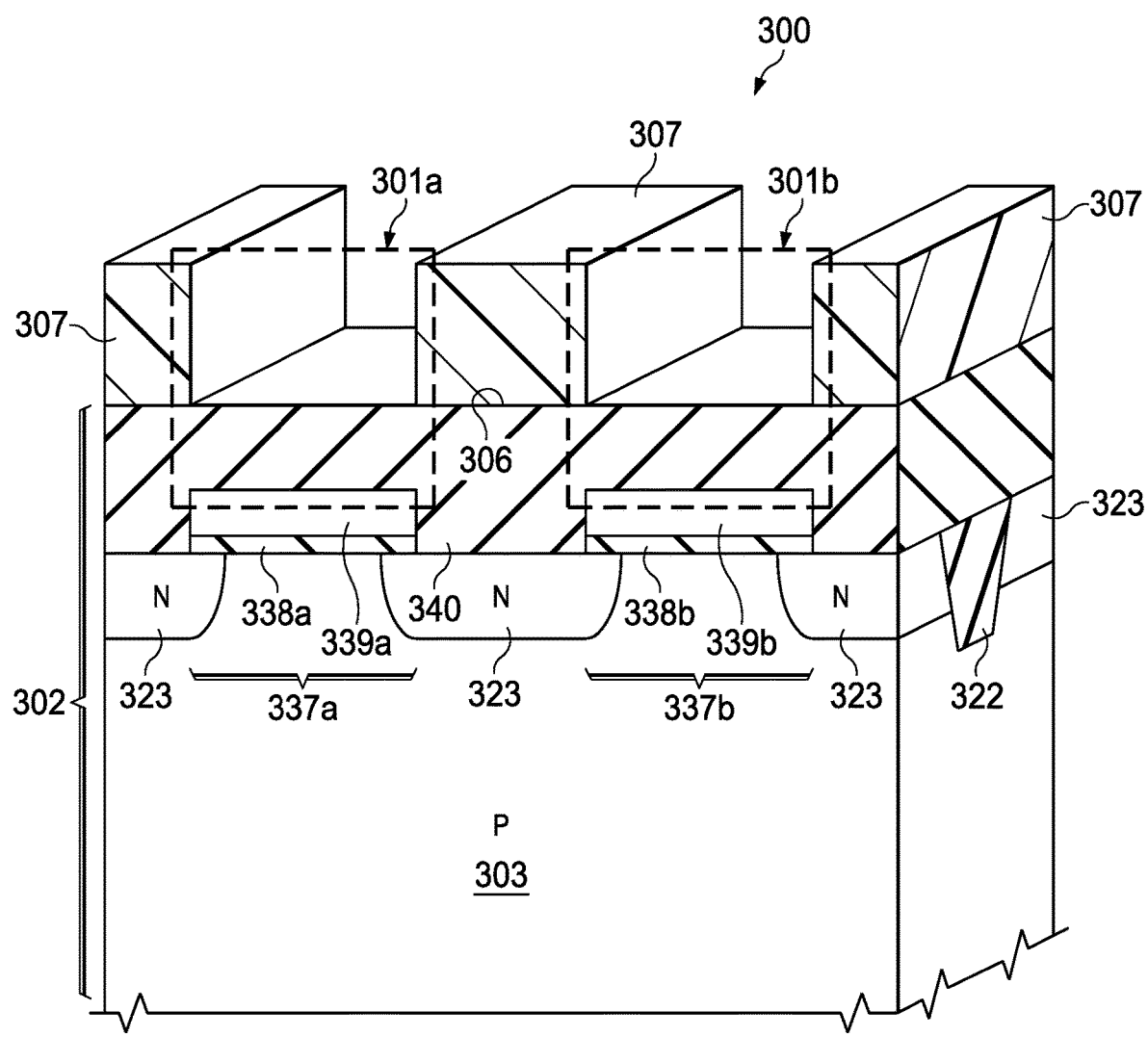

FIG. 3A through FIG. 3H are cross sections of a further microelectronic device 300 including a first trench structure 301a and a second trench structure 301b, depicted in successive stages of a further example method of formation. Referring to FIG. 3A, the microelectronic device 300 is formed in and on a substrate 302. The substrate 302 includes a semiconductor material 303; in this example, the semiconductor material 303 may be p-type. Field oxide 322 is formed in the substrate 302. Doped regions 323, which are n-type in this example, are formed in the semiconductor material 303.

In this example, the microelectronic device 300 includes a first stacked gate n-channel metal oxide semiconductor (NMOS) transistor 337a and a second stacked gate NMOS transistor 337b. The stacked gate NMOS transistors 337a and 337b may be part of a non-volatile memory component, such as a NAND flash component, by way of example. The doped regions 323 provide sources and drains for the stacked gate NMOS transistors 337a and 337b. The stacked gate NMOS transistors 337a and 337b include a first tunnel dielectric layer 338a and a second tunnel dielectric layer 338b, respectively, on a top surface of the semiconductor material 303. The tunnel dielectric layers 338a and 338b may include silicon dioxide, and may be formed by thermal oxidation of silicon in the semiconductor material 303. The stacked gate NMOS transistors 337a and 337b include a first floating gate 339a and a second floating gate 339b, formed on the first tunnel dielectric layer 338a and the second tunnel dielectric layer 338b, respectively. The floating gates 339a and 339b may include polysilicon, and may be formed by thermal decomposition of silane.

An isolation dielectric layer 340 is formed over the floating gates 339a and 339b, and over the semiconductor material 303. In this example, the isolation dielectric layer 340 is part of the substrate 302. The isolation dielectric layer 340 extends to a top surface 306 of the substrate 302. The isolation dielectric layer 340 may include silicon dioxide, or silicon dioxide-based dielectric material, such as phosphosilicate glass (PSG), borophosphosilicate glass (BPSG), or organosilicate glass (OSG). The isolation dielectric layer 340 may be formed by a chemical vapor deposition (CVD) process using TEOS and ozone, a PECVD process using TEOS, or other dielectric thin film formation process.

A trench mask 307 is formed over the top surface 306 of the substrate 302, exposing the isolation dielectric layer 340 over the floating gates 339a and 339b in areas for the first trench structure 301a and the second trench structure 301b. The trench mask 307 may include photoresist, and may also include anti-reflection materials such as a bottom anti-reflection coat (BARC). The trench mask 307 may be formed by a photolithographic process.

Figure 3B:
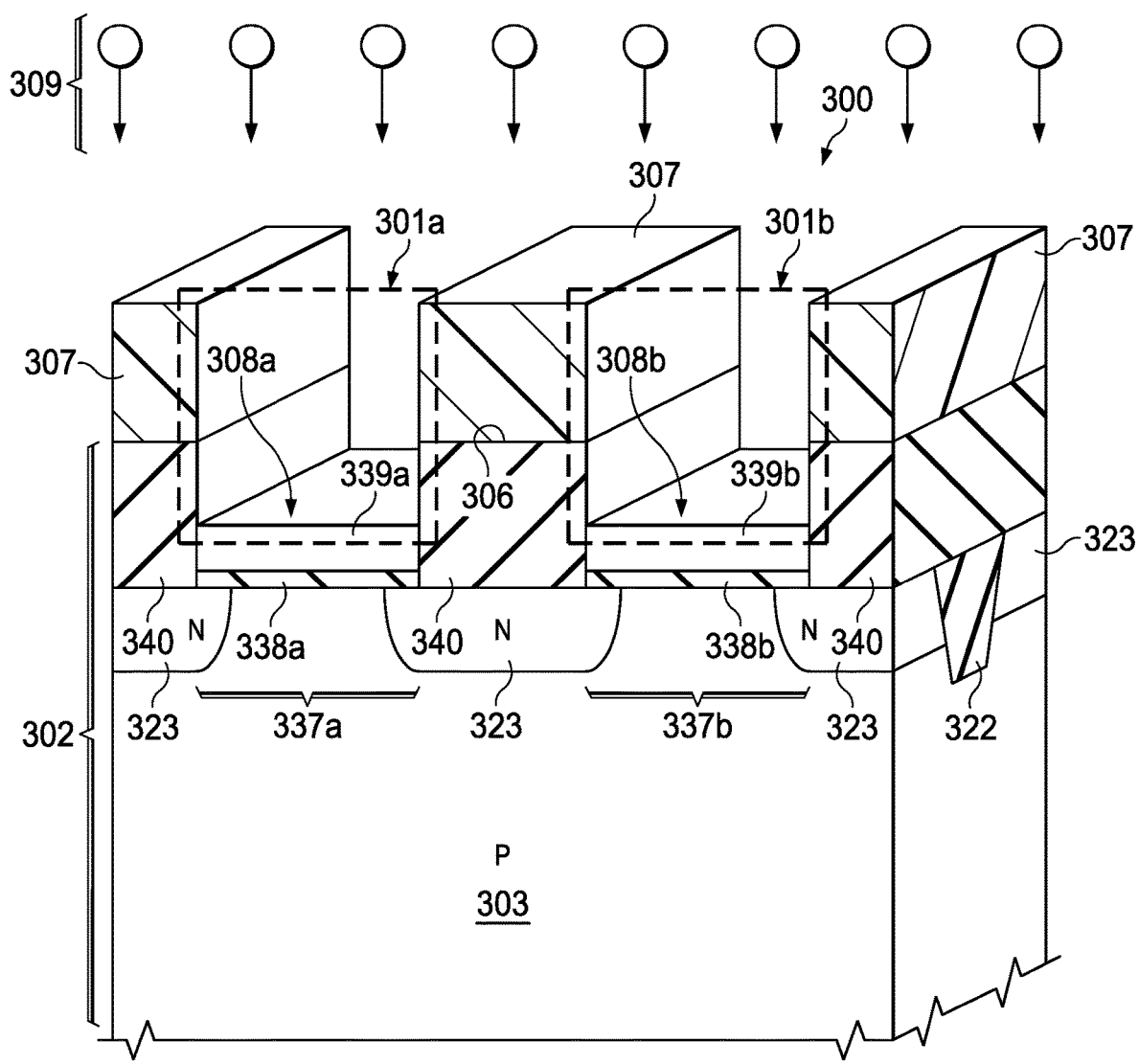

Referring to FIG. 3B, material is removed from the isolation dielectric layer 340 where exposed by the trench mask 307 to form a first trench 308a and a second trench 308b in the substrate 302. The first trench 308a and the second trench 308b extend through the isolation dielectric layer 340 to the first floating gate 339a and the second floating gate 339b, respectively. The substrate material may be removed from the substrate 302 by an RIE process using halogen radicals 309, such as fluorine. The first trench 308a is part of the first trench structure 301a, and the second trench 308b is part of the second trench structure 301b.

The trench mask 307 may be removed after the first trench 308a and the second trench 308b are formed. Photoresist and other organic material in the trench mask 307 may be removed by a plasma process using oxygen radicals, followed by a wet clean process using an aqueous mixture of hydrogen peroxide and ammonium hydroxide. Other methods of removing the trench mask 307 are within the scope of this example.

Figure 3C:
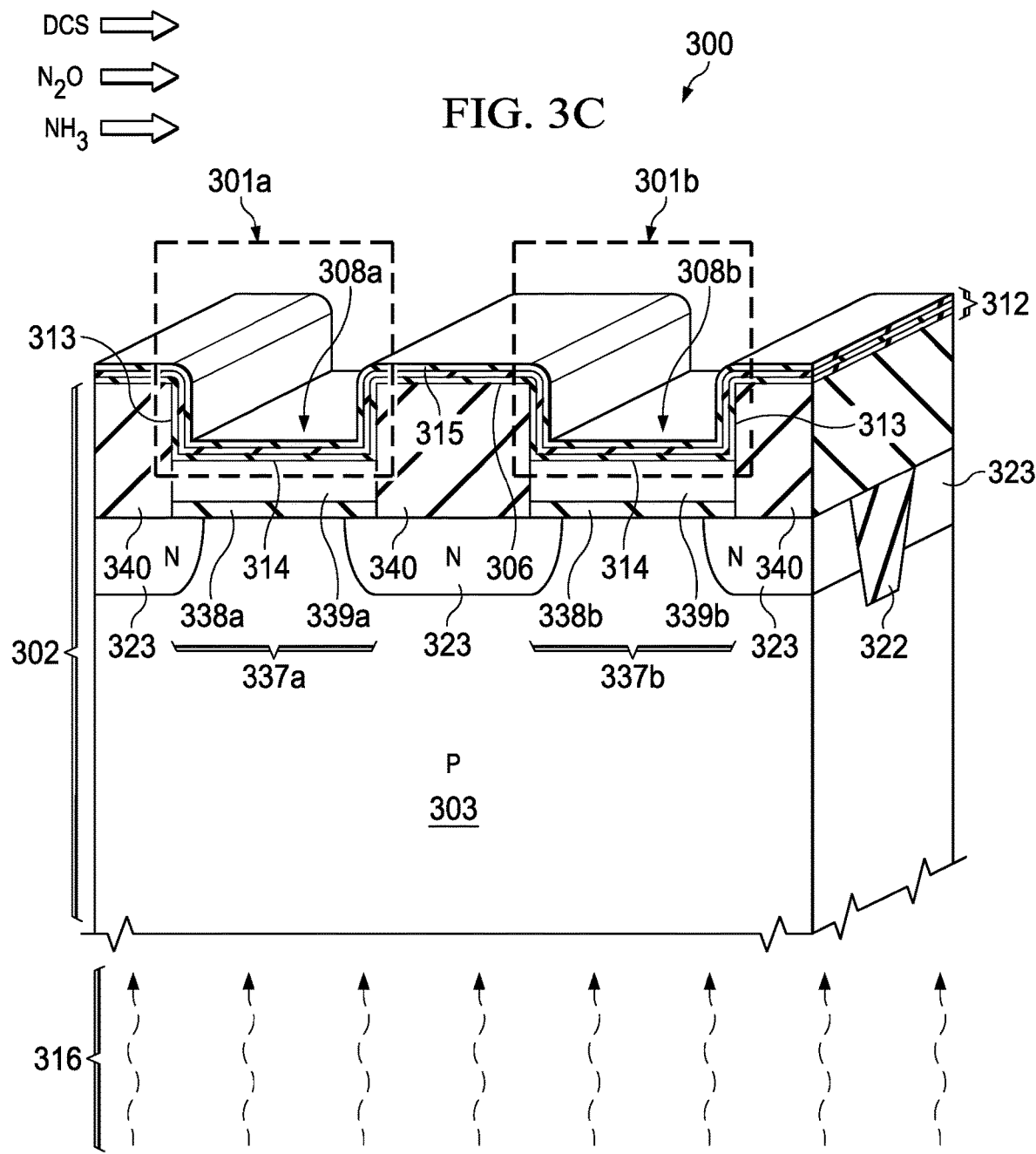

Referring to FIG. 3C, a seed layer 312 is formed in the first trench 308a and the second trench 308b, on sidewalls 313 and bottoms 314 of the first trench 308a and the second trench 308b. The seed layer 312 includes an amorphous dielectric material 315. In this example, the seed layer 312 provides a dielectric layer between the first floating gate 339a and a first control gate 341a, and between the second floating gate 339b and a second control gate 341b. The first control gate 341a and the second control gate 341b are shown in FIG. 3G. The seed layer 312 may include a first sublayer of silicon dioxide, formed by a CVD process using dichlorosilane, denoted as "DCS" in FIG. 3C, and nitrous oxide, denoted as "$N_2O$" in FIG. 3C, while the substrate 302 is heated by a first substrate heating process 316, which may be implemented as a heated substrate chuck, by way of example. Other processes for forming the first sublayer of silicon dioxide are within the scope of this example. The seed layer 312 may include a second sublayer of a nitrogen-containing dielectric material, such as silicon nitride or silicon oxynitride. The second sublayer may be formed by a CVP process using dichlorosilane and ammonia, denoted as "$NH_3$" in FIG. 3C, while the substrate 302 is heated by a first substrate heating process 316. The seed layer 312 may include a third sublayer of silicon dioxide, which may be formed by a process that is similar to the process used to form the first sublayer. In this example, the third sublayer provides the amorphous dielectric material 315.

Referring to FIG. 3D, semi-amorphous polysilicon 317 is formed in the first trench 308a and in the second trench 308b, on the amorphous dielectric material 315. The semi-amorphous polysilicon 317 includes amorphous silicon regions 318 constituting 20 weight percent to 90 weight percent of the semi-amorphous polysilicon 317, separated by polycrystalline silicon 319. The semi-amorphous polysilicon 317 fills the first trench 308a and in the second trench 308b inside the seed layer 312. In this example, the semi-amorphous polysilicon 317 may extend over the top surface 306 of the substrate 302 adjacent to the first trench 308a and the second trench 308b. The semi-amorphous polysilicon 317 may be formed by thermal decomposition of a silicon reagent gas, such as silane. The substrate 302 may be heated to a temperature of 555° C. to 580° C. by a second substrate heating process 320, which may be implemented as another heated wafer chuck, by way of example. The silicon reagent gas, denoted in FIG. 3D as "SILANE", is flowed over the substrate 302 at a pressure of 100 millitorr to 250 millitorr, and thermally decomposes, to form the semi-amorphous polysilicon 317. Filling the first trench 308a and the second trench 308b inside the seed layer 312 with the semi-amorphous polysilicon 317 may advantageously reduce seam and void formation in the first trench structure 301a and the second trench structure 301b, as described in reference to the example of FIG. 1A through FIG. 1E.

Figure 3E:
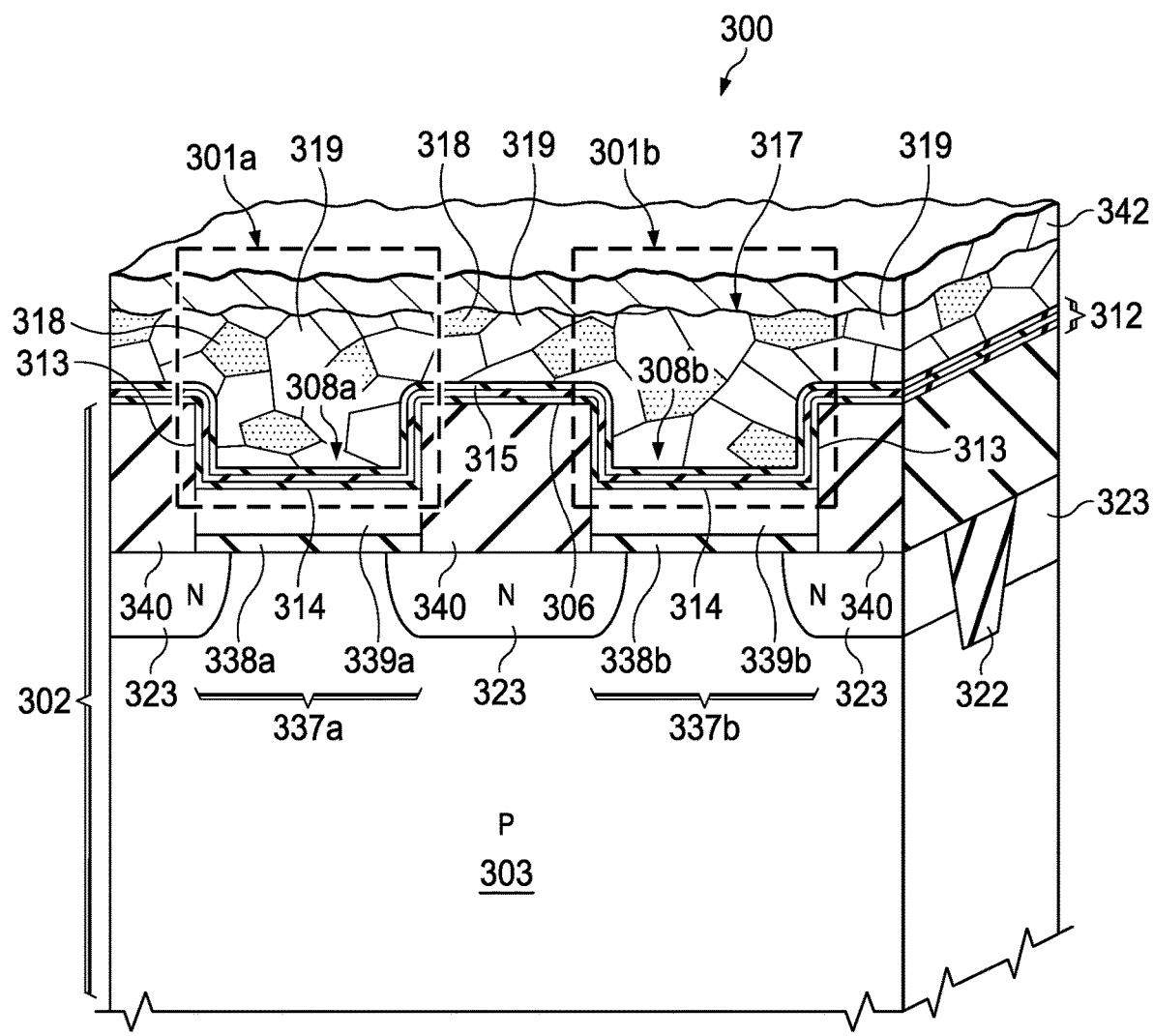

Referring to FIG. 3E, metal silicide 342 may be formed on the semi-amorphous polysilicon 317. The metal silicide 342 may include tungsten silicide, by way of example, and may be formed by a sputtering process. Other compositions for the metal silicide 342, and other processes for forming the metal silicide 342, are within the scope of this example. The metal silicide 342 may advantageously provide a reduced electrical resistance for the control gates 341a and 341b of FIG. 3G.

Figure 3F:
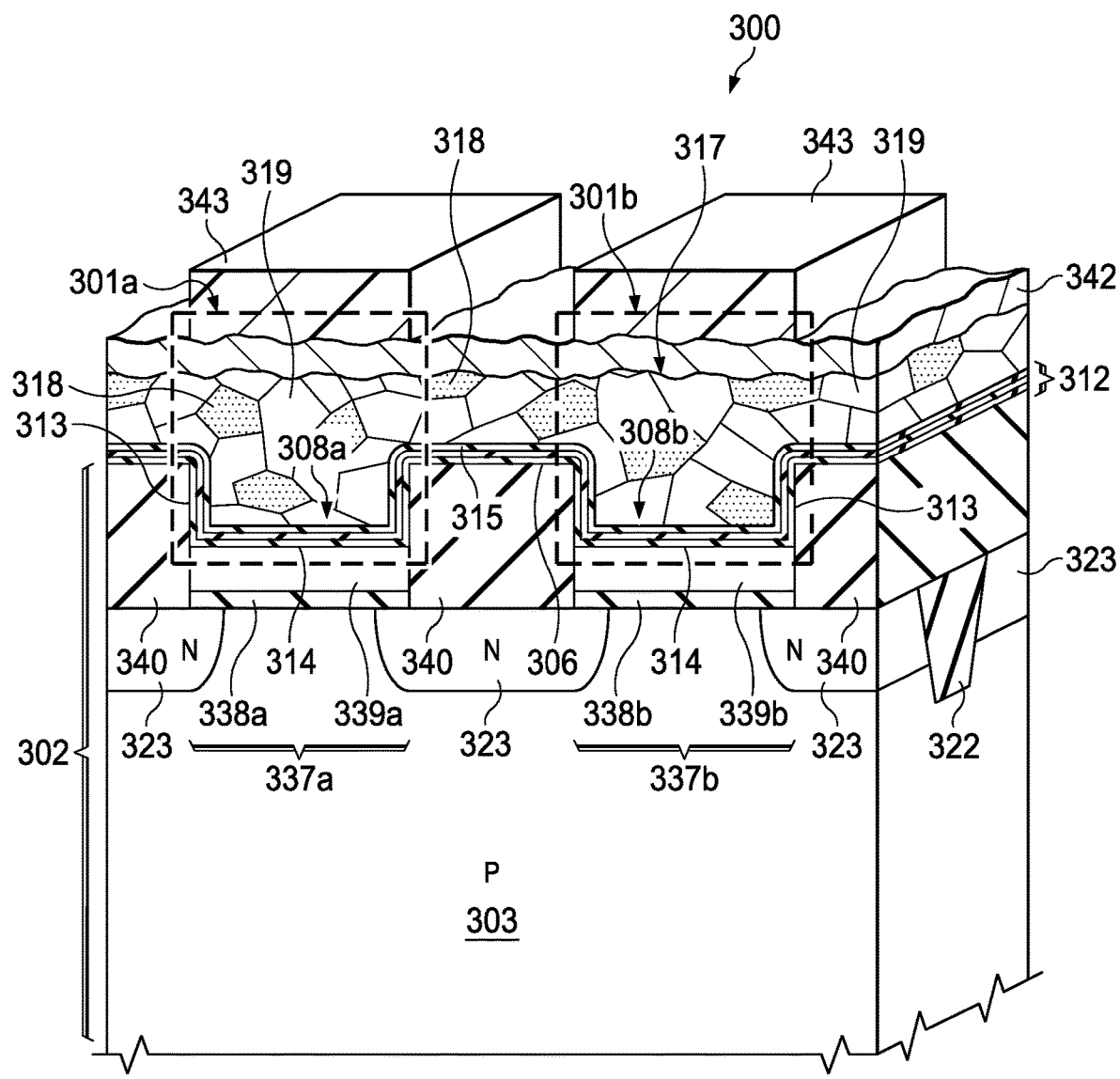
Figure 3G:
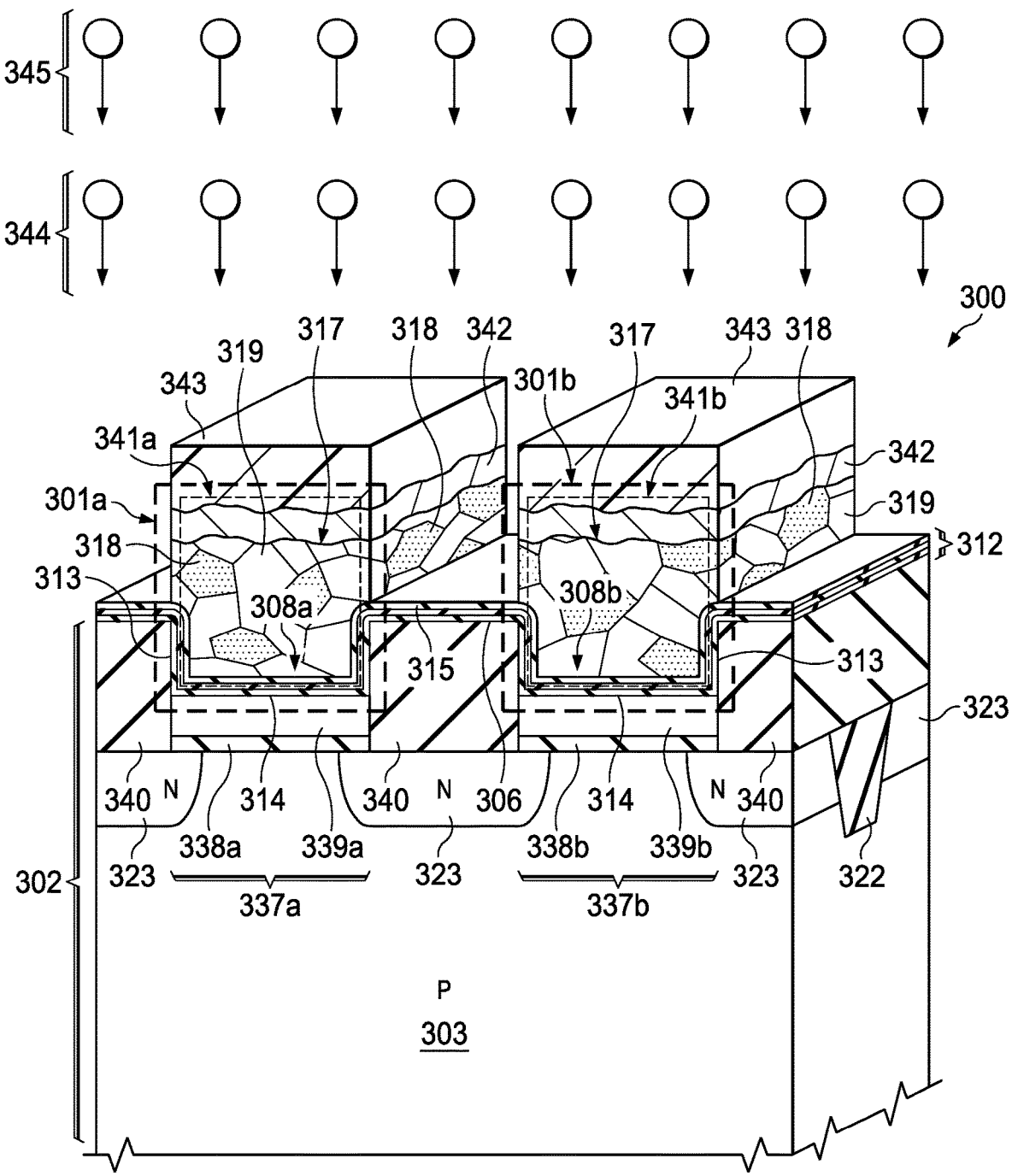

Referring to FIG. 3F, a control gate mask 343 is formed over the metal silicide 342, covering areas for the first control gate 341a and the second control gate 341b. The first control gate 341a and the second control gate 341b are shown in FIG. 3G. The control gate mask 343 may include photoresist, formed by a photolithographic process. The control gate mask 343 may also include an anti-reflection material, such as a BARC, and may further include a hard mask material, such as silicon dioxide.

Referring to FIG. 3G, the metal silicide 342 and the semi-amorphous polysilicon 317 are removed where exposed by the control gate mask 343. The metal silicide 342 and the semi-amorphous polysilicon 317 may be removed by a two-step RIE process which first removes the metal silicide 342 in a first step, and then removes the semi-amorphous polysilicon 317 in a second step. The metal silicide 342 may be removed using a first set of halogens 344, including fluorine and chlorine, and optionally, bromine. The semi-amorphous polysilicon 317 may be removed using a second set of halogens 345, including fluorine. The metal silicide 342 and the semi-amorphous polysilicon 317 of the first trench structure 301a provide the first control gate 341a of the first stacked gate NMOS transistor 337a. The metal silicide 342 and the semi-amorphous polysilicon 317 of the second trench structure 301b provide the second control gate 341b of the second stacked gate NMOS transistor 337b.

The control gate mask 343 is removed after the first control gate 341a and the second control gate 341b are formed. Photoresist and anti-reflection materials in the control gate mask 343 may be removed by a plasma process using oxygen radicals. Hard mask materials in the control gate mask 343 may be removed by a plasma process using fluorine radicals and carbon radicals. Alternatively, the hard mask materials my optionally be left in place.

Figure 3H:
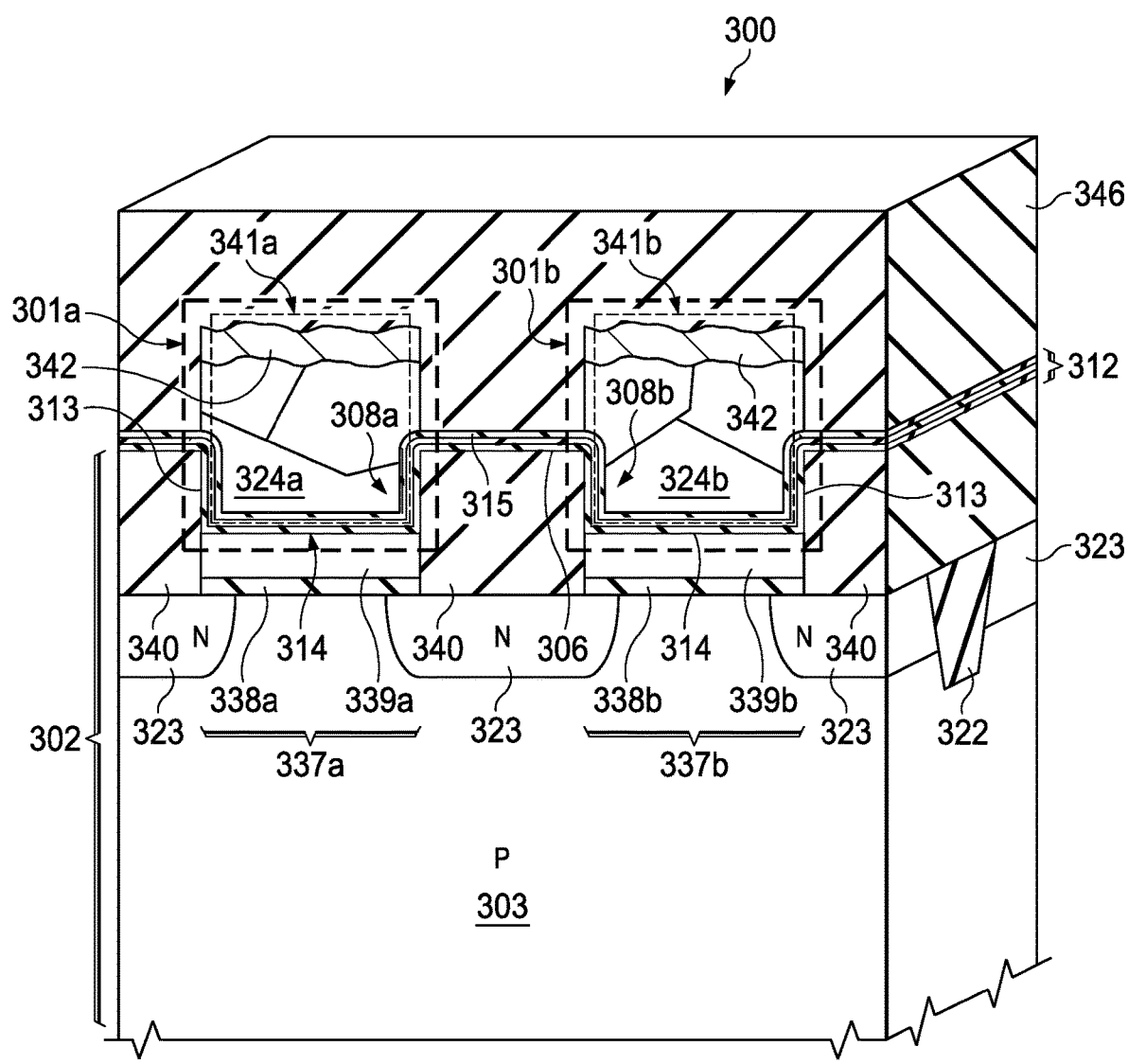

Referring to FIG. 3H, an inter-level dielectric (ILD) layer 346 may be formed over the first control gate 341a and the second control gate 341b, and over the isolation dielectric layer 340 adjacent to the control gates 341a and 341b. Further fabrication process to form the microelectronic device 300 may include thermal processes which convert the semi-amorphous polysilicon 317 of FIG. 3F to a first polysilicon core 324a in the first trench 308a, and a second polysilicon core 324b in the second trench 308b, as disclosed in reference to FIG. 1E. The first polysilicon core 324a is part of the first trench structure 301a, and the second polysilicon core 324b is part of the second trench structure 301b. The polysilicon cores 324a and 324b have silicon grains with an average size that is greater than half of minimum lateral dimensions inside the seed layer 312, as disclosed in reference to FIG. 1E.

Figure 4A:
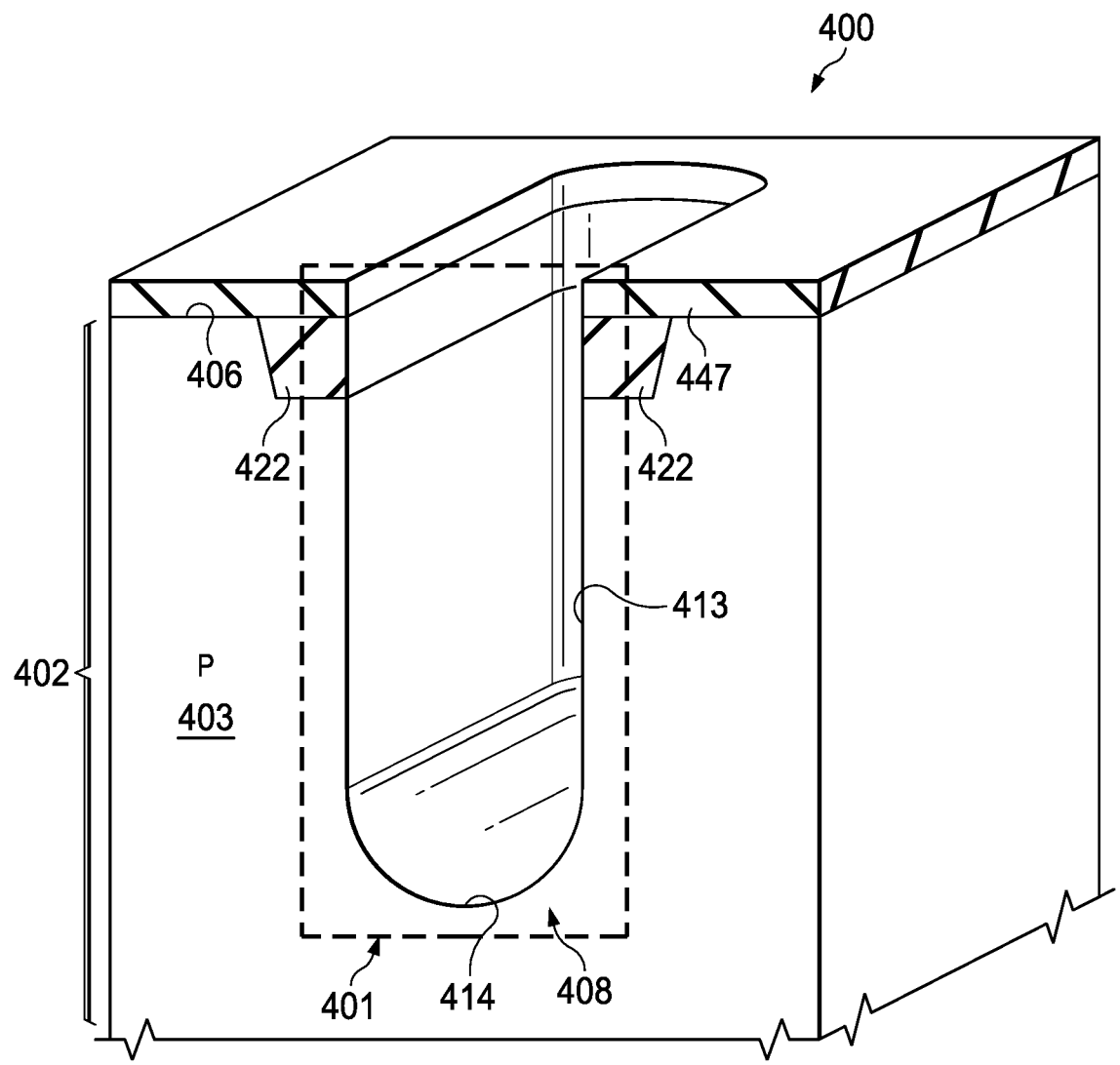

FIG. 4A through FIG. 4H are cross sections of another microelectronic device 400 including a trench structure 401, depicted in successive stages of another example method of formation. Referring to FIG. 4A, the microelectronic device 400 is formed in and on a substrate 402. In this example, the substrate 402 may include a semiconductor material 403 extending to a top surface 406 of the substrate 402. The semiconductor material 403 may be implemented as p-type silicon, by way of example. Field oxide 422 may be formed in the substrate 402, as described in reference to FIG. 1E. A protective dielectric layer 447 may be formed over the top surface 406 of the substrate 402. The protective dielectric layer 447, sometimes referred to as a pad oxide layer, may be formed by a thermal oxidation process, and may have a thickness of 5 nanometers to 20 nanometers.

A trench 408 is formed through the protective dielectric layer 447 and the field oxide 422, and into the substrate 402, extending into the semiconductor material 403. The trench 408 is part of the trench structure 401. The semiconductor material 403 contacts the trench 408 along sidewalls 413 of the trench 408 and at a bottom 414 of the trench 408. The trench 408 may be formed by forming a trench mask, not shown in FIG. 4A, over the protective dielectric layer 447, and removing material from the protective dielectric layer 447, the field oxide 422, and the semiconductor material 403, where exposed by the trench mask, for example, as disclosed in reference to FIG. 1B. Other processes for forming the trench 408, such as microelectromachining, are within the scope of this example.

Figure 4B:
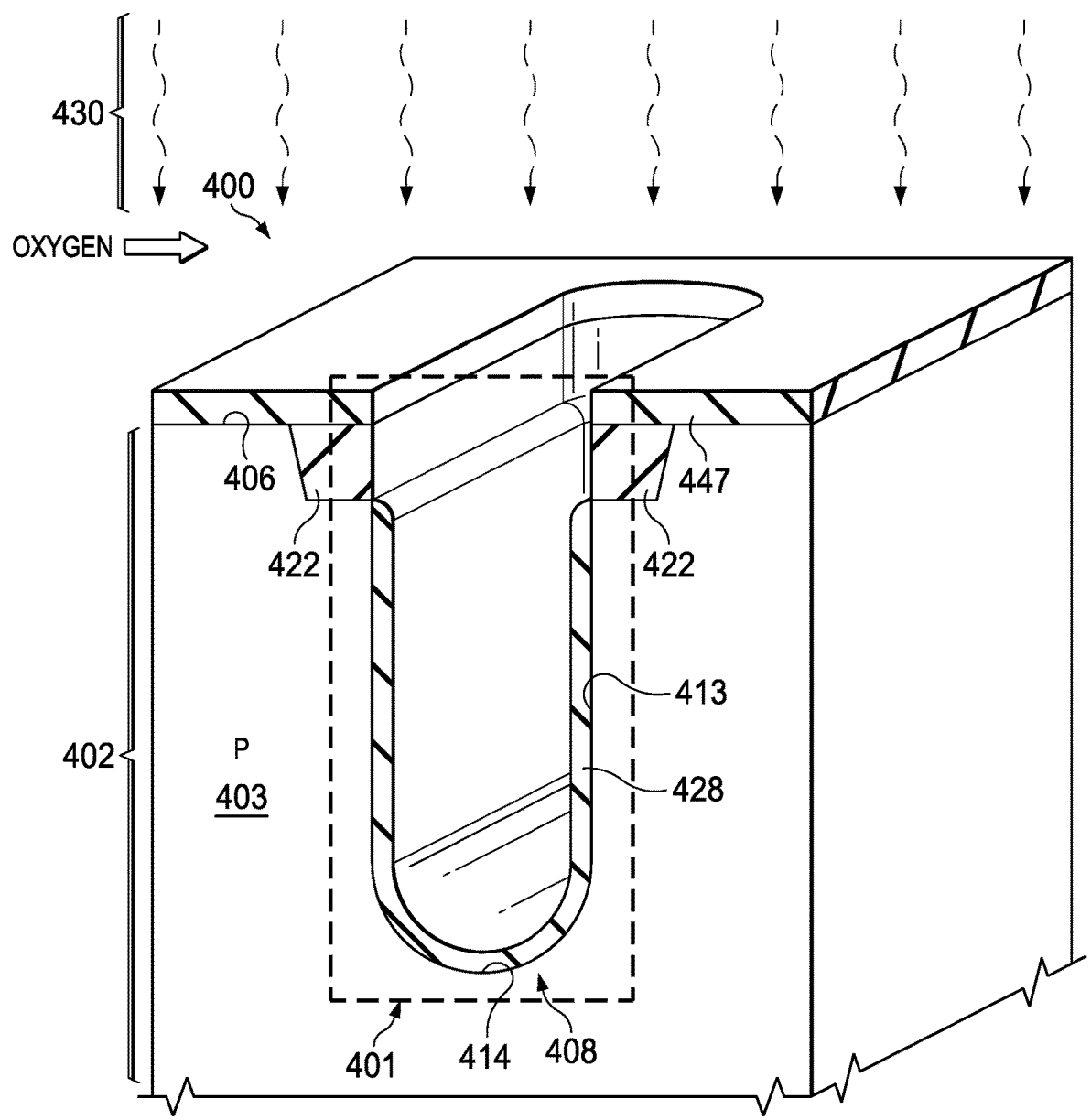

Referring to FIG. 4B, a trench liner 428 is formed in the trench 408, on sidewalls 413 and a bottom 414 of the trench 408. In this example, the trench liner 428 may be formed by a thermal oxidation process using a first furnace heating process 430 and exposing the substrate 402 to oxygen, denoted as "OXYGEN" in FIG. 4B, to thermally oxidize silicon in the substrate 402 exposed by the trench 408. The trench liner 428 of this example is electrically non-conductive. Other methods of forming the trench liner 428, such as a CVD process, are within the scope of this example.

Figure 4C:
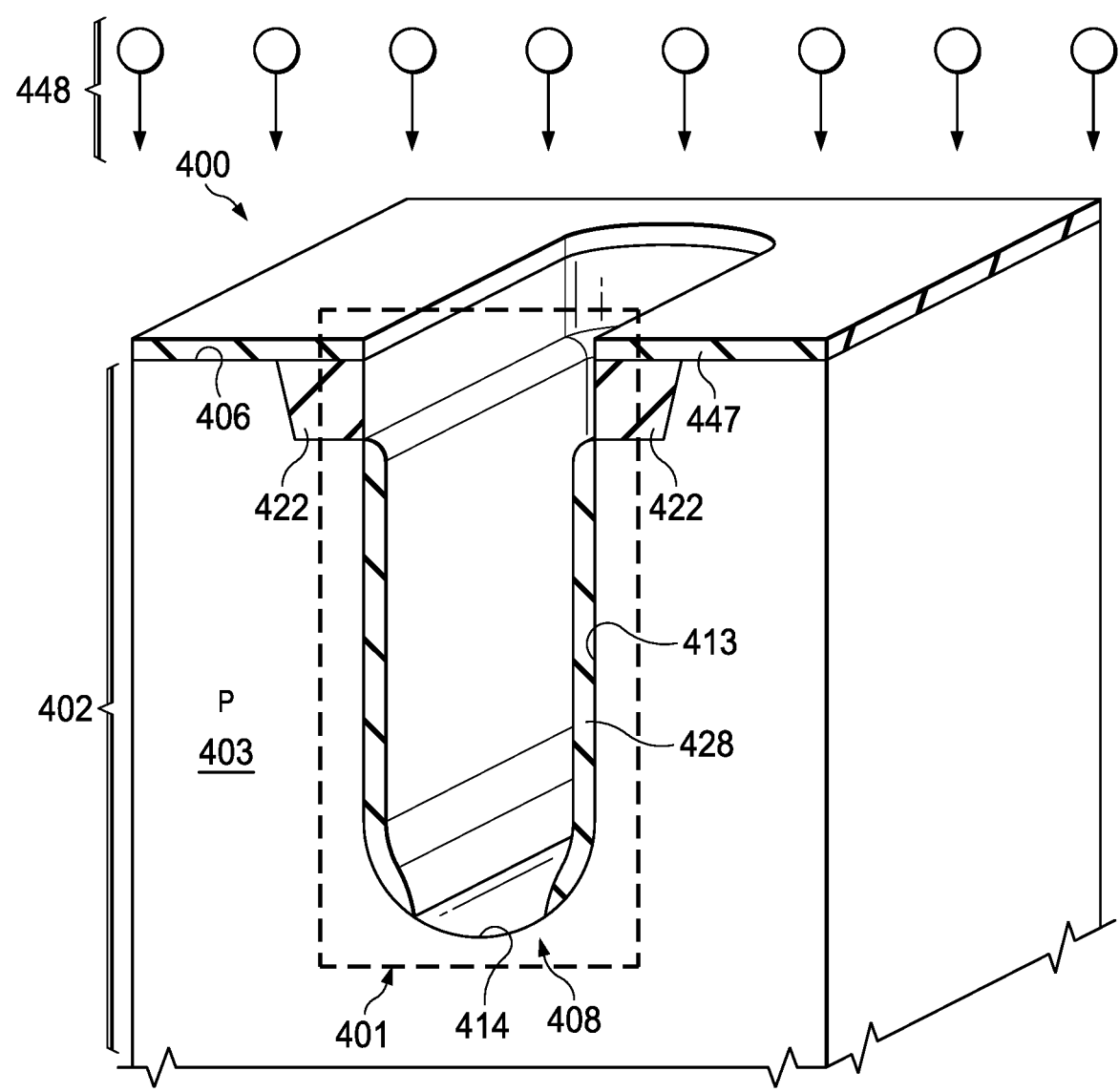

Referring to FIG. 4C, the trench liner 428 is removed at the bottom 414 of the trench 408, exposing the semiconductor material 403 below the trench 408. The trench liner 428 may be removed at the bottom 414 of the trench 408 by an RIE process using halogens 448 such as fluorine, and optionally carbon radicals to react with oxygen from the trench liner 428. At least a portion of the trench liner 428 is left in place on the sidewalls 413 of the trench 408. A portion of the protective dielectric layer 447 may be removed when the trench liner 428 is removed at the bottom 414 of the trench 408.

Figure 4D:
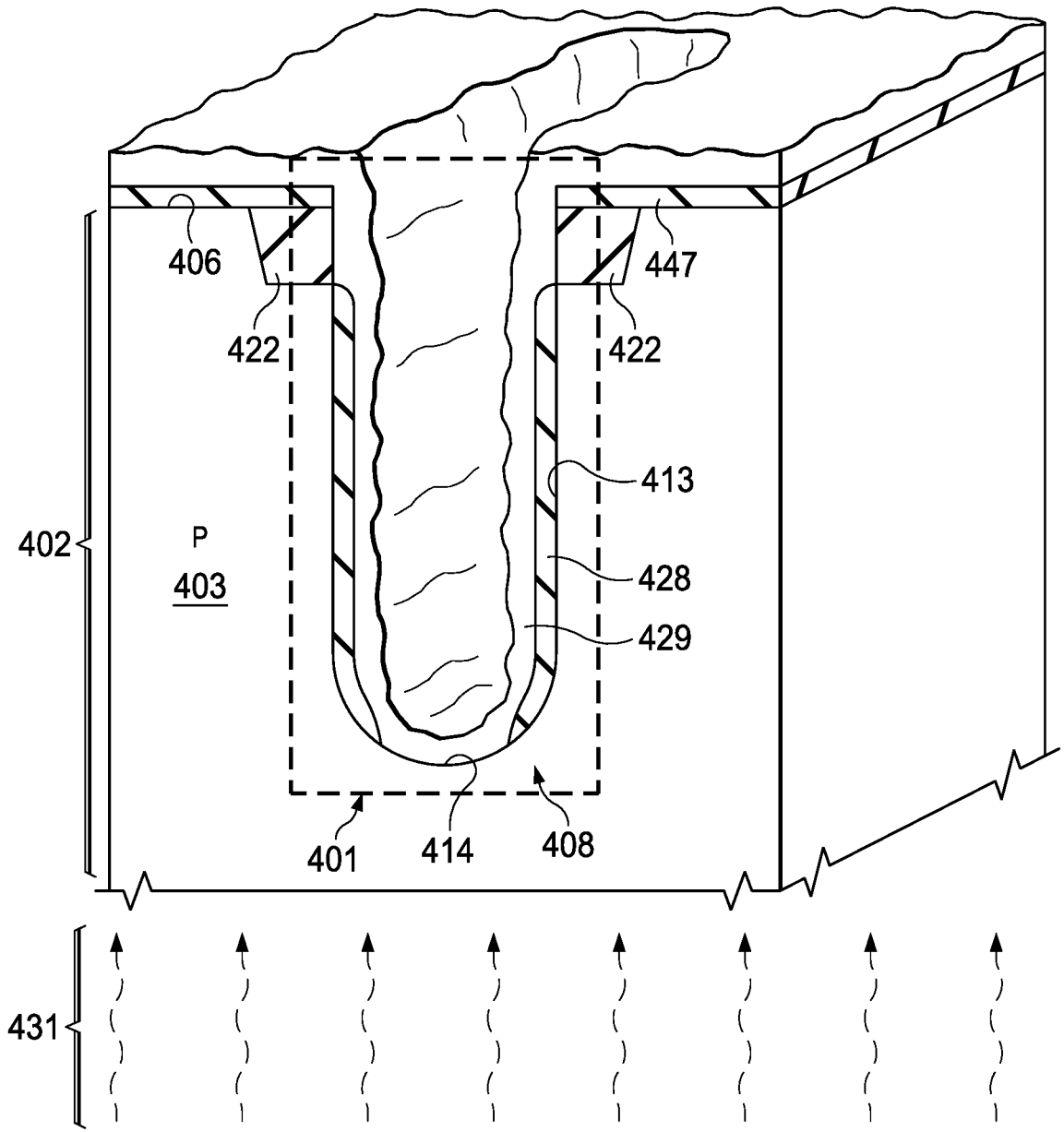

Referring to FIG. 4D, a polysilicon outer layer 429 is formed in the trench 408 on the trench liner 428 and contacting the semiconductor material 403 at the bottom 414 of the trench 408. The polysilicon outer layer 429 may be formed by thermal decomposition of silane, denoted as "SILANE" in FIG. 4D, in a chemical vapor deposition process which heats the substrate 402 by a first substrate heating process 431, for example as described in reference to FIG. 2C. The first substrate heating process 431 may heat the substrate 402 to a temperature of 610° C. to 630° C., to maximize a deposition rate of the polysilicon outer layer 429. The polysilicon outer layer 429 may be doped to have a same conductivity type as the semiconductor material 403, which is p-type, in this example. The polysilicon outer layer 429 may be doped by adding a boron-containing gas reagent such as borane with the silane when forming the polysilicon outer layer 429. The polysilicon outer layer 429 may be essentially free of amorphous silicon regions. The polysilicon outer layer 429 may extend over the top surface 406 of the substrate 402 on the protective dielectric layer 447, as depicted in FIG. 4D.

Referring to FIG. 4E, a seed layer 412 is formed in the trench 408, on the polysilicon outer layer 429. In this example, the seed layer 412 may provide electrical isolation between the polysilicon outer layer 429 and a subsequently-formed semi-amorphous polysilicon 417, shown in FIG. 4F. The seed layer 412 may include a first sublayer of silicon dioxide, a second sublayer of a nitrogen-containing dielectric material, such as silicon nitride or silicon oxynitride, and a third sublayer of silicon dioxide. The third sublayer provides an amorphous dielectric material 415 of the seed layer 412, suitable for formation of the semi-amorphous polysilicon 417. The first sublayer, the second sublayer, and the third sublayer may be formed by CVD processes using dichlorosilane, denoted as "DCS" in FIG. 4E, nitrous oxide, denoted as "$N_2O$" in FIG. 4E, and ammonia, denoted as "$NH_3$" in FIG. 4E, while the substrate 402 is heated by a first substrate heating process 416. Other compositions and methods of forming the seed layer 412 and the amorphous dielectric material 415, such as thermal oxidation of silicon in the polysilicon outer layer 429, are within the scope of this example. In this example, the seed layer 412 may have a thickness of 20 nanometers to 200 nanometers, to provide electrical isolation between the polysilicon outer layer 429 and the subsequently-formed semi-amorphous polysilicon 417.

Referring to FIG. 4F, semi-amorphous polysilicon 417 is formed in the trench 408 on the amorphous dielectric material 415, filling the trench 408 inside the seed layer 412. The semi-amorphous polysilicon 417 includes amorphous silicon regions 418 constituting 20 weight percent to 90 weight percent of the semi-amorphous polysilicon 417, separated by polycrystalline silicon 419. The semi-amorphous polysilicon 417 may extend over the top surface 406 of the substrate 402. To form the semi-amorphous polysilicon 417, the substrate 402 may be heated to a temperature of 555° C. to 580° C. by a substrate heating process 420. A silicon reagent gas, denoted in FIG. 4F as "SILANE", is flowed over the substrate 402 at a pressure of 100 millitorr to 250 millitorr, and thermally decomposes, to form the semi-amorphous polysilicon 417. In this example, the semi-amorphous polysilicon 417 is electrically isolated from the polysilicon outer layer 429 in the trench 408 by the seed layer 412. Filling the trench 408 inside the seed layer 412 with the semi-amorphous polysilicon 417 may advantageously reduce seam and void formation in the trench structure 401, as described in reference to the example of FIG. 1A through FIG. 1E.

Figure 4G:
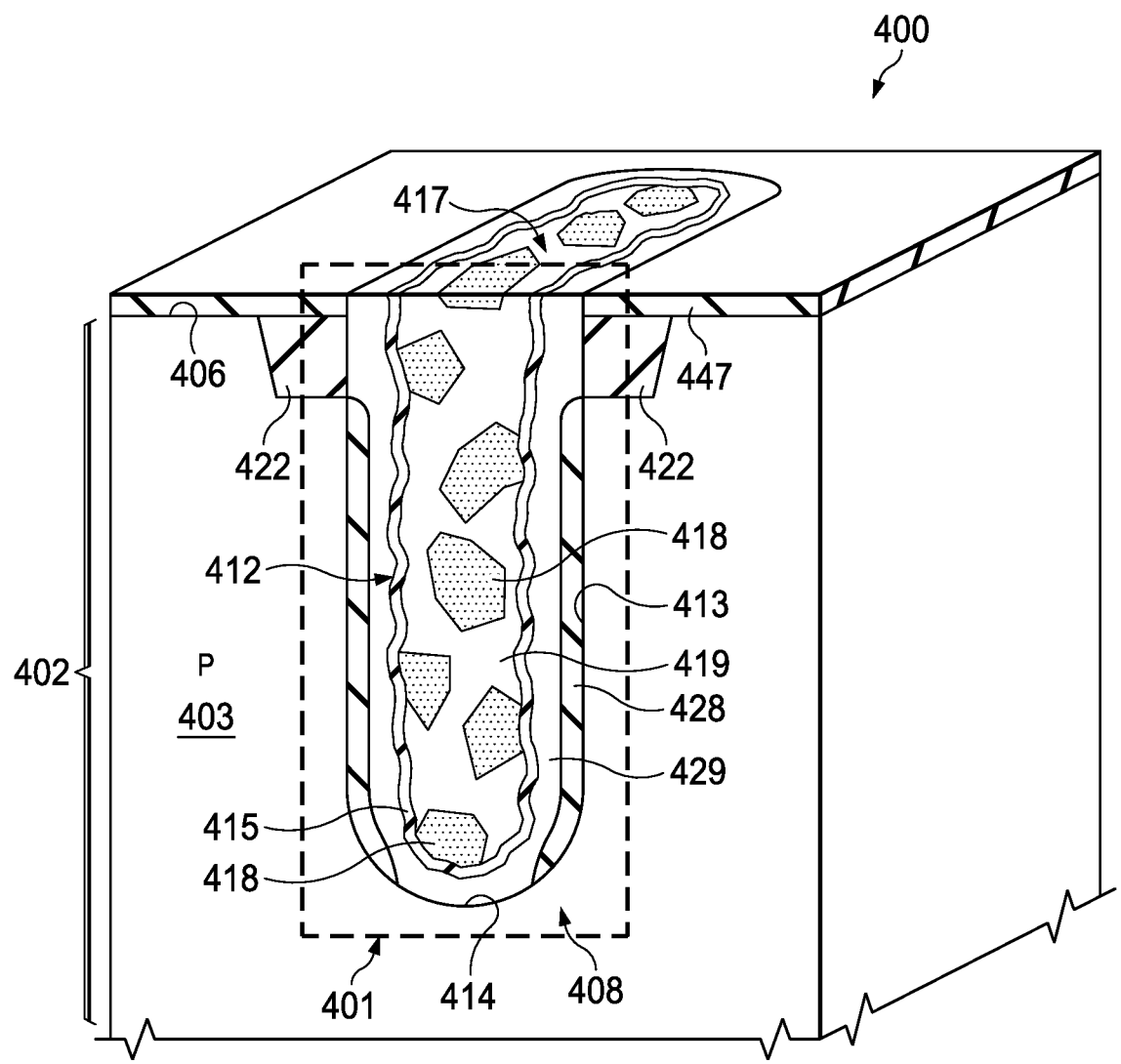

Referring to FIG. 4G, the semi-amorphous polysilicon 417, the seed layer 412, and the polysilicon outer layer 429 are removed from over the top surface 406 of the substrate 402, leaving the semi-amorphous polysilicon 417, the seed layer 412, and the polysilicon outer layer 429 in the trench 408. The semi-amorphous polysilicon 417, the seed layer 412, and the polysilicon outer layer 429 may be removed by a CMP process, or a sequence of a first plasma etch process to remove the semi-amorphous polysilicon 417, a second plasma process or series of processes to remove the seed layer 412, and a third plasma etch process to remove the polysilicon outer layer 429. In this example, the semi-amorphous polysilicon 417, the seed layer 412, and the polysilicon outer layer 429 are removed so that the semi-amorphous polysilicon 417 remains electrically isolated from the polysilicon outer layer 429 in the trench 408 by the seed layer 412. The protective dielectric layer 447 may be subsequently removed before continuing with fabrication of the microelectronic device 400.

Figure 4H:
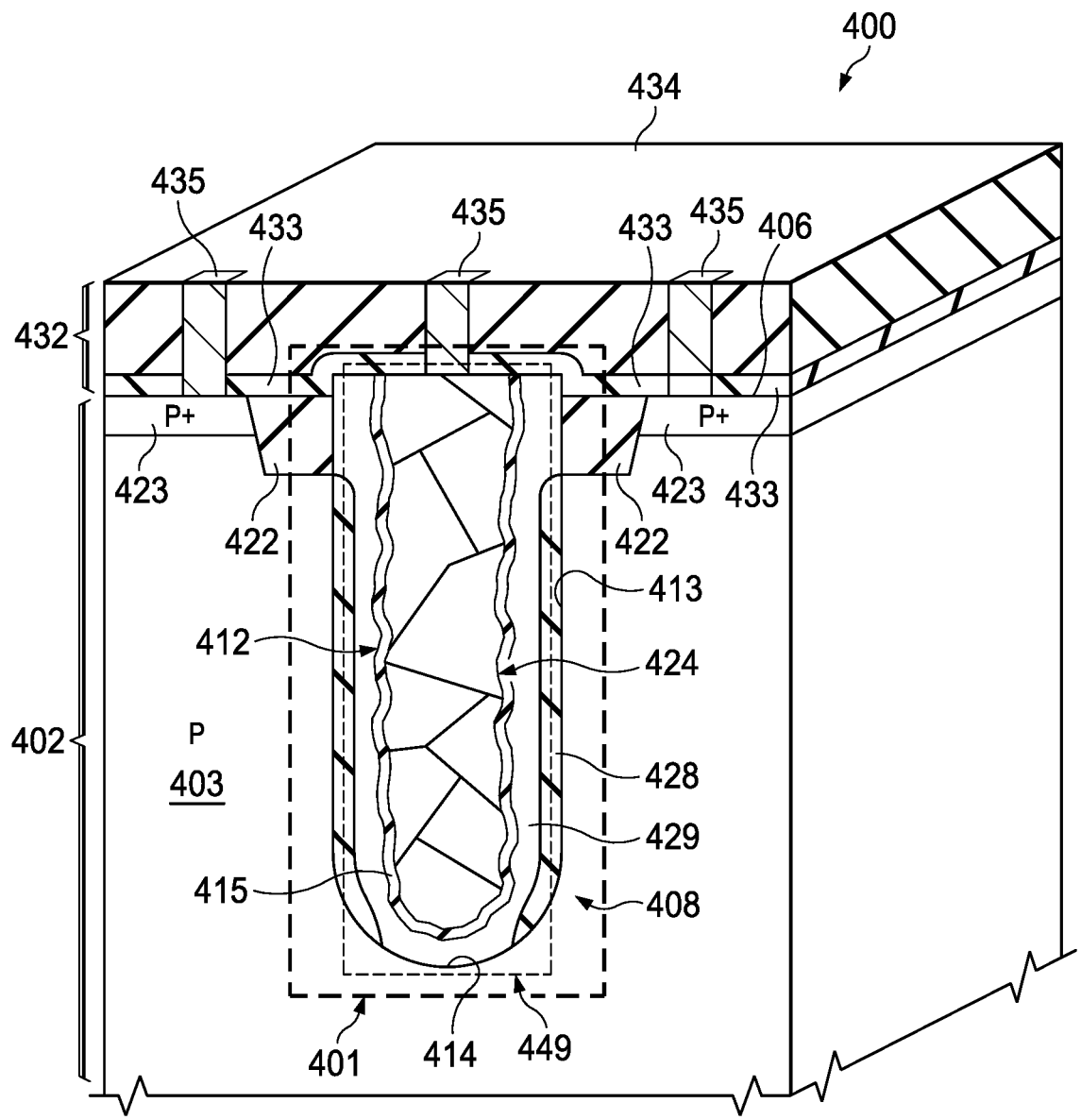

Referring to FIG. 4H, doped regions 423 may be formed in the semiconductor material 403 with the same conductivity type as the semiconductor material 403 making contact to the polysilicon outer layer 429 at the bottom 414 of the trench 408, p-type, in this example. The doped regions 423 may have average dopant densities above $1 \times 10^{18}$ cm$^{-3}$, to provide low resistance electrical connections to the polysilicon outer layer 429 through the semiconductor material 403. Thermal processes used to form the doped regions 423 may heat the substrate 402 sufficiently to convert the semi-amorphous polysilicon 417 of FIG. 4G to a polysilicon core 424. The polysilicon core 424 has silicon grains with an average size that is greater than half a minimum lateral dimension inside the seed layer 412, as disclosed in reference to FIG. 2G. The polysilicon core 424 is part of the trench structure 401. The polysilicon core 424 may be advantageously free of seams and voids.

An interconnect region 432 may be formed over the top surface 406 of the substrate 402. The interconnect region 432 may include a PMD liner 433 formed over the top surface 406 of the substrate 402, and a PMD layer 434 formed on the PMD liner 433. The interconnect region 432 may include contacts 435 formed through the PMD layer 434 and the PMD liner 433 to provide electrical connections to the doped regions 423, and to the polysilicon core 424 of the trench structure 401. The interconnect region 432 may further include interconnects, not shown in FIG. 4H, to connect the polysilicon core 424 and components of the microelectronic device 400 in circuits.

A combination of the polysilicon core 424, the seed layer 412, and the polysilicon outer layer 429 provide a capacitor 449 of the microelectronic device 400. The polysilicon core 424 provides a first plate of the capacitor 449, the polysilicon outer layer 429 provides a second plate of the capacitor 449, and the seed layer 412 provides a capacitor dielectric layer of the capacitor 449. The capacitor 449 may advantageously occupy a small amount of space in the microelectronic device 400 as a result of being located in the trench 408. The trench structure 401 may be part of an isolation structure of the microelectronic device 400, thus advantageously providing dual functionality, isolation and capacitor 449.

Figure 5A:
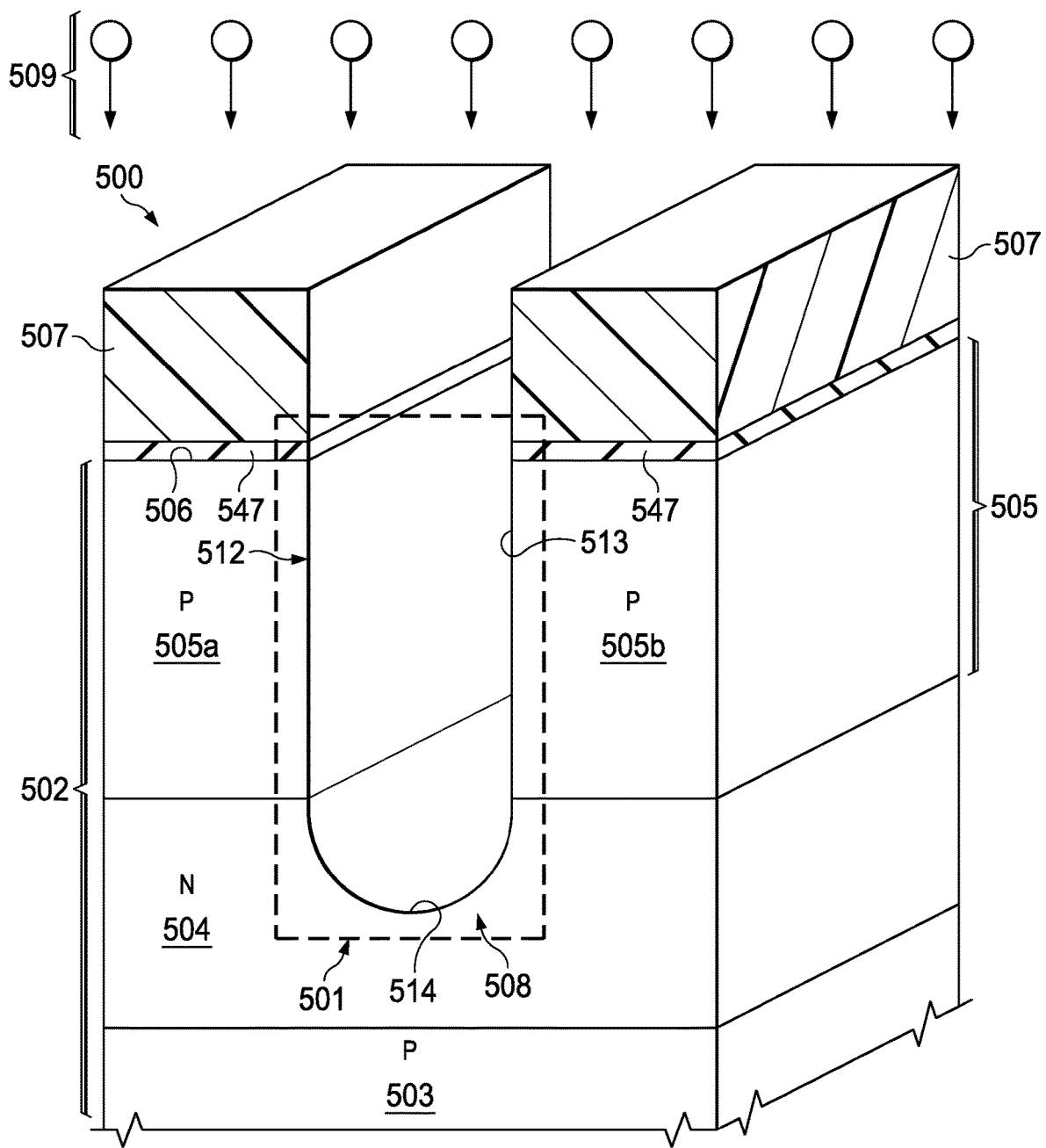

FIG. 5A through FIG. 5E are cross sections of another microelectronic device 500 including a trench structure 501, depicted in successive stages of a further example method of formation. Referring to FIG. 5A, the microelectronic device 500 is formed in and on a substrate 502. In this example, the substrate 502 may include a lower layer 503 of p-type semiconductor material, such as p-type silicon, a buried layer 504 of n-type semiconductor material, such as n-type silicon, on the lower layer 503, and an epitaxial layer 505 of p-type semiconductor material, such as p-type silicon, on the buried layer 504. The epitaxial layer 505 may include a first epitaxial layer portion 505a and a second epitaxial layer portion 505b laterally separated from the first epitaxial layer portion 505a by the trench structure 501. The epitaxial layer 505 extends to a top surface 506 of the substrate 502. A protective dielectric layer 547 may be formed over the top surface 506 of the substrate 502 by a thermal oxidation process, and may have a thickness of 5 nanometers to 20 nanometers.

A trench mask 507 is formed over the protective dielectric layer 547, exposing the protective dielectric layer 547 in an area for the trench structure 501. The trench mask 507 may include hard mask materials, as disclosed in reference to FIG. 1A. Material is removed from the protective dielectric layer 547 and the substrate 502 where exposed by the trench mask 507 to form a trench 508 in the substrate 502, extending through the epitaxial layer 505 and into the buried layer 504. The substrate material may be removed from the substrate 502 using halogen radicals 509, as disclosed in reference to FIG. 1B, for example. The trench 508 has sidewalls 513 contacting the epitaxial layer 505, and has a bottom 514 contacting the buried layer 504. The trench mask 507 may be removed before continuing with formation of the trench structure 501.

Figure 5B:
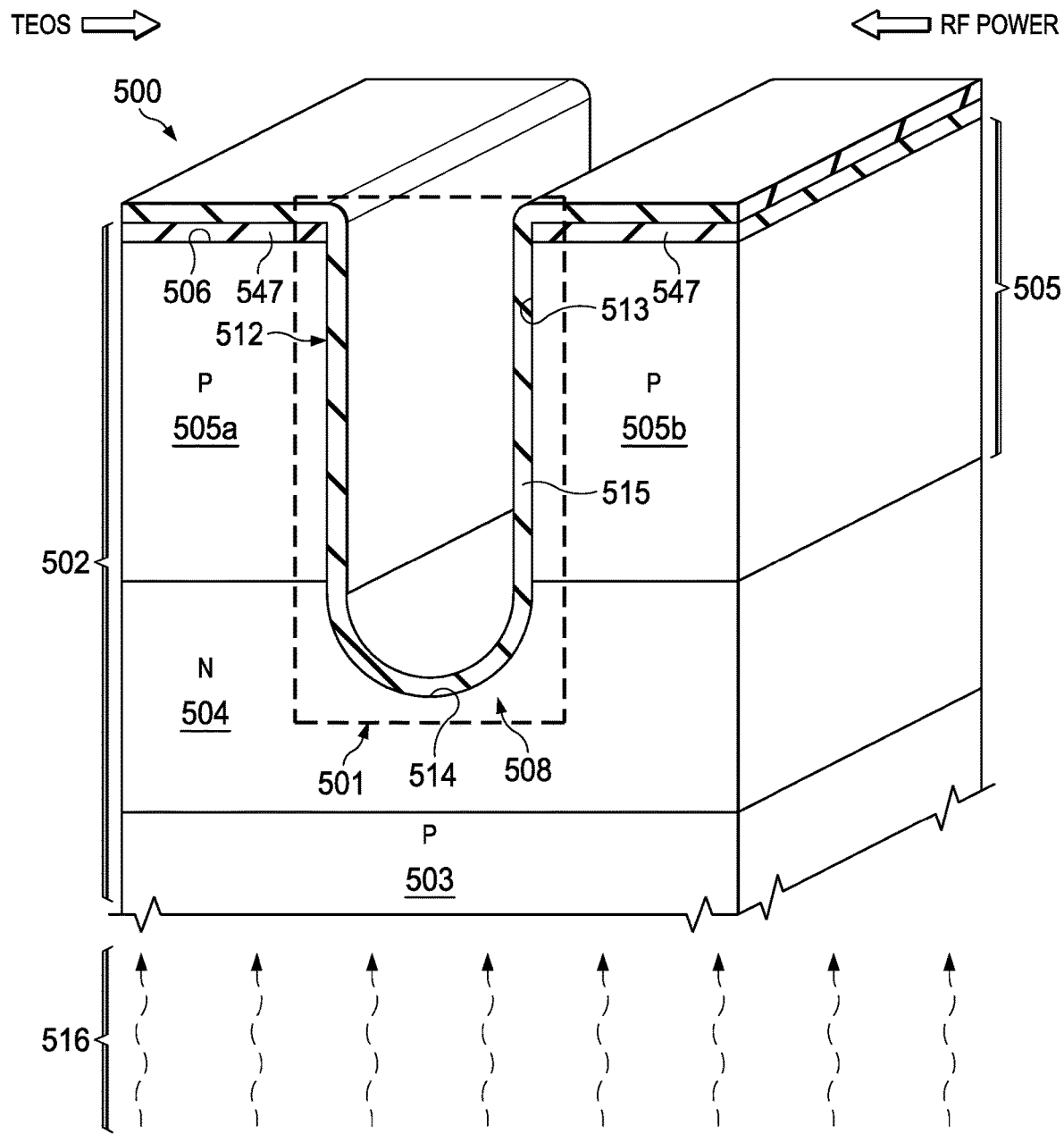

Referring to FIG. 5B, a seed layer 512 is formed in the trench 508. In this example, the seed layer 512 is formed on the sidewalls 513 and the bottom 514 of the trench 508. The seed layer 512 includes an amorphous dielectric material 515. In this example, the seed layer 512 may be formed by heating the substrate 502 in a first substrate heating process 516 while flowing a silicon reagent gas, such as TEOS, denoted "TEOS" in FIG. 5B, and providing radio frequency (RF) power to the silicon reagent gas to generate a plasma containing silicon and oxygen, which forms silicon dioxide on the sidewalls 513 and bottom 514 of the trench 508 to provide the seed layer 512. The amorphous dielectric material 515 of this example may include primarily silicon dioxide. Other methods of forming the seed layer 512, and other materials for the amorphous dielectric material 515 are within the scope of this example. The seed layer 512 may consist essentially of the amorphous dielectric material 515. The seed layer 512 of this example may have a thickness of 50 nanometers to 500 nanometers, by way of example, to provide electrical isolation between a subsequently-formed polysilicon core 524, shown in FIG. 5E, and the epitaxial layer 505.

Figure 5C:
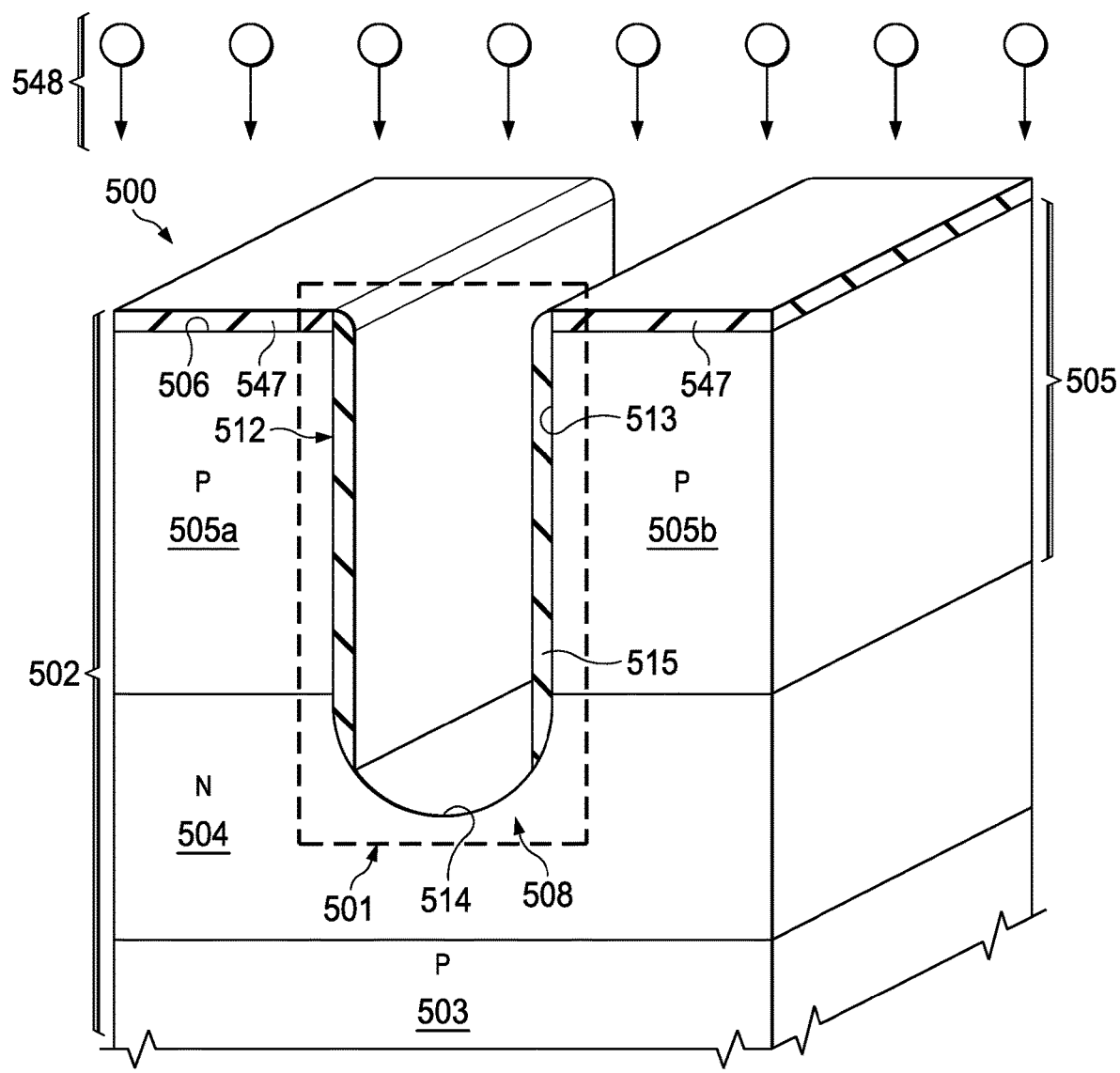

Referring to FIG. 5C, the seed layer 512 is removed at the bottom 514 of the trench 508, exposing the lower layer 503 below the trench 508. The seed layer 512 may be removed at the bottom 514 of the trench 508 by an RIE process using halogens 548, similar to the process disclosed in reference to FIG. 4C, by way of example. At least a portion of the amorphous dielectric material 515 is left in place on the sidewalls 513 of the trench 508, sufficient to provide electrical isolation between the subsequently-formed polysilicon core 524, shown in FIG. 5E, and the epitaxial layer 505.

Referring to FIG. 5D, semi-amorphous polysilicon 517 is formed in the trench 508 on the amorphous dielectric material 515, filling the trench 508 inside the seed layer 512 and contacting the buried layer 504 at the bottom 514 of the trench 508. The semi-amorphous polysilicon 517 includes amorphous silicon regions 518 constituting 20 weight percent to 90 weight percent of the semi-amorphous polysilicon 517, separated by polycrystalline silicon 519. The semi-amorphous polysilicon 517 may extend over the top surface 506 of the substrate 502. To form the semi-amorphous polysilicon 517, the substrate 502 may be heated to a temperature of 555° C. to 580° C. by a substrate heating process 520. A silicon reagent gas, denoted in FIG. 5D as "SILANE", is flowed over the substrate 502 at a pressure of 100 millitorr to 250 millitorr, and thermally decomposes, to form the semi-amorphous polysilicon 517. The semi-amorphous polysilicon 517 may be doped to have a same conductivity type as the buried layer 504, which is n-type, in this example. The semi-amorphous polysilicon 517 may be doped by adding a phosphorus-containing gas reagent such as phosphine, or adding an arsenic-containing gas reagent such as arsine, with the silane when forming the semi-amorphous polysilicon 517. In this example, the semi-amorphous polysilicon 517 is electrically isolated from the epitaxial layer 505 by the seed layer 512. Filling the trench 508 inside the seed layer 512 with the semi-amorphous polysilicon 517 may advantageously reduce seam and void formation in the trench structure 501, as described in reference to the example of FIG. 1A through FIG. 1E.

Figure 5E:
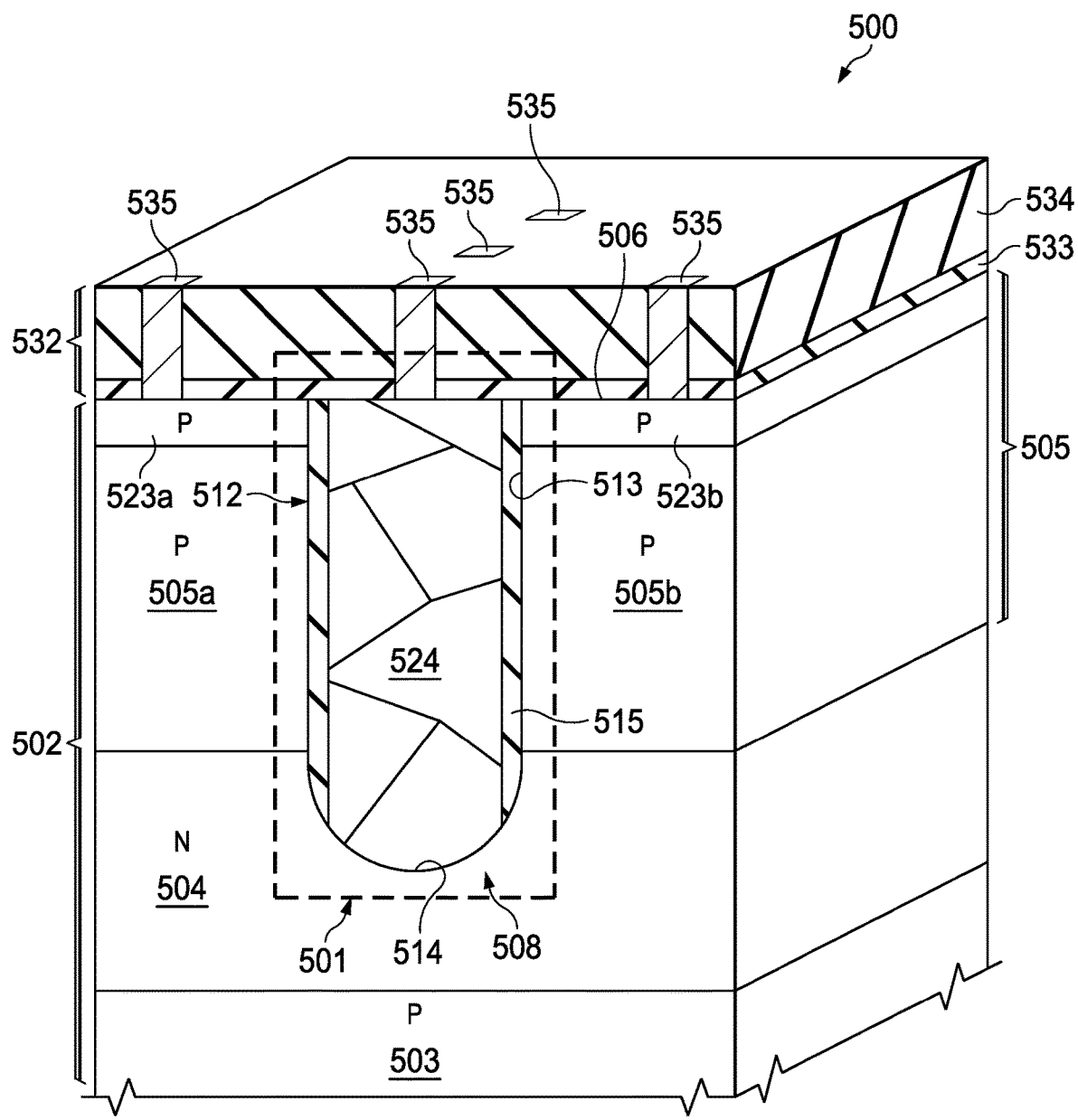

Referring to FIG. 5E, the semi-amorphous polysilicon 517 of FIG. 5D outside of the trench 508 is removed, by a CMP process, and etchback process, or a combination of both processes. A first doped region 523a may be formed in the substrate 502 contacting the first epitaxial layer portion 505a with the same conductivity type as the first epitaxial layer portion 505a, p-type, in this example. A second doped region 523b may be formed in the substrate 502 contacting the second epitaxial layer portion 505b with the same conductivity type as the second epitaxial layer portion 505b, also p-type, in this example. The first doped region 523a and the second doped region 523b may have average dopant densities above $1 \times 10^{18}$ cm$^{-3}$, to provide low resistance electrical connections to the first epitaxial layer portion 505a and the second epitaxial layer portion 505b, respectively. Thermal processes used to form the doped regions 523a and 523b may heat the substrate 502 sufficiently to convert the semi-amorphous polysilicon 517 of FIG. 5D to a polysilicon core 524. The polysilicon core 524 is part of the trench structure 501. The polysilicon core 524 has silicon grains with an average size that is greater than half a minimum lateral dimension inside the seed layer 512, as disclosed in reference to FIG. 1E. The polysilicon core 524 may be advantageously free of seams and voids. In this example, the polysilicon core 524 provides an electrical connection to the buried layer 504 from the top surface 506 of the substrate 502. The trench structure 501 may be part of an isolation structure of the microelectronic device 500, thus advantageously providing dual functionality, isolation and connection to the buried layer 504.

An interconnect region 532 may be formed over the top surface 506 of the substrate 502. The interconnect region 532 may include a PMD layer 534 formed on the PMD liner 533. The interconnect region 532 may include contacts 535 formed through the PMD layer 534 and the PMD liner 533 to provide electrical connections to the doped regions 523a and 523b, and to the polysilicon core 524 of the trench structure 501. The interconnect region 532 may further include interconnects, not shown in FIG. 5E, to connect the polysilicon core 524 to a bias line, and to connect components of the microelectronic device 500 in circuits.

Figure 6A:
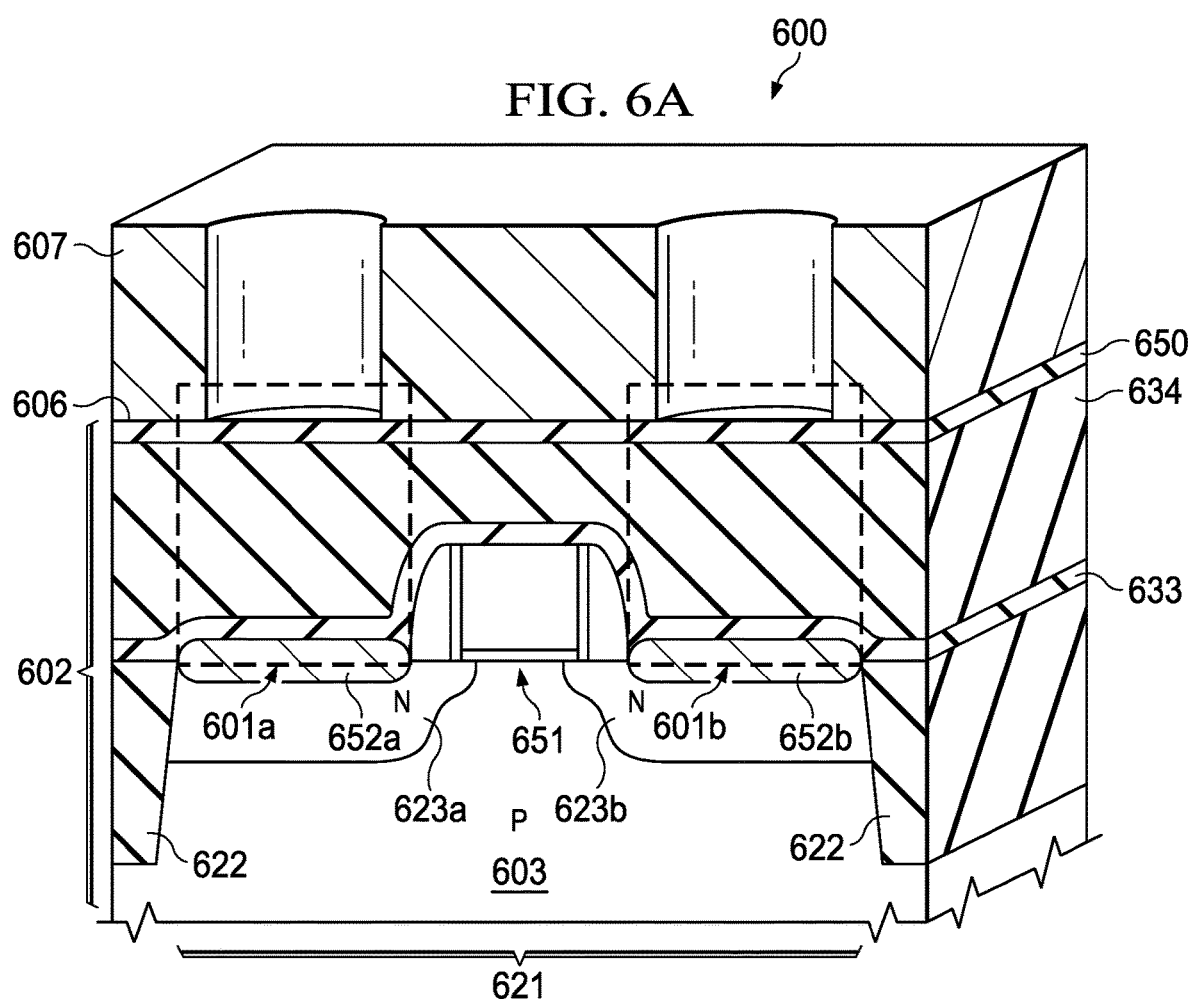

FIG. 6A through FIG. 6E are cross sections of a further microelectronic device 600 including a first trench structure 601a and a second trench structure 601b, depicted in successive stages of another example method of formation. Referring to FIG. 6A, the microelectronic device 600 is formed in and on a substrate 602. The substrate 602 includes a semiconductor material 603; in this example, the semiconductor material 603 may be p-type. The substrate 602 of this example further includes a PMD liner 633 formed over the semiconductor material 603, a PMD layer 634 formed on the PMD liner 633, and a PMD cap layer 650 formed on the PMD layer 634. The PMD liner 633 may include silicon nitride, and may be formed by a CVD process using BTBAS, or an LPCVD process using dichlorosilane and ammonia. The PMD layer 634 may include one or more sublayers of silicon dioxide-based dielectric material, for example, as disclosed in reference to FIG. 3A. The PMD cap layer 650 may include one or more sublayers of silicon nitride, silicon carbide, silicon carbonitride, or other hard dielectric material, suitable for a CMP stop layer. The PMD cap layer 650 extends to a top surface 606 of the substrate 602.

The microelectronic device 600 of this example includes a component 621, which is exemplified as an NMOS transistor 621 in FIG. 6A. The NMOS transistor 621 includes a gate structure 651 on the semiconductor material 603, a first doped region 623a, which is exemplified as a first source/drain region 623a adjacent to the gate structure 651, and a second doped region 623b, which is exemplified as a second source/drain region 623b adjacent to the gate structure 651. A first metal silicide layer 652a is formed on the first source/drain region 623a, and a second metal silicide layer 652b is formed on the second source/drain region 623b, to provide low resistance connections to the NMOS transistor 621. The PMD liner 633 extends over the NMOS transistor 621. In alternate versions of this example, the component 621 may be manifested as a bipolar junction transistor, a junction field effect transistor (JFET), an insulated gate bipolar transistor (IGBT), a diode, a piezoelectric actuator, a sensor, or other microelectronic component. Field oxide 622 may be formed on the semiconductor material 603 to laterally isolate the component 621.

A trench mask 607 is formed over the top surface 606 of the substrate 602, exposing the substrate 602 in a first area for the first trench structure 601a and in a second area for the second trench structure 601b. The trench mask 607 may include photoresist, an anti-reflection material such as B ARC, and a hard mask material such as amorphous carbon. The photoresist portion of the trench mask 607 may be formed by a photolithographic process.

Figure 6B:
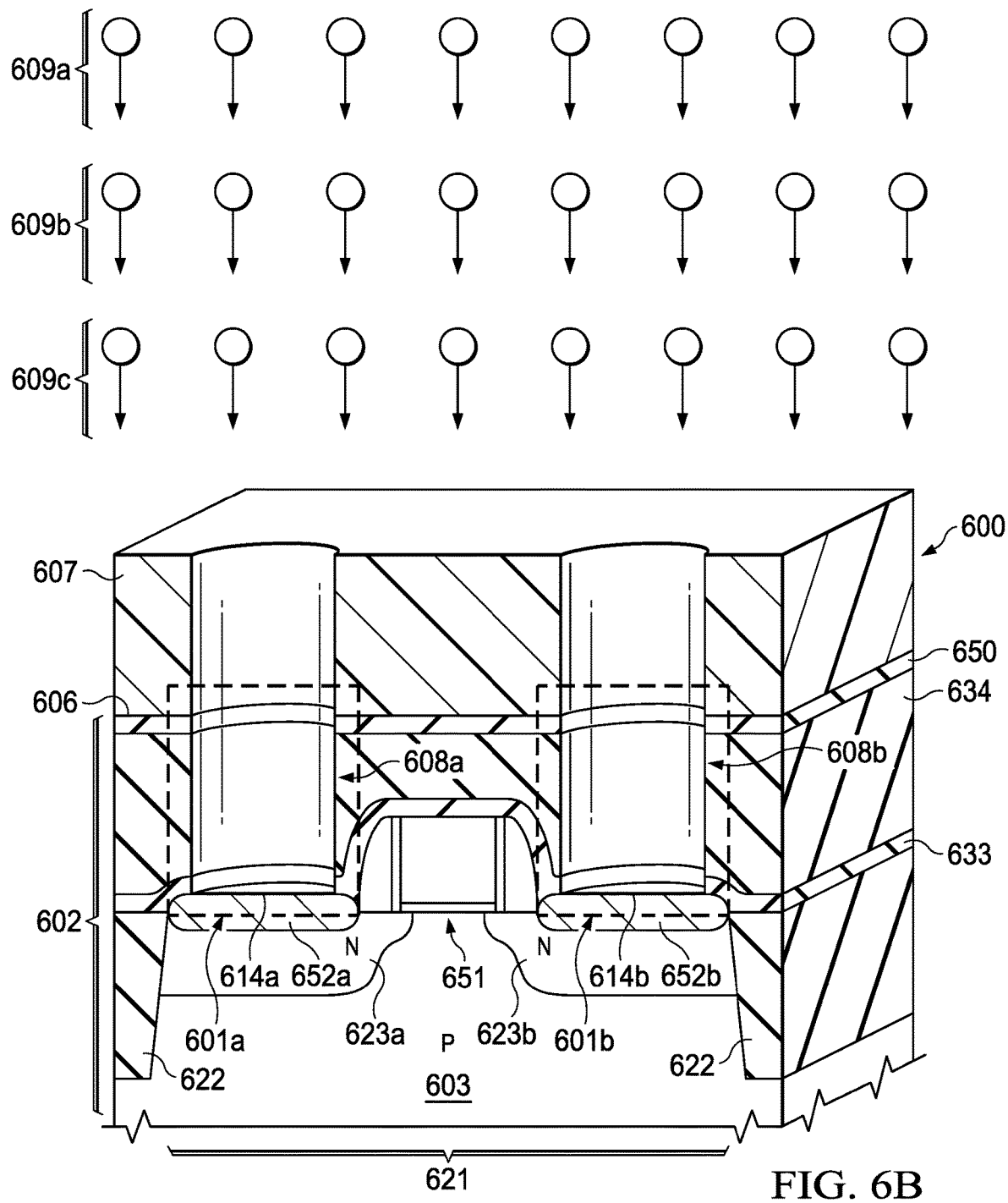

Referring to FIG. 6B, substrate material is removed from the PMD cap layer 650, the PMD layer 634, and the PMD liner 633 where exposed by the trench mask 607 to form a first trench 608a and a second trench 608b in the substrate 602. The first trench 608a and the second trench 608b extend through the PMD cap layer 650, the PMD layer 634, and the PMD liner 633 to the first metal silicide layer 652a and the second metal silicide layer 652b, respectively. Material may be removed from the PMD cap layer 650 by a first RIE process using a first set of reactants 609a, which may include fluorine and oxygen, for example. Material may be removed from the PMD layer 634 by a second RIE process using a second set of reactants 609b, which may include fluorine and oxygen, for example. Material may be removed from the PMD liner 633 by a third RIE process using a third set of reactants 609c, which may include fluorine, for example. The first trench 608a is part of the first trench structure 601a, and the second trench 608b is part of the second trench structure 601b.

The trench mask 607 is removed after the first trench 608a and the second trench 608b are formed. Photoresist and other organic material in the trench mask 607 may be removed by a plasma process using oxygen radicals. Amorphous carbon in the trench mask 607 may be also removed by a plasma process using oxygen radicals. The plasma process may be followed by a wet clean process using an aqueous mixture of hydrogen peroxide and ammonium hydroxide. Other methods of removing the trench mask 607 are within the scope of this example.

Figure 6C:
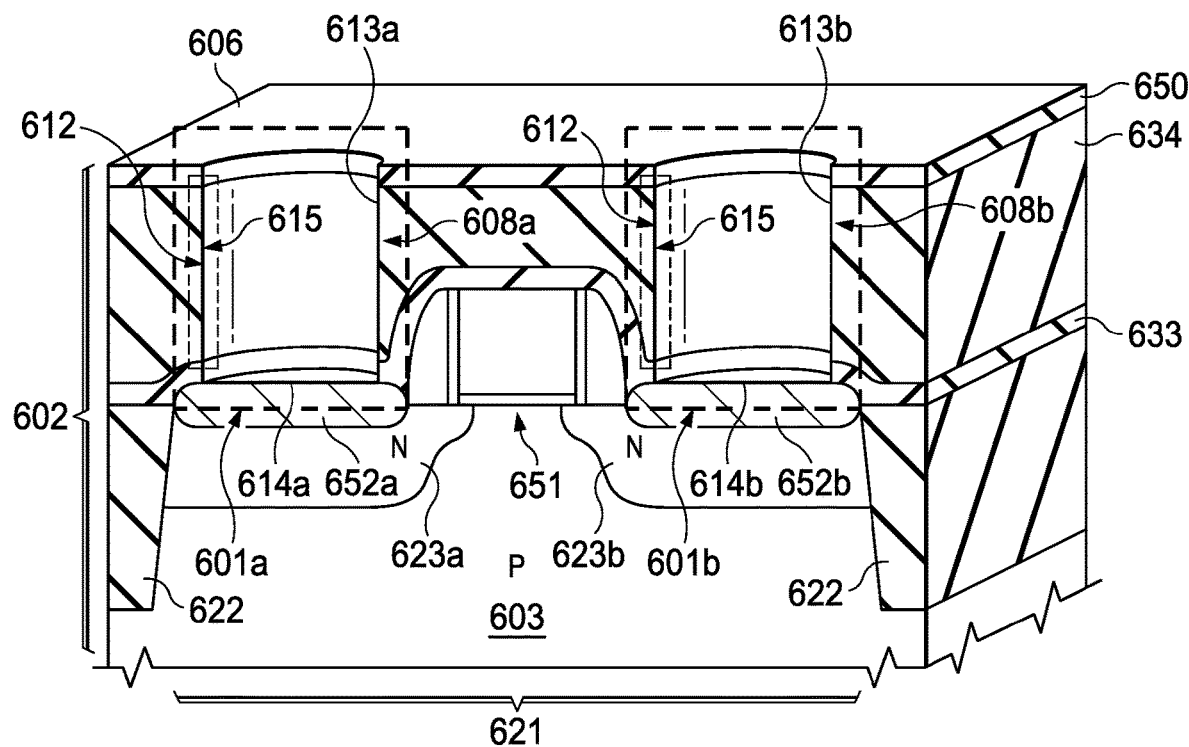

FIG. 6C depicts the microelectronic device 600 after the trench mask 607 of FIG. 6B has been removed. The first trench 608a has a first sidewall 613a extending through the PMD cap layer 650, the PMD layer 634, and the PMD liner 633, and the second trench 608b has a second sidewall 613b extending through the PMD cap layer 650, the PMD layer 634, and the PMD liner 633. In this example, dielectric material of the PMD layer 634 located at the sidewalls 613a and 613b provides a seed layer 612 with an amorphous dielectric material 615 extending to the sidewalls 613a and 613b. The first trench 608a has a first bottom 614a at the first metal silicide layer 652a, and the second trench 608b has a second bottom 614b at the second metal silicide layer 652b.

Referring to FIG. 6D, semi-amorphous polysilicon 617 is formed in the first trench 608a and in the second trench 608b on the amorphous dielectric material 615 at the sidewalls 613a and 613b, filling the first trench 608a and the second trench 608b inside the seed layer 612, that is, inside the sidewalls 613a and 613b in this example. The semi-amorphous polysilicon 617 contacts the first metal silicide layer 652a at the first bottom 614a of the first trench 608a, and contacts the second metal silicide layer 652b at the second bottom 614b of the second trench 608b. The semi-amorphous polysilicon 617 includes amorphous silicon regions 618 constituting 20 weight percent to 90 weight percent of the semi-amorphous polysilicon 617, separated by polycrystalline silicon 619. The semi-amorphous polysilicon 617 may extend over the top surface 606 of the substrate 602. To form the semi-amorphous polysilicon 617, the substrate 602 may be heated to a temperature of 555° C. to 580° C. while a silicon reagent gas, such as silane, denoted in FIG. 6D as "SILANE", is flowed over the substrate 602 at a pressure of 100 millitorr to 250 millitorr, and thermally decomposes, to form the semi-amorphous polysilicon 617. The semi-amorphous polysilicon 617 may be doped to reduce an electrical resistance to the metal silicide layers 652a and 652b. Filling the first trench 608a and the second trench 608b with the semi-amorphous polysilicon 617 may advantageously reduce seam and void formation in the first trench structure 601a and in the second trench structure 601b, as described in reference to the example of FIG. 1A through FIG. 1E.

Figure 6E:
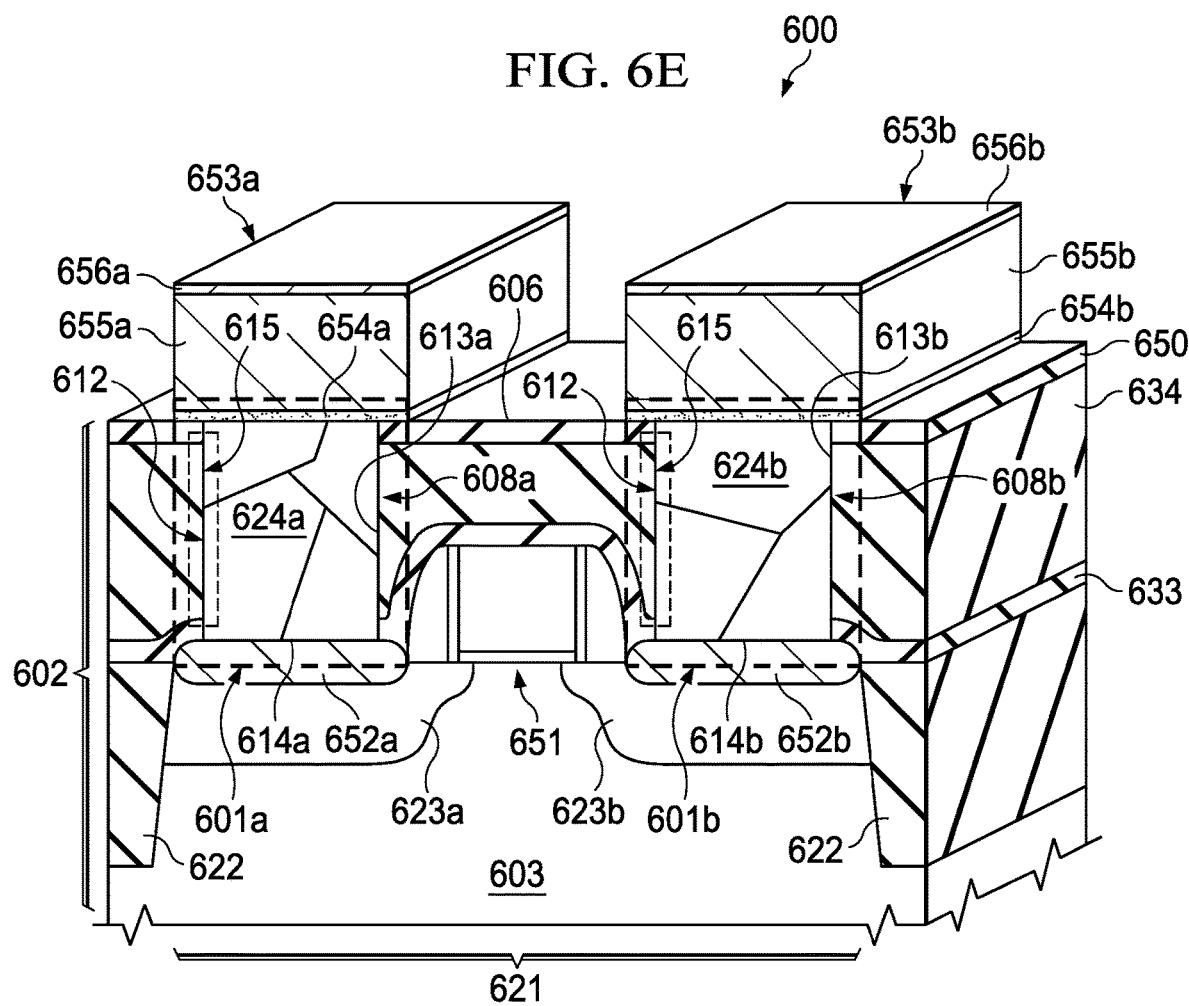

Referring to FIG. 6E, the semi-amorphous polysilicon 617 of FIG. 6D outside of the first trench 608a and the second trench 608b is removed, by a CMP process, and etchback process, or a combination of both processes. Thermal processes used in subsequent fabrication steps may heat the substrate 602 sufficiently to convert the semi-amorphous polysilicon 617 of FIG. 6D to a first polysilicon core 624a of the first trench structure 601a in the first trench 608a, and a second polysilicon core 624b of the second trench structure 601b in the second trench 608b. The polysilicon cores 624a and 624b have silicon grains with an average size that is greater than half of minimum lateral dimensions inside the seed layer 612, that is, the sidewalls 613a and 613b in this example, as disclosed in reference to FIG. 1E. The polysilicon cores 624a and 624b may be advantageously free of seams and voids.

A first interconnect 653a is formed over the PMD cap layer 650, making a first electrical connection to the first polysilicon core 624a, and a second interconnect 653b is formed over the PMD cap layer 650, making a second electrical connection to the second polysilicon core 624b. The first interconnect 653a may include a first adhesion layer 654a formed on the PMD cap layer 650 and the first polysilicon core 624a, a first aluminum-containing layer 655a formed on the first adhesion layer 654a, and a first anti-reflection layer 656a formed on the first aluminum-containing layer 655a. Similarly, the second interconnect 653b may include a second adhesion layer 654b formed on the PMD cap layer 650 and the second polysilicon core 624b, a second aluminum-containing layer 655b formed on the second adhesion layer 654b, and a second anti-reflection layer 656b formed on the second aluminum-containing layer 655b. Other structures for the interconnects 653a and 653b are within the scope of this example. The semi-amorphous polysilicon 617 may be converted to the first polysilicon core 624a and the second polysilicon core 624b during or after formation of the interconnects 653a and 653b.

Figure 7A:
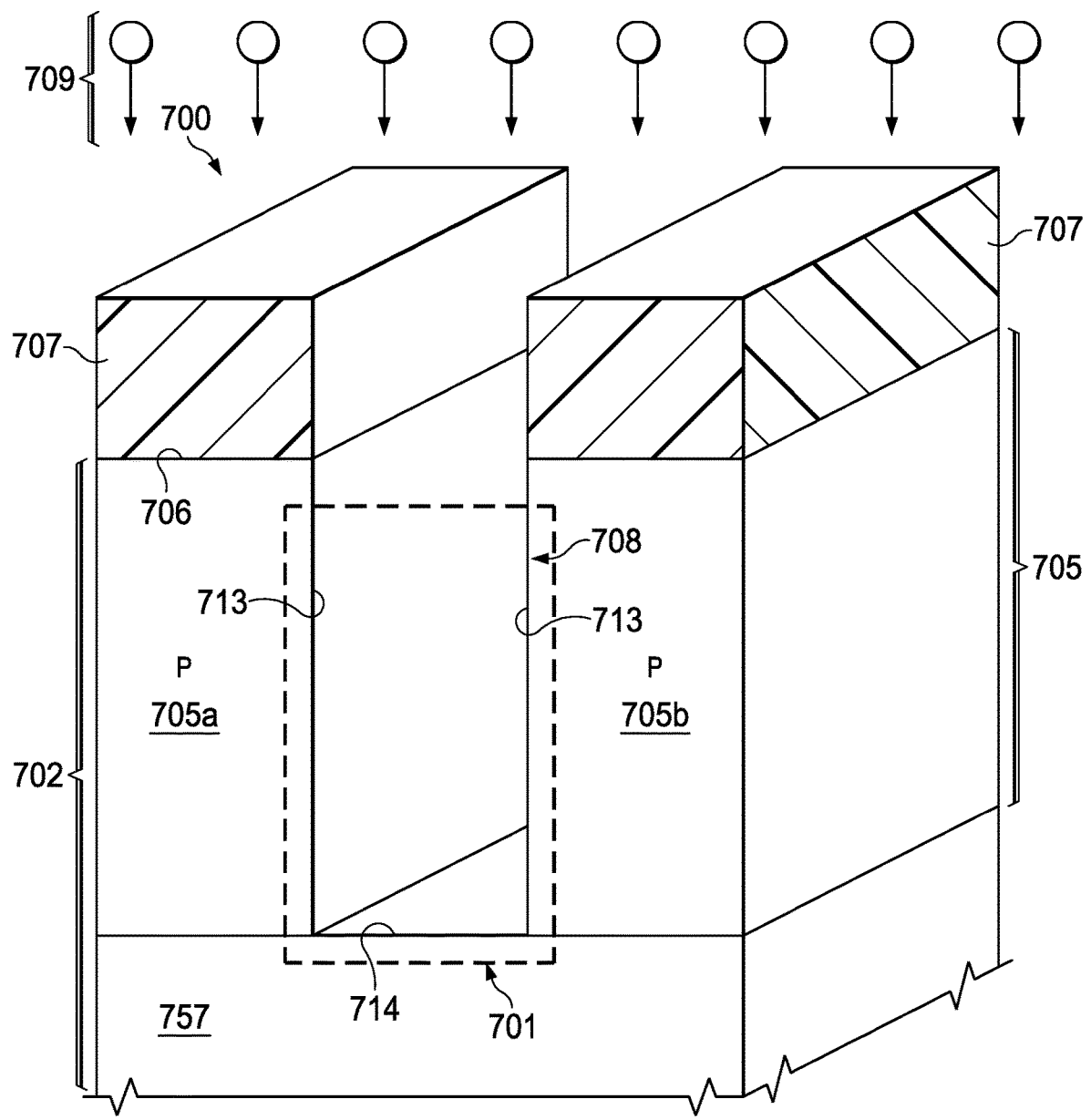

FIG. 7A through FIG. 7D are cross sections of a further microelectronic device 700 including a trench structure 701, depicted in successive stages of a further example method of formation. Referring to FIG. 7A, the microelectronic device 700 is formed in and on a substrate 702. In this example, the substrate 702 includes a semiconductor layer 705 on a dielectric layer 757. The substrate 702 may be part of a silicon-on-insulator (SOI) wafer in which the dielectric layer 757 is implemented as a handle wafer 757 of sapphire. Alternatively, the substrate 702 may be part of a semiconductor wafer in which the dielectric layer 757 is implemented as a buried oxide layer 757. The semiconductor layer 705 extends to a top surface 706 of the substrate 702. The semiconductor layer 705 may include a first semiconductor portion 705a and a second semiconductor portion 705b laterally separated from the first semiconductor portion 705a by the trench structure 701.

A trench mask 707 is formed over the top surface 706. The trench mask 707 exposes the substrate 702 in an area for the trench structure 701. The trench mask 707 may include hard mask materials. Material is removed from the semiconductor layer 705 where exposed by the trench mask 707 to form a trench 708 in the substrate 702, extending through the semiconductor layer 705 to the dielectric layer 757. The substrate material may be removed from the substrate 702 using halogen radicals 709, as disclosed in reference to FIG. 1B, for example. The trench 708 has sidewalls 713 contacting the semiconductor layer 705, and has a bottom 714 contacting the dielectric layer 757. The trench mask 707 may be removed before continuing with formation of the trench structure 701.

Referring to FIG. 7B, a seed layer 712 is formed in the trench 708. In this example, the seed layer 712 is formed on the sidewalls 713 and the bottom 714 of the trench 708, and over the top surface 706 of the substrate 702. The seed layer 712 includes an amorphous dielectric material 715. In this example, the seed layer 712 may be formed by heating the substrate 702 in a first substrate heating process 716 while flowing one or more silicon reagent gases over the substrate 702, and providing RF power, denoted by "RF POWER" in FIG. 7B, to the silicon reagent gases to generate a plasma containing silicon, which forms the seed layer 712. The amorphous dielectric material 715 of this example may include silicon dioxide, which may be formed by implementing at least a portion of the silicon reagent gases as TEOS, denoted by "TEOS" in FIG. 7B. The amorphous dielectric material 715 of this example may include silicon nitride, which may be formed by implementing at least a portion of the silicon reagent gases as BTBAS, denoted by "BTBAS" in FIG. 7B. The amorphous dielectric material 715 of this example may include silicon oxynitride, which may be formed by implementing a first portion of the silicon reagent gases as TEOS and a second portion of the silicon reagent gases as BTBAS. In this example, the seed layer 712 may consist essentially of the amorphous dielectric material 715. Other methods of forming the seed layer 712, and other materials for the amorphous dielectric material 715 are within the scope of this example. The seed layer 712 may consist essentially of the amorphous dielectric material 715. The seed layer 712 of this example may have a thickness of 50 nanometers to 500 nanometers, by way of example, to provide electrical isolation between a subsequently-formed polysilicon core 724, shown in FIG. 7D, and the semiconductor layer 705.

Referring to FIG. 7C, semi-amorphous polysilicon 717 is formed in the trench 708 on the amorphous dielectric material 715, filling the trench 708 inside the seed layer 712. The semi-amorphous polysilicon 717 includes amorphous silicon regions 718 constituting 20 weight percent to 90 weight percent of the semi-amorphous polysilicon 717, separated by polycrystalline silicon 719. The semi-amorphous polysilicon 717 may extend over the top surface 706 of the substrate 702, as depicted in FIG. 7C. To form the semi-amorphous polysilicon 717, the substrate 702 may be heated to a temperature of 555° C. to 580° C. by a substrate heating process 720. A silicon reagent gas, denoted in FIG. 7C as "SILANE", is flowed over the substrate 702 at a pressure of 100 millitorr to 250 millitorr, and thermally decomposes, to form the semi-amorphous polysilicon 717. In this example, the semi-amorphous polysilicon 717 is electrically isolated from the semiconductor layer 705 by the seed layer 712. Filling the trench 708 inside the seed layer 712 with the semi-amorphous polysilicon 717 may advantageously reduce seam and void formation in the trench structure 701, as described in reference to the example of FIG. 1A through FIG. 1E.

Figure 7D:
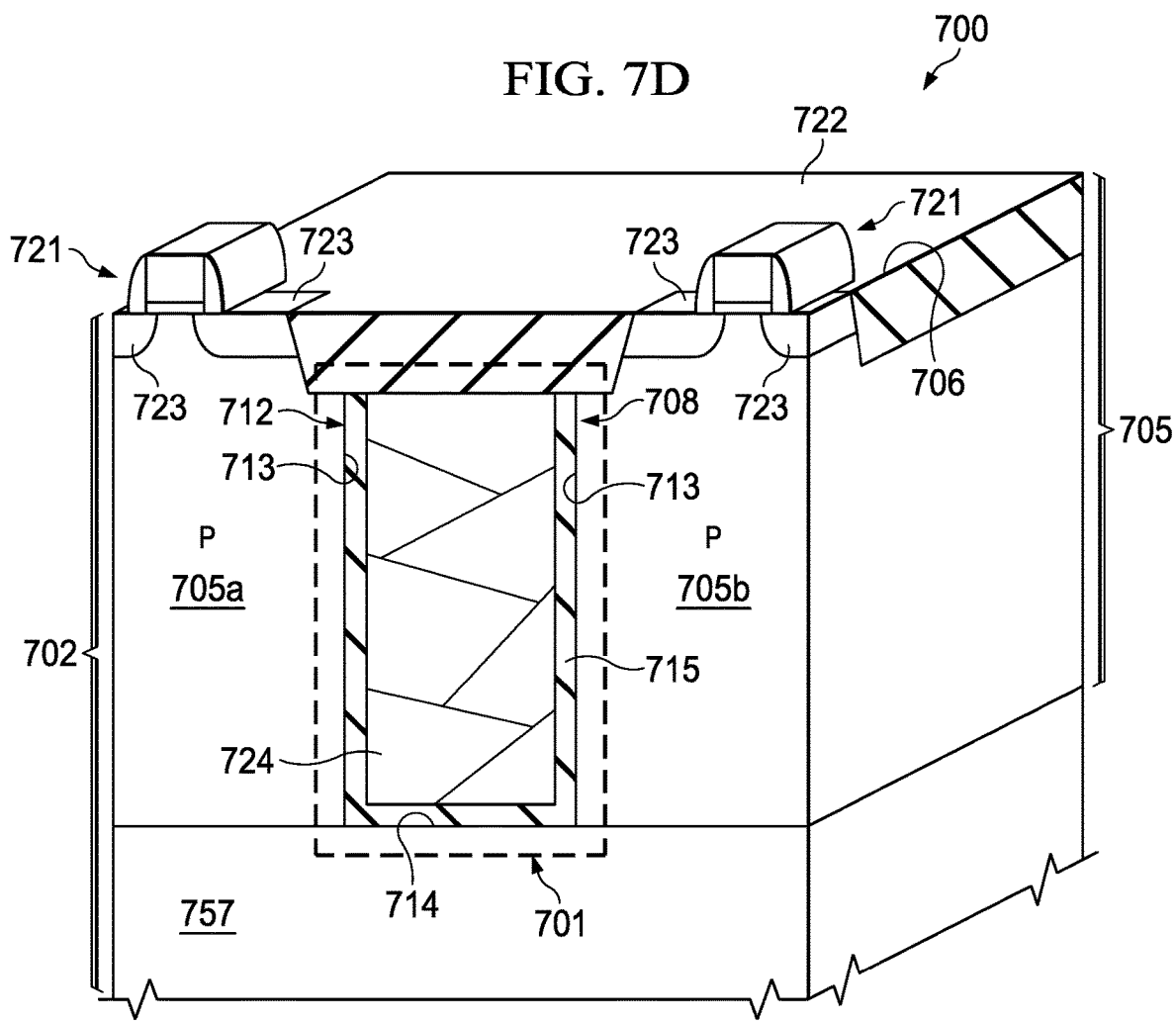

Referring to FIG. 7D, the semi-amorphous polysilicon 717 of FIG. 7C outside of the trench 708 is removed. Field oxide 722 may be formed in the substrate 702 to laterally separate the components 721. Components 721 are formed in and on the substrate 702. The components 721 are depicted in FIG. 7D as MOS transistors 721, however, other manifestations of the components 721 are within the scope of this example. Doped regions 723 are formed in the substrate 702; the doped regions 723 provide source and drain regions for the MOS transistors 721. Thermal processes, such as implant damage anneals, thermal drives, and implant activation anneals, used to form the field oxide 722, the components 721, and the doped regions 723 may heat the substrate 702 sufficiently to convert the semi-amorphous polysilicon 717 to a polysilicon core 724 in the trench 708. The polysilicon core 724 is part of the trench structure 701. The polysilicon core 724 has silicon grains with an average size that is greater than half a minimum lateral dimension inside the seed layer 712, as disclosed in reference to FIG. 1E. The polysilicon core 724 may be advantageously free of seams and voids.

Various features of the examples disclosed herein may be combined in other manifestations of example microelectronic devices. For example, any of the methods disclosed in reference to FIG. 1A through FIG. 1E, FIG. 6A through FIG. 6E, or FIG. 7A through FIG. 7D may include formation of a polysilicon outer layer, as disclosed in reference to FIG. 2A through FIG. 2G. Any of the seed layers 112, 212, 312, 412, 512, 612, or 712 may be formed by thermal oxidation, one or more CVD processes, one or more LPCVD processes, or one or more PECVD processes. Any of the seed layers 112, 212, 312, 412, 512, 612, or 712 may include silicon dioxide, silicon nitride, or silicon oxynitride.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
    a substrate;
    a trench structure in the substrate, the trench structure including:
        a trench in the substrate;
        a seed layer in the trench, the seed layer including an amorphous dielectric material; and
        a polysilicon core contacting the amorphous dielectric material, the polysilicon core filling the trench structure inside the seed layer, the polysilicon core having silicon grains, wherein an average size of the silicon grains is greater than half a minimum lateral dimension of the trench structure inside the seed layer.

2. The microelectronic device of claim 1, wherein the amorphous dielectric material includes a material selected from the group consisting of silicon dioxide, silicon nitride, and silicon oxynitride.

3. The microelectronic device of claim 1, wherein the polysilicon core extends to the substrate at a bottom of the trench structure.

4. The microelectronic device of claim 1, wherein the trench structure further includes a polysilicon outer layer between the seed layer and sidewalls of the trench.

5. The microelectronic device of claim 4, wherein the trench structure includes a liner between the substrate and the polysilicon outer layer.

6. The microelectronic device of claim 4, wherein the trench structure extends into the substrate from a top surface of the substrate, and the polysilicon outer layer makes an electrical connection to the substrate at a bottom of the trench structure, the bottom being located opposite from the top surface of the substrate.

7. The microelectronic device of claim 4, further comprising a first electrical connection to the polysilicon outer layer and a second electrical connection to the polysilicon core, the second electrical connection being separate from the first electrical connection.

8. The microelectronic device of claim 1, wherein the substrate includes a semiconductor material contacting the trench structure along sidewalls of the trench.

9. The microelectronic device of claim 1, wherein the substrate includes a dielectric material contacting the trench structure along sidewalls of the trench.

10. A microelectronic device, comprising:
    a substrate;
    a trench isolation structure in the substrate, the trench isolation structure including:
        a trench in the substrate;
        a seed layer in the trench, the seed layer including an amorphous dielectric material; and
        a polysilicon core contacting the amorphous dielectric material, the polysilicon core filling the trench structure inside the seed layer, the polysilicon core having silicon grains contacting the amorphous dielectric material, wherein an average size of the silicon grains is greater than half a minimum lateral dimension of the trench structure inside the seed layer.

11. The microelectronic device of claim 10, wherein the amorphous dielectric material includes a material selected from the group consisting of silicon dioxide, silicon nitride, and silicon oxynitride.

12. The microelectronic device of claim 10, wherein the polysilicon core extends to the substrate at a bottom of the trench structure.

13. The microelectronic device of claim 10, wherein the trench structure further includes a polysilicon outer layer between the seed layer and sidewalls of the trench.

14. The microelectronic device of claim 13, further comprising a first electrical connection to the polysilicon outer layer and a second electrical connection to the polysilicon core, the second electrical connection being separate from the first electrical connection.

15. The microelectronic device of claim 10, wherein the substrate includes a semiconductor material contacting the trench structure along sidewalls of the trench.

16. The microelectronic device of claim 10, wherein the substrate includes a dielectric material contacting the trench structure along sidewalls of the trench.

\* \* \* \* \*